(12) United States Patent
Iwai

(10) Patent No.: US 7,935,473 B2
(45) Date of Patent: May 3, 2011

(54) PHOTOSENSITIVE COMPOSITION, LITHOGRAPHIC PRINTING PLATE PRECURSOR, LITHOGRAPHIC PRINTING METHOD, AND NOVEL CYANINE DYES

(75) Inventor: Yu Iwai, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 529 days.

(21) Appl. No.: 12/026,864

(22) Filed: Feb. 6, 2008

(65) Prior Publication Data

US 2008/0254384 A1     Oct. 16, 2008

(30) Foreign Application Priority Data

Feb. 6, 2007 (JP) ................................ 2007-026692

(51) Int. Cl.
*G03F 7/038* (2006.01)
(52) U.S. Cl. ............... 430/270.1; 430/271.1; 430/281.1; 430/286.1; 101/450.1
(58) Field of Classification Search ................ 430/270.1
See application file for complete search history.

(56) References Cited

U.S. PATENT DOCUMENTS

| | | | |
|---|---|---|---|
| 5,519,145 A | 5/1996 | Fabricius et al. | |
| 6,759,177 B2 * | 7/2004 | Shimada et al. | 430/270.1 |
| 2003/0064318 A1 | 4/2003 | Huang et al. | |
| 2003/0162134 A1 | 8/2003 | Hunt et al. | |
| 2006/0005918 A1 * | 1/2006 | Azakami et al. | 156/230 |

FOREIGN PATENT DOCUMENTS

| | | | |
|---|---|---|---|
| EP | 1273967 A2 * | 1/2003 | |
| EP | 1669195 A1 * | 6/2006 | |
| EP | 1759836 A2 | 3/2007 | |
| EP | 1849836 A2 | 10/2007 | |
| JP | 2938397 B2 | 6/1999 | |
| JP | 11-277927 A | 10/1999 | |
| JP | 2000-335129 A | 12/2000 | |
| JP | 2001-277740 A | 10/2001 | |
| JP | 2001-277742 A | 10/2001 | |
| JP | 2002-287334 A | 10/2002 | |
| JP | 2003-191657 A | 7/2003 | |

OTHER PUBLICATIONS

Extended European Search Report dated Jan. 30, 2009.
XP002481793, URL: http://www.roempp.com, retrieved on May 27, 2008.
Partial European Search Report dated Jul. 2, 2008.

* cited by examiner

*Primary Examiner* — Cynthia H Kelly
*Assistant Examiner* — Chanceity N Robinson
(74) *Attorney, Agent, or Firm* — Sughrue Mion, PLLC

(57) ABSTRACT

A photosensitive composition includes a cyanine dye that has, on a methine chain thereof, a substituent which is a cation moiety of an onium salt structure.

8 Claims, No Drawings

PHOTOSENSITIVE COMPOSITION, LITHOGRAPHIC PRINTING PLATE PRECURSOR, LITHOGRAPHIC PRINTING METHOD, AND NOVEL CYANINE DYES

BACKGROUND OF THE INVENTION

1. Field of the Invention

The present invention relates to a photosensitive composition, a lithographic printing plate precursor, and to a lithographic printing method using same. More particularly, it relates to a lithographic printing plate precursor which permits direct plate making by scanning a laser light having a wavelength of, for example, from 300 to 1,200 nm based on digital signals from a computer, called a lithographic printing plate precursor for a direct plate-making process, novel cyanine dyes which can be preferably used therefor, and a lithographic printing process of directly developing the lithographic printing plate precursor on a printing machine without a development processing step and performing printing.

2. Description of the Related Art

A lithographic printing plate generally comprises oleophilic image areas which accept an ink in a printing step and hydrophilic non-image areas which receive dampening water. Lithographic printing is a printing method of producing areas different in ink adhesion properties on the lithographic printing plate, with the oleophilic image areas thereof being ink-receptive areas and hydrophilic areas thereof being dampening water-receptive areas (ink-repelling areas), utilizing the properties of water and oil to repel each other, inking only the image areas, and then transferring the ink onto a material to be printed such as paper.

In order to prepare this lithographic printing plate, a lithographic printing plate precursor (PS plate) comprising a hydrophilic support having provided thereon an oleophilic photosensitive resin layer (image recording layer) has conventionally been widely used. Ordinarily, this lithographic printing plate precursor is exposed through an original of a lith film, and image areas of the image recording layer is allowed to remain, whereas non-image areas of the image recording layer is dissolved away with an alkaline developing solution or an organic solvent to thereby reveal the surface of the hydrophilic support and make a printing plate. Thus, there is obtained a lithographic printing plate.

In the conventional plate-making process using a lithographic printing plate precursor, a step of removing, after exposure, non-image areas of the image recording layer by using a developing solution selected according to the kind of the image recording layer has been required. Thus, it has been one subject to eliminate the necessity of, or to simplify, such additionally performed wet treatment. In particular, in recent years, disposal of the waste liquor discharged accompanying the wet treatment has been a great matter of concern throughout the field of industry in view of the consideration for global environment, and hence solution of the above-described subject has been increased more and more.

As one of simple plate-making methods in response to the above-described requirement, there has been proposed a method, called on-machine development, wherein a lithographic printing plate precursor having an image recording layer the non-image areas of which are capable of being removed in a conventional printing process is used and, after exposure, the non-image areas of the image recording layer is removed on a printing machine to obtain a lithographic printing plate.

Specific methods of the on-machine development include, for example, a method of using a lithographic printing plate precursor having an image recording layer that can be dissolved or dispersed in dampening water, an ink solvent or an emulsion of dampening water and ink, a method of mechanically removing an image recording layer by contact with rollers or a blanket cylinder of a printing machine, and a method of lowering cohesion of an image recording layer or adhesion between an image recording layer and a support upon penetration of dampening water, an ink solvent or the like and then mechanically removing the image recording layer by contact with rollers or a blanket cylinder of a printing machine.

Additionally, in the invention, unless otherwise indicated particularly, the term "development processing step" means a step of using an apparatus (ordinarily, an automatic developing machine) other than a printing machine and removing infrared laser-unexposed areas of the image recording layer of the lithographic printing plate precursor upon contact with liquid (ordinarily, an alkaline developing solution) thereby revealing a hydrophilic surface of support. The term "on-machine development" means a method and a step of removing infrared laser-unexposed areas of the image recording layer of the lithographic printing plate precursor upon contact with liquid (ordinarily, printing ink and/or dampening water) by using a printing machine thereby revealing a hydrophilic surface of support.

On the other hand, digitization technique of electronically processing, accumulating and outputting image information using a computer has been popularized in recent years, and various new image outputting systems responding to the digitization technique have been put into practical use. Correspondingly, attention has been drawn to a computer-to-plate (CTP) technique of carrying digitized image information on highly converging radiation, for example, laser light and performing scanning exposure of a lithographic printing plate precursor to the light thereby directly preparing a lithographic printing plate without using a lith film. Thus, it is one of important technical subjects to obtain a lithographic printing plate precursor adaptable to the technique described above.

As is described above, in recent years, the simplification of plate-making operation and the realization of dry system and non-processing system have been more strongly required than ever from both aspects of the consideration for global environment and the adaptation for digitization.

Of the lithographic printing plate precursors, a lithographic printing plate precursor having on a hydrophilic support an oleophilic photosensitive resin layer containing a photosensitive compound capable of generating an active species such as a radical or a Brønsted acid by laser exposure has been proposed as a lithographic printing plate precursor capable of being scan exposed and has already been marketed. A negative-working lithographic printing plate can be obtained by scan exposing this lithographic printing plate precursor to a laser light based on digital information to generate an active species which functions to cause physical or chemical change in die photosensitive layer to insolubilize the layer, and then development processing the exposed precursor. In particular, a lithographic printing plate precursor comprising a hydrophilic support having provided thereon a photo-polymerization type photosensitive layer with an excellent photosensitive speed containing a photo polymerization initiator, an addition-polymerizable ethylenically unsaturated compound, and a binder polymer soluble in an alkali developing solution and, as needed, an oxygen barrier protective layer can form a printing plate having desirable printing performance due to the advantages that the precursor is excellent in productivity, permits simple development processing, and shows good resolution and ink-depositing properties.

In addition, as a lithographic printing plate precursor which can be on-machine developed, a lithographic printing plate comprising a hydrophilic support an image-forming layer wherein hydrophobic thermoplastic polymer particles are dispersed in a hydrophilic binder is described in Japanese Patent No. 2,938,397. Japanese Patent No. 2,938,397 describes that it is possible that, after exposing the lithographic printing plate precursor by an infrared laser to coalesce the hydrophobic thermoplastic polymer particles by heat and to form an image, the precursor is mounted on a cylinder of a printing machine and is subjected to on-machine development with dampening water and/or an ink.

Although this method of forming an image by coalescing fine particles through mere thermal fusing shows good on-machine developability, it involves the problem that the image strength is so weak that the resulting printing plate has insufficient printing durability.

In addition, JP-A-2001-277740 and JP-A-2001-277742 (the term "JP-A" as used herein means an "unexamined published Japanese patent application") describe a lithographic printing plate precursor comprising a hydrophilic support having provided thereon an image recording layer (heat-sensitive layer) containing microcapsules encapsulating a polymerizable compound.

Further, JP-A-2002-287334 describes a lithographic printing plate precursor comprising a support having provided thereon an image recording layer (photosensitive layer) containing an infrared ray absorbent, a radical polymerization initiator, and a polymerizable compound.

These methods of employing polymerization reaction are characterized in that, in comparison with image areas formed by thermally fusing polymer fine particles, formed images have comparatively good image strength owing to high chemical bond density in the image areas. In view of practical viewpoint, however, on-machine developability, fine line reproducibility, and printing durability are all still insufficient.

Still further, US 2003/0064318 describes an on-machine developable lithographic printing plate precursor comprising a support having provided thereon an image recording layer containing a polymerizable compound and a graft polymer having polyethylene oxide chain as side chain or containing a block polymer having ethylene oxide blocks.

However, this technique provides insufficient fine line reproducibility and printing durability, though on-machine developability thereof is good.

In general, an operation for inspection and discrimination of image formed on a printing plate is carried out in order to examine whether the image is recorded on the printing plate as intended, in advance of mounting the printing plate on a printing machine. With a conventional lithographic printing plate precursor subjected to the development processing step, it is ordinarily easily performed to confirm the image formed after the plate-making (after the development processing) and before the printing (before mounting the printing plate on a printing machine) by means of coloration of the image recording layer.

However, with respect to the lithographic printing plate precursor of the on-machine development type or non-processing (non-development) type without accompanying the development processing prior to printing, the image is not recognized on the printing plate in the step of mounting it on a printing machine, and thus the discrimination of the printing plate can not be performed. In particular, it is important in the printing operation to determine whether a register mark which acts as a landmark for the registering in multicolor printing is recorded. Therefore, with the lithographic printing plate precursor of the on-machine development type or non-processing (non-development) type, a means for confirming the image at the stage of exposure or heating is required, that is, exposed or heated areas are required to form or lose color.

Printing plates have been proposed wherein a compound capable of generating an acid, base or radical by means of light or heat and a compound capable of undergoing color change upon interaction with the acid, base or radical generated are used as the print-out agents (for example, see JP-A-11-277927). Also, it has been proposed to utilize color change of thermally decomposable compound as the print-out agent of a direct-drawing type lithographic printing plate precursor having a heat-sensitive layer (for example, see JP-A-2000-335129). Further, it has been proposed to use a thermally decomposable dye having a decomposable temperature of 250° C. or below as the print-out agent (for example, see JP-A-2003-191657).

According to these techniques, color is formed or lost in exposed areas, which has served to improve viewability (plate-inspecting properties) of an image to some extent. However, the improvement is still practically insufficient and, in addition, there have been involved various problems such as a problem that formed dyes or dyes not decomposed by exposure and losing color in turn dye the dampening water to exert adverse effects on finished prints, a problem that insoluble dyes remain in an ink or dampening water, and a problem that components of an ink or dampening water react with the dye to form a precipitate, i.e., tailings.

SUMMARY OF THE INVENTION

An object of the invention is to provide a lithographic printing plate precursor capable of providing a printing plate having good printing durability by infrared laser exposure.

Another object of the invention is to provide a lithographic printing plate precursor of on-machine development type lithographic printing plate precursor which can form a color image with good viewability by infrared laser exposure and has excellent on-machine developability, and to provide a lithographic printing method using this lithographic printing plate precursor.

A further object of the invention is to provide novel cyanine dyes capable of being preferably used in the lithographic printing plate precursor.

As a result of intensive investigations to solve the above-described problems, the inventor has found that use of an infrared ray absorbent having a particular structure can provide improved printing durability and can provide a print-out image having good viewability, thus having completed the invention based on the finding.

Also, the inventor has found, among the particular infrared ray absorbents, novel cyanine dyes capable of being preferably used for the above-described uses.

That is, the invention is as follows.

<1> A photosensitive composition comprising:

a cyanine dye that has, on a methine chain thereof, a substituent which is a cation moiety of an onium salt structure.

<2> The photosensitive composition as described in <1>, wherein the cyanine dye is represented by a general formula (1):

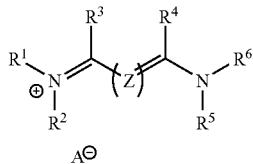

General formula (1)

wherein $R^1$, $R^2$, $R^5$, and $R^6$ each independently represents a hydrocarbon group which may have a substituent;

$R^3$ and $R^4$ each independently represents a hydrogen atom, a hetero atom, or a hydrocarbon group;

$R^1$ and $R^3$ may be connected to each other to form a ring;

$R^4$ and $R^6$ may be connected to each other to form a ring;

$A^-$ represents a counter ion which exists when charge neutralization is necessary, the counter ion being selected from the group consisting of a halogen ion, a perchlorate ion, a tetrafluoroborate ion, a hexafluorophosphate ions and a sulfonate ion; and Z represents a polymethine group which may have a substituent selected from the group consisting of a halogen atom, —N(Aryl)$_2$, —X$^2$-L$^1$, a chain hydrocarbon group, a cyclic hydrocarbon group, and a heterocyclic group, wherein Aryl represents an aryl group;

X$^2$ represents an oxygen atom, a nitrogen atom, or a sulfur atom; and

L$^1$ represents a hydrocarbon group containing from 1 to 12 carbon atoms, a heteroaromatic ring, or a hydrocarbon group containing a hetero atom and from 1 to 12 carbon atoms, the hetero atom being N, S, O, halogen atom, or Se, wherein the polymethine group has at least one substituent represented by a general formula (2) and two substituents of the at least one substituent may be connected to each other to form a ring which may have a substituent:

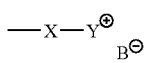

General formula (2)

wherein

X represents a single bond or a divalent linking group;

Y$^+$ represents a substituent having a cation moiety of an onium salt structure; and B$^-$ represents a counter ion which exists when charge neutralization is necessary, the counter ion being selected from the group consisting of a halogen ion, a perchlorate ion, a tetrafluoroborate ion, a hexafluorophosphate ion, and a sulfonate ion.

<3> The photosensitive composition as described in <1>, wherein the cyanine dye is represented by a general formula (3):

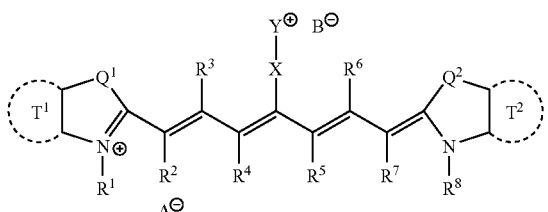

General formula (3)

wherein $R^1$ and $R^8$ each independently represents a hydrocarbon group which may have a substituent;

$R^2$, $R^3$, $R^4$, $R^5$, $R^6$, and $R^7$ each independently represents a hydrogen atom or a hydrocarbon group;

$R^4$ and $R^5$ may be connected to each other to form a ring which may have a substituent;

X represents a single bond or a linking group;

$Q^1$ and $Q^2$ each independently represents —NR$^9$—, S, O, —CH=CH—, or a dialkylmethylene group;

$R^9$ represents a hydrogen atom or a hydrocarbon group which may have a substituent;

Y$^+$ represents a substituent having a cation moiety of an onium salt structure;

$T^1$ and $T^2$ each independently represents an aromatic ring or a heteroaromatic ring; and A$^-$ and B$^-$ each independently represents a counter ion which exists when charge neutralization is necessary, the counter ion being selected from the group consisting of a halogen ion, a perchlorate ion, a tetrafluoroborate ion, a hexafluorophosphate ion, and a sulfonate ion.

<4> The photosensitive composition as described in <1>, wherein the cyanine dye is represented by a general formula (4):

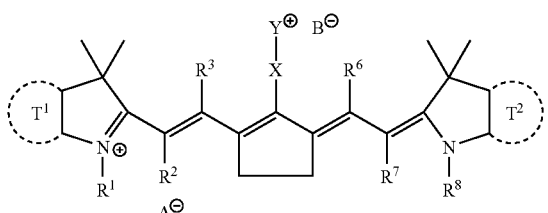

General formula (4)

wherein $R^1$ and $R^8$ each independently represents a hydrocarbon group which may have a substituent;

$R^2$, $R^3$, $R^6$, and $R^7$ each independently represents a hydrogen atom or a hydrocarbon group;

$T^1$ and $T^2$ each independently represents an aromatic ring or a heteroaromatic ring;

A$^-$ and B$^-$ each independently represents a counter ion which exists when charge neutralization is necessary, the counter ion being selected from the group consisting of a halogen ion, a perchlorate ion, a tetrafluoroborate ion, a hexafluorophosphate ion, and a sulfonate ion;

X represents a single bond or a linking group; and

Y⁺ represents a substituent represented by any one of general formulae (5), (6), (7) and (8):

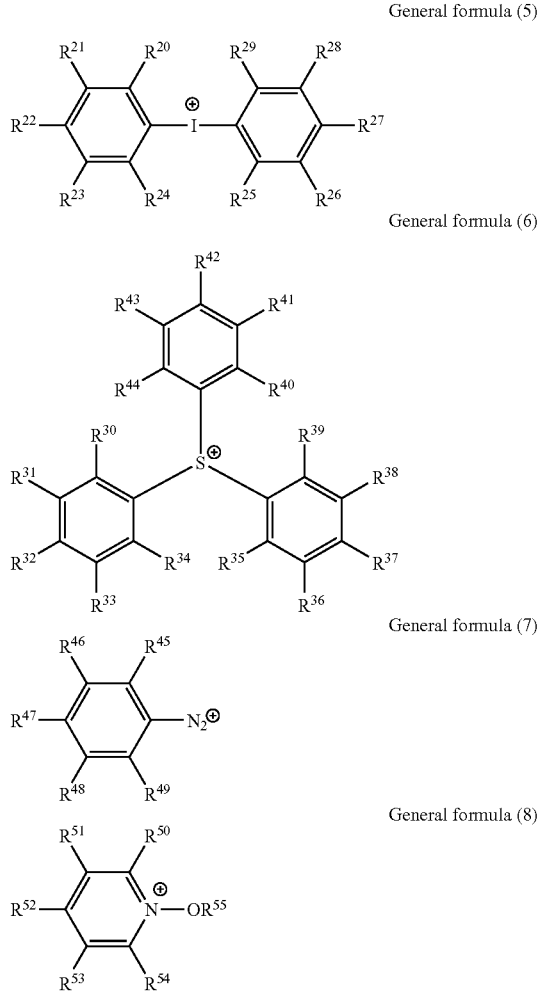

wherein $R^{20}$ to $R^{55}$ each independently represents a hydrogen atom, a halogen atom, or a monovalent organic group; and one of $R^{20}$ to $R^{29}$ in the general formula (5), one of $R^{30}$ to $R^{44}$ in the general formula (6), one of $R^{45}$ to $R^{49}$ in the general formula (7), and one of $R^{50}$ to $R^{54}$ in the general formula (8) are a single bond connected to X in the general formula (4).

<5> The photosensitive composition as described in <1>, further comprising:

(B) a binder polymer; and (C) a polymerizable monomer.

<6> The photosensitive composition as described in <1>, further comprising:

(D) a microcapsule or microgel.

<7> A lithographic printing plate precursor comprising:

a support; and an image recording layer that comprises the photosensitive composition according to claim 1.

<8> The lithographic printing plate precursor as described in <7>, wherein the image recording layer is capable of recording by infrared laser exposure; and the lithographic printing plate precursor is capable of printing by mounting the lithographic printing plate precursor on a printing machine without development processing step or by recording an image after mounting the lithographic printing plate precursor on a printing machine.

<9> A lithographic printing method comprising:

a step of imagewise exposing the lithographic printing plate precursor as described in <8> by an infrared laser; and a printing step of feeding an oily ink and an aqueous component to the exposed lithographic printing plate precursor to perform printing without development process, wherein an infrared laser-unexposed area in the image recording layer is removed in the course of the printing step.

<10> A compound represented by a general formula (9):

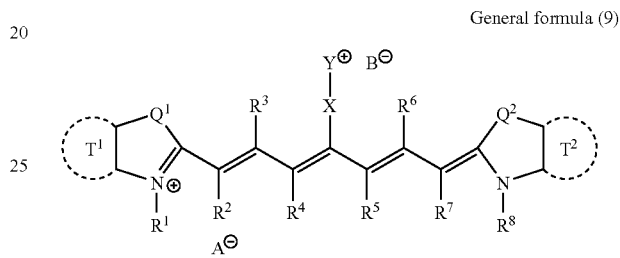

wherein $R^1$ and $R^8$ each independently represents a hydrocarbon group which may have a substituent;

$R^2$, $R^3$, $R^4$, $R^5$, $R^6$, and $R^7$ each independently represents a hydrogen atom or a hydrocarbon group;

$R^4$ and $R^5$ may be connected to each other to form a ring which may have a substituent;

$Q^1$ and $Q^2$ each independently represents —$NR^9$—, S, O, —CH=CH—, or a dialkylmethylene group;

$R^9$ represents a hydrogen atom or a hydrocarbon group which may have a substituent;

$T^1$ and $T^2$ each independently represents an aromatic ring or a heteroaromatic ring;

$A^-$ and $B^-$ each independently represents a counter ion which exists when charge neutralization is necessary, the counter ion being selected from the group consisting of a halogen ion, a perchlorate ion, a tetrafluoroborate ion, a hexafluorophosphate ion, and a sulfonate ion;

X represents a single bond or a linking group;

Y⁺ represents a substituent represented by any one of general formulae (5), (6), (7) and (8):

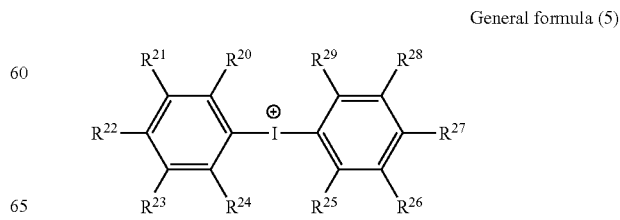

-continued

General formula (6)

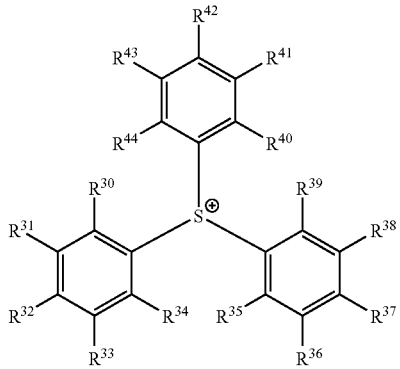

General formula (7)

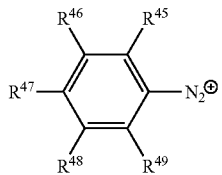

General formula (8)

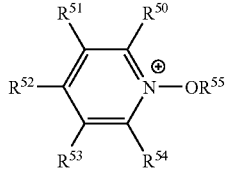

wherein $R^{20}$ to $R^{55}$ each independently represents a hydrogen atom, a halogen atom, or a monovalent organic group; and
one of $R^{20}$ to $R^{29}$ in the general formula (5), one of $R^{30}$ to $R^{44}$ in the general formula (6), one of $R^{45}$ to $R^{49}$ in the general formula (7), and one of $R^{50}$ to $R^{54}$ in the general formula (8) are a single bond connected to X in the general formula (4).

Although the mechanism of the invention is not clear, it may be surmised as follows.

In the case where the photosensitive composition of the invention is a negative-working responsive composition, the cyanine dye represented by the foregoing general formula (1) which is to be used in the invention has the light-absorbing ability and the ability of initiating radical polymerization and has the function that, when subjected to laser exposures electron is effectively transferred to the substituent therein having an onium salt structure and, as a result, generates a radical, or the dye is directly decomposed and, as a result, generates a radical, with the radical initiating and the polymerization reaction of the polymerizable monomer (C). It is also considered that the cyanine dye (A) develops the polymerization-initiating ability upon being laser-exposed and, at the same, undergoes structural change to cause change in color. It is surmised that, since the cyanine dye (A) represented by the foregoing general formula (1) has a substituent having the radical polymerization-initiating ability within the molecule, electron transfer takes place and proceeds effectively from the excited dye, a large change in color and excellent viewability can be obtained and, at the same time, that a cured image with high strength can be formed.

Also, in the case where the photosensitive composition of the invention is a positive-working responsive composition, the composition contains a water-insoluble and aqueous alkaline solution-soluble high molecular compound (H) to be described hereinafter and the infrared ray absorbent (A) of the invention. In the recording layer of the lithographic printing plate precursor using such composition, the recording layer acquires resistance to dissolution in an alkaline aqueous solution by mutual action between the onium salt structure moiety of the infrared ray absorbent (A) of the invention and an alkali-soluble group in the water-insoluble and aqueous alkaline solution-soluble resin but, in exposed areas (non-image areas), the mutual action is released by decomposition of the onium salt structure moiety of the infrared ray absorbent (A) and, as a result, solubility of the layer for the alkaline aqueous solution is improved to thereby form an image.

DETAILED DESCRIPTION OF THE INVENTION

The invention will be described in detail below.
[Photosensitive Composition]
The photosensitive composition of the invention is characterized by containing a cyanine dye (A) having on the methine chain thereof a cation moiety of an onium salt structure as a substituent. A photosensitive material having an image recording layer containing such photosensitive composition can be recorded by irradiation with laser light.

Individual constituting components of the photosensitive composition will be described in detail below.
<Cyanine Dyes (A) Having a Particular Structure>

Cyanine dyes in the photosensitive composition of the invention (hereinafter properly referred to as "particular cyanine dyes (A)) have on the methine chain thereof a cation moiety of an onium salt structure as a substituent. Here, nitrogen atoms which the cyanine dye has on both ends of the methine chain are essential parts of the cyanine dye, and hence they are not referred to as substituents.

The particular cyanine dyes (A) have the function as an infrared ray absorbent (function of converting the absorbed infrared ray to heat or function of being excited by infrared ray to transfer electron and/or energy to the cation moiety of the onium salt structure) and the function as a polymerization initiator, and therefore the lithographic printing plate precursor using the photosensitive composition of the invention can form an image by using a laser light source emitting infrared rays of from 760 to 1,200 nm in wavelength.

The particular cyanine dyes (A) preferably have a cyanine dye structure represented by the following general formula (1).

General formula (1)

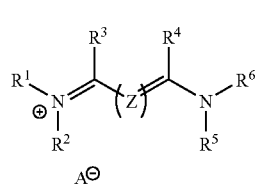

In the general formula (1), $R^1$, $R^2$, $R^5$, and $R^6$ each independently represents a hydrocarbon group. The hydrocarbon group may have a substituent and contains preferably 20 or less carbon atoms. Examples of preferred substituents include an alkoxy group containing 12 or less carbon atoms, an aryloxy group, a carboxyl group, a sulfo group, an alkylcarbonyloxy group, and an aryloxycarbonyl group. $R^3$ and $R^4$ each independently represents a hydrogen atom, a hetero atom or a hydrocarbon group. $R^1$ and $R^3$, and $R^4$ and $R^6$, may be connected to each other to form a ring. In view of storage stability of the coating solution for forming an image recording layer, it is preferred to form a 5- or 6-membered ring. Z represents a polymethine group which may have a substituent of a halogen atom, —N(Aryl)$_2$, —X$^2$-L$^1$, a chain-like or cyclic hydrocarbon group or a heterocyclic group, wherein Aryl represents an aryl group, X$^2$ represents an oxygen atom, a nitrogen atom or a sulfur atom, and L$^1$ represents a hydrocarbon group containing from 1 to 12 carbon atoms, an heteroaromatic ring or a hetero atom-containing hydrocarbon group containing from 1 to 12 carbon atoms, with the hetero atom being N, S, O, halogen atom or Se, and the polymethine group having at least one substituent represented by the following general formula (2) and, further, substituents on two methine carbon atoms of the polymethine group optionally being connected to each other to form a ring. In view of storage stability of the coating solution for forming the recording layer, the polymethine group is preferably a hydrocarbon group containing 2 or more carbon atoms, and more preferably forms a ring. This ring may further have a substituent. As such substituent, a hydrogen atom, a halogen atom, and a hydrocarbon group containing 12 or less carbon atoms are preferred. A$^-$ represents a counter ion of a halogen ion, a perchlorate ion, a tetrafluoroborate ion, a hexafluorophosphate ion or a sulfonate ion, which exists when neutralization of the charge is necessary. In view of storage stability of the coating solution for forming the recording layer, the counter ion is particularly preferably a perchlorate ion, a hexafluorophosphate ion or an arylsulfonate ion. In view of improving viewability, A$^-$ is more preferably an inorganic anion or a counter anion of a strong acid and, from such standpoint, there are illustrated PF$_6^-$, BF$_4^-$, CF$_3$SO$_3^-$, and C$_4$F$_9$SO$_3^-$, with PF$_6^-$ being most preferred. However, with those cyanine dyes represented by the general formula (1) which have an anionic substituent within its structure and which do not require neutralization of charge, A$^-$ is not necessary,

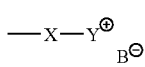

General formula (2)

In the general formula (2), X represents a single bond or a divalent linking group, Y$^+$ represents a substituent having an onium salt structure, and B$^-$ is the same as defined for A$^-$ described above.

As an organic linking group of X, those which are constituted by from 1 to 30 carbon atoms, preferably from 1 to 10 carbon atoms, from 0 to 10 nitrogen atoms, preferably from 0 to 5 nitrogen atoms, from 0 to 20 oxygen atoms, preferably from 0 to 10 oxygen atoms, from 1 to 50 hydrogen atoms, preferably from 1 to 20 hydrogen atoms, and from 0 to 10 sulfur atoms, preferably from 0 to 5 sulfur atoms, are preferred. The organic linking group may have a valence number of two or more. As more specific examples, there can be illustrated those organic linking groups which are constituted by one or a combination of the following structures.

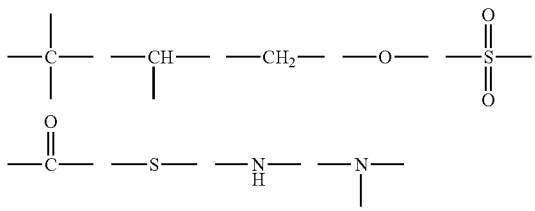

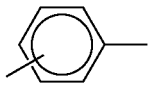

In the general formula (1), from the standpoint of viewability and matching properties for infrared laser, the polymethine group is preferably a heptamethine group, and R$^1$ and R$^3$, and R$^4$ and R$^6$, are preferably connected to each other to form a ring. Further, from the standpoint of availability of starting materials, those substituents are preferred which have the cation moiety of onium salt structure in the center of the methine chain. That is, cyanine dyes represented by the general formula (3) are preferred.

General formula (3)

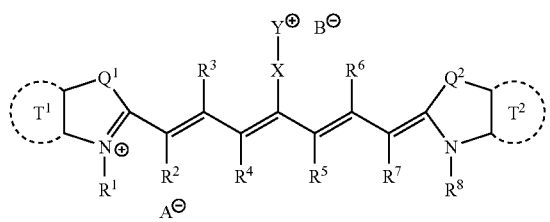

In the general formula (3), R$^1$ and R$^8$ each independently represents a hydrocarbon group. The hydrocarbon group may have a substituent, and contains preferably 20 or less carbon atoms. Preferred substituents include an alkoxy group containing 12 or less carbon atoms, an aryloxy group, a carboxyl group, a sulfo group, an alkylcarbonyloxy group, and an aryloxycarbonyl group. R$^2$, R$^3$, R$^4$, R$^5$, R$^6$, and R$^7$ each independently represents a hydrogen atom or a hydrocarbon group. R$^4$ and R$^5$ may be connected to each other to form a ring. The hydrocarbon group contains preferably 12 or less carbon atoms. In view of availability of starting materials, R$^2$, R$^3$, R$^6$, and R$^7$ are preferably hydrogen atoms. In view of storage stability of the coating solution for forming an image recording layer, R$^4$ and R$^5$ each preferably represents a hydrocarbon group containing 2 or more carbon atoms and, particularly preferably, R$^4$ and R$^5$ are connected to each other to form a 5- or 6-membered ring. From the standpoint of improving viewability, formation of a 5-membered ring is most preferred. X represents a single bond or a linking group and is the same as defined for X in the general formula (2). Q$^1$ and Q$^2$, which may be the same or different, each represents —NR$^9$—, S, O, —CH=CH— or a dialkylmethylene group. R$^9$ represents a hydrogen atom or a hydrocarbon group. The hydrocarbon group may have a substituent containing preferably 20 or less carbon atoms. Preferred substituents include a halogen atom, an amino group, an alkoxy group, an aryloxy group, a carboxyl group, a sulfo group, an alkylcarbonyloxy group, and an aryloxycarbonyl group. Y$^+$ represents a substituent having a cation moiety having an onium salt structure. T$^1$ and T$^2$ each independently represents an aromatic ring or a heteroaromatic ring. The aromatic ring and the heteroaromatic ring may have a substituent. Preferred aromatic rings include a benzene ring and a naphthalene ring. Preferred substituents include a hydrocarbon group containing 12 or less carbon atoms, a halogen atom, and an alkoxy group containing 12 or less carbon atoms. From the standpoint of improving viewability, electron donative groups are preferred. Specifically, an alkoxy group containing 12 or less carbon atoms and an alkyl group containing 12 or less carbon atoms are more preferred. $A^-$ and $B^-$ are the same as defined for $A^-$ and $B^-$ in the general formulae (1) and (2).

In the general formula (3), from the standpoint of viewability, $R^4$ and $R^5$ most preferably form a 5-membered ring. $Q^1$ and $Q^2$ each preferably represents most preferably a dialkylmethylene group. As the substituent having an onium salt structure, those substituents are most preferred which are represented by the following general formula (5), (6), (7) or (8). That is, cyanine dyes represented by the following general formula (4) are particularly preferred.

General formula (4)

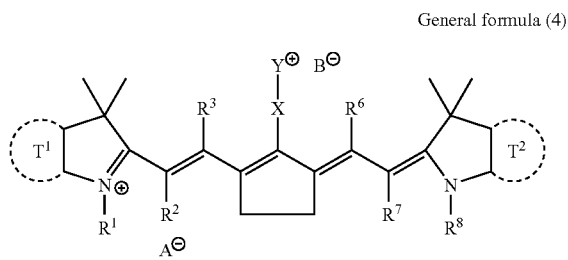

In the general formula (4), $R^1$, $R^2$, $R^3$, $R^6$, $R^7$, $R^8$, X, $T^1$, $T^2$, $A^-$, and $B^-$ are the same as defined with respect to the general formula (3).

$Y^+$ represents a substituent represented by any one of the following general formulae (5), (6), (7), and (8).

General formula (5)

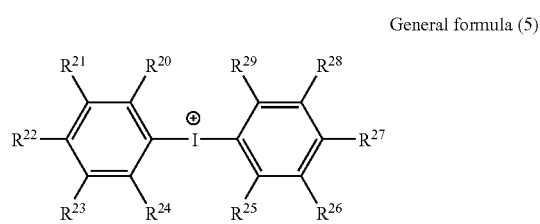

General formula (6)

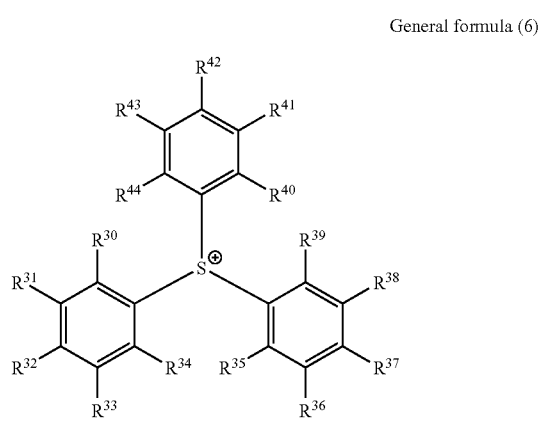

General formula (7)

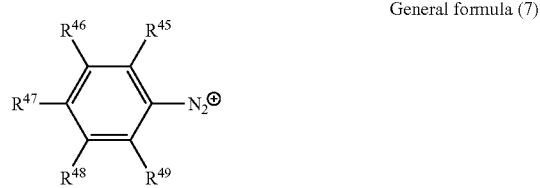

General formula (8)

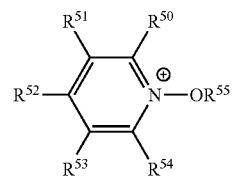

In the general formulae (5) to (8), $R^{20}$ to $R^{55}$ each independently represents a hydrogen atom, a halogen atom or a monovalent organic group, and any one of them in the general formulae (5) to (8) is a single bond and is connected to X in the general formula (4).

As to the site to which the single bond is connected, $R^{22}$ is preferred in the general formula (5), $R^{32}$ is preferred in the general formula (6), $R^{47}$ or $R^{48}$ is preferred in the general formula (7), and $R^{52}$ or $R^{53}$ is preferred in the general formula (8), from the standpoint of synthesis.

Examples of other monovalent organic group include an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonato group, a substituted sulfinyl group, a phosphono group, a substituted phosphono group, a phosphonato group, and a substituted phosphonato group and, when introducible, the monovalent organic group may further have a substituent.

As the alkyl group, there can be illustrated straight, branched and cyclic alkyl groups containing from 1 to 20 carbon atoms. Among them, a straight alkyl group containing from 1 to 12 carbon atoms, a branched alkyl group containing from 3 to 12 carbon atoms, and a cyclic alkyl group containing from 5 to 10 carbon atoms are more preferred. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

In the case where the alkyl group has a substituent (i.e., a substituted alkyl group), as the alkyl moiety of the substituted alkyl group, there can be illustrated a divalent organic residue formed by removing any one hydrogen atom on the alkyl group described above and containing from 1 to 20 carbon atoms. A preferred range of the carbon atoms is also the same as described with respect to the above-described alkyl group.

In the case where the monovalent organic group of $R^{20}$ to $R^{55}$ is a substituted alkyl group, specific examples thereof include a chloromethyl group, a bromomethyl group, a 2-chloroethyl group, a trifluoromethyl group, a methoxymethyl group, a methoxycarbonylmethyl group, an isopropoxymethyl group, a butoxymethyl group, an s-butoxybutyl group, a methoxyethoxyethyl group, an allyloxymethyl group, a phenoxymethyl group, an acetyloxymethyl group, a methylthiomethyl group, a tolylthiomethyl group, a pyridylmethyl group, a tetramethylpiperidinylmethyl group, an N-acetyltetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonnatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

As substituents which can be introduced into the alkyl group, there are illustrated monovalent substituents constituted by non-metal atoms and illustrated below in addition to the substituents described in the above description about the substituted alkyl groups. Preferred examples including the above-described substituents include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and the conjugate base thereof (referred to as "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N,N-diarylsulfamoyl group, an N-alkyl-N-arylsulfamoyl group, a phosphono group (—PO$_3$H$_2$) and the conjugate base thereof (referred to as "phosphonato group"), a dialkylphosphono group (—PO$_3$(alkyl)$_2$) (wherein "alkyl" means an alkyl group; hereinafter the same), a diarylphosphono group (—PO$_3$(aryl)$_2$) (wherein "aryl" means an aryl group; hereinafter the same), an alkylarylphosphono group (—PO$_3$(alkyl)(aryl)), a monoalkylphosphono group (—PO$_3$(alkyl)) and the conjugate base thereof (referred to as "alkylphosphonato group"), a monoarylphosphono group (—PO$_3$(aryl)) and the conjugate base thereof (referred to as "arylphosphonato group"), a phosphonoxy group (—OPO$_3$H$_2$) and the conjugate base thereof (referred to as "phosphonatoxy group"), a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) and the conjugate base thereof (referred to as "alkylphosphonatoxy group"), a monoarylphosphonoxy group (—OPO$_3$H(aryl)) and the conjugate base thereof (referred to as "arylphosphonatoxy group"), a cyano group, a nitro group, an aryl group, an alkenyl group, an alkynyl group, a heterocyclic group, and a silyl group.

Specific examples of the alkyl moiety in the above-described substituent introducible into the alkyl group are the same as in the case where $R^{20}$ to $R^{55}$ each represents a substituted alkyl group, with preferred ranges thereof being also the same as described there.

Also, specific examples of the aryl moiety in the above-described substituent introducible into the alkyl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group, and a phosphonatophenyl group.

As the alkenyl group of the monovalent organic group, there can be illustrated alkenyl groups containing from 2 to 20 carbon atoms. Among them, alkenyl groups containing from 2 to 10 carbon atoms are preferred, and alkenyl groups containing from 2 to 8 carbon atoms are more preferred. The alkenyl group may further have a substituent. Examples of introducible substituents include a halogen atom, an alkyl group, a substituted alkyl group, an aryl group, and a substituted aryl group, with a halogen atom and a straight, branched or cyclic alkyl group containing from 1 to 10 carbon atoms being preferred. Specific examples of the alkenyl group include a vinyl group, a 1-propenyl group, a 1-butenyl group, a cinnamyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, and a 2-chloro-1-ethenyl group.

As the alkynyl group of the monovalent organic group, there can be illustrated alkynyl groups containing from 2 to 20 carbon atoms. Among them, alkynyl groups containing from 2 to 10 carbon atoms are preferred, and alkynyl groups containing from 2 to 8 carbon atoms are more preferred. Specific examples thereof include an ethynyl group, a 1-propynyl group, a 1-butynyl group, a phenylethynyl group, and a trimethylsilylethynyl group.

As the aryl group of the monovalent organic group, there can be illustrated a benzene ring, a condensed ring wherein two or three benzene rings are condensed, and a condensed ring wherein a benzene ring and a 5-membered unsaturated ring are condensed with each other. Specific examples thereof include a phenyl group, a naphthyl group, an antryl group, a phenanthryl group, an indenyl group, an acenaphthenyl group, and a fluorenyl group. Of these, a phenyl group and a naphthyl group are more preferred.

The above-described aryl group may have a substituent on the ring-forming carbon atom and, as such substituent, there are illustrated monovalent substituents constituted by non-metal atoms. As preferred examples of the substituents to be introduced, there can be illustrated the foregoing alkyl group, substituted alkyl group, and those which have been described in the description about substituents in the substituted alkyl group.

As the heterocyclic group of the monovalent organic group, 3- to 8-membered heterocyclic groups are preferred, 3- to 6-membered heterocyclic groups containing nitrogen atom, oxygen atom and/or sulfur atom are more preferred, and 5- to 6-membered heterocyclic groups containing nitrogen atom, oxygen atom and/or sulfur atom are still more preferred. Specific examples thereof include a pyrrole ring group, a furan ring group, a thiophene ring group, a benzopyrrole ring group, a benzofuran ring group, a benzothiophene ring group, a pyrazole ring group, an isoxazole ring group, an isothiazole ring group, an indazole ring group, a benzoisoxazole ring group, a benzoisothiazole ring group, an imidazole ring group, an oxazole ring group, a thiazole ring group, a benzimidazole ring group, a benzoxazole ring group, a benzothiazole ring group, a pyridine ring group, a quinoline ring group, an isoquinoline ring group, a pyridazine ring group, a pyrimidine ring group, a pyrazine ring group, a phthalazine ring group, a quinazoline ring group, a quinoxaline ring group, an aziridine ring group, a phenanthrizine ring group, a carbazole ring group, a purine ring group, a pyran ring group, a piperidine ring group, a piperazine ring group, a morpholine ring group, an indole ring group, an indolizine ring group, a chromene ring group, a cinnoline ring group, an acridine ring group, a phenothiazine ring group, a tetrazole ring group, and a triazine ring group.

Also, the heterocyclic groups may have a substituent on the ring-forming carbon atom and, as such substituents, there are illustrated monovalent substituents constituted by non-metal atoms. As preferred examples to be introduced, there can be illustrated the aforesaid alkyl group, substituted alkyl group, and those which have been described in the description about the substituents in the substituted alkyl group.

The silyl group of the monovalent organic group may have a substituent, and a silyl group containing from 0 to 30 carbon atoms is preferred, a silyl group containing from 3 to 20 carbon atoms is more preferred, and a silyl group containing from 3 to 10 carbon atoms is still more preferred. Specific examples thereof include a trimethylsilyl group, a triethylsilyl group, a tripropylsilyl group, a triisopropylsilyl group, a cyclohexyldimethylsilyl group, and a dimethylvinylsilyl group.

The thiol group of the monovalent organic group represented by $R^{20}$ to $R^{55}$ may have a substituent, and a thiol group containing from 0 to 30 carbon atoms are preferred, a thiol group containing from 3 to 20 carbon atoms is more preferred, and a thiol group containing from 1 to 10 carbon atoms is still more preferred. Specific examples thereof include a mercaptomethyl group, a mercaptoethyl group, a 4-mercaptocyclohexyl group, and a 4-mercaptophenyl group.

The thioether group of the monovalent organic group may have a substituent, and a thioether group containing from 0 to 30 carbon atoms are preferred, a thioether group containing from 3 to 20 carbon atoms is more preferred, and a thioether group containing from 1 to 10 carbon atoms is still more preferred.

Specific examples thereof include an alkylthio group such as a methylthio group, an ethylthio group, and a cyclohexylthio group; and an arylthio group such as a phenylthio group.

As the substituted oxy group ($R^{06}O—$), a group wherein $R^{06}$ is a monovalent group comprising non-metal atoms excluding a hydrogen atom can be used. Preferred substituted oxy groups include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group, and a phosphonatoxy group. As the alkyl group and the aryl group in these groups, there can be illustrated the foregoing alkyl group, substituted alkyl group, the aryl group, and the substituted aryl group. Also, as the acyl group ($R^{07}CO—$) in the acyloxy group, the alkyl group, substituted alkyl group, aryl group, and substituted aryl group having been illustrated as foregoing examples can be illustrated. Of these substituents, an alkoxy group, an aryloxy group, an acyloxy group, and an arylsulfoxy group are more preferred. Specific examples of preferred substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonoxy group, and a phosphonatoxy group.

The amino group as the monovalent organic group may be a substituted amino group including an amido group. As the substituted amino group ($R^{08}NH—$ or $(R^{09})(R^{010})N—$) including an amido group, a group wherein $R^{08}$, $R^{09}$, and $R^{010}$) each is a monovalent group comprising non-metal atoms excluding a hydrogen atom can be used. Additionally, $R^{09}$ and $R^{010}$ may be connected to each other to form a ring. Preferred examples of the substituted amino group include an N-alkyl amino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N'-alkyl-N'-arylureido group, an N',N'-dialkyl-N-alkylureido group, an N',N'-dialkyl-N'-arylureido group, an N'-aryl-N-alkylureido group, an N'-aryl-N,N'-diaryl-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, and an N-aryl-N-aryloxycarbonylamino group. As the alkyl group and the aryl group in these groups, there can be illustrated the foregoing alkyl group, substituted alkyl group, the aryl group, and the substituted aryl group. $R^{o7}$ in the acyl group ($R^{o7}CO$—) in the acylamino group, N-alkylacylamino group and N-arylacylamino group is as described hereinbefore. Of these, more preferred are an N-alkylamino group, an N,N-dialkylamino group, an N-arylamino group, and an acylamino group. Specific preferred examples of the substituted amino group include a methylamino group, an ethylamino group, a diethylamino group, a morpholino group, a piperidino group, a pyrrolidino group, a phenylamino group, a benzoylamino group, and an acetylamino group.

As the substituted sulfonyl group ($R^{o11}$—$SO_2$—) of the monovalent organic group, a substituted sulfonyl group wherein $R^{o11}$ is a monovalent group comprising non-metal atoms can be used. More preferred examples thereof include an alkylsulfonyl group, an arylsulfonyl group, and a substituted or unsubstituted sulfamoyl group. As the alkyl group and the aryl group in these groups, there can be illustrated the foregoing alkyl group, substituted alkyl group, the aryl group, and the substituted aryl group. Specific examples of such substituted sulfonyl group include a butylsulfonyl group, a phenylsulfonyl group, a chlorophenylsulfonyl group, a sulfamoyl group, an N-alkylsulfamoyl group, an N,N-dialkylsulfamoyl group, an N—arylsulfamoyl group, and an N-alkyl-N-arylsulfamoyl group.

The sulfonato group (—$SO_3^-$) as the monovalent organic group means a conjugate base anion group of a sulfo group (—$SO_3H$), and it is usually preferred to use it together with a counter cation. As such counter cation, there are illustrated generally known ones, i.e., various oniums (an ammonium, a sulfonium, a phosphonium, an iodonium, an azinium, etc.) and metal ions ($Na^+$, $K^+$, $Ca^{2+}$, $Zn^{2+}$ etc.).

As the substituted carbonyl group ($R^{o13}$—CO—) of the monovalent organic group, a group wherein $R^{o13}$ is a monovalent group comprising non-metal atoms can be used. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, and an N-alkyl-N'-arylcarbamoyl group. As the alkyl group and the aryl group in these groups, there can be illustrated the foregoing alkyl group, substituted alkyl group, the aryl group, and the substituted aryl group. Of these, a formyl group, an acyl group, a carboxyl group, an alkoxycarbonyl group, an aryloxycarbonyl group, a carbamoyl group, an N-alkylcarbamoyl group, an N,N-dialkylcarbamoyl group, and an N-arylcarbamoyl group are more preferred substituted carbonyl groups. Still more preferred are a formyl group, an acyl group, an alkoxycarbonyl group, and an aryloxycarbonyl group. Specific examples of preferred substituted carbonyl group include a formyl group, an acetyl group, a benzoyl group, a carboxyl group, a methoxycarbonyl group, an ethoxycarbonyl group, an allyloxycarbonyl group, a dimethylaminophenylethenylcarbonyl group, a methoxycarbonylmethoxycarbonyl group, an N-methylcarbamoyl group, an N-phenylcarbamoyl group, an N,N-diethylcarbamoyl group, and a morpholinocarbonyl group.

As the substituted sulfinyl group ($R^{o14}$—SO—) of the monovalent organic group, a group wherein $R^{o14}$ is a monovalent group comprising non-metal atoms can be used. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group, and an N-alkyl-N-arylsulfinamoyl group. As the alkyl group and the aryl group in these groups, there can be illustrated the foregoing alkyl group, substituted alkyl group, the aryl group, and the substituted aryl group. Of these, an alkylsulfinyl group and an arylsulfinyl group are more preferred examples. Specific examples of such substituted sulfinyl group include a hexylsulfinyl group, a benzylsulfinyl group, and a tolylsulfinyl group.

The substituted phosphono group of the monovalent organic group means a phosphono group wherein one or two of the hydroxyl groups are substituted by other organic oxo groups, and preferred examples thereof include the aforesaid dialkylphosphono group, diarylphosphono group, alkylarylphosphono group, monoalkylphosphono group, and monoarylphosphono group. Of these, a dialkylphosphono group and a diarylphosphono group are more preferred. Specific examples thereof include a diethylphosphono group, a dibutylphosphono group, and a diphenylphosphono group.

The phosphonato group (—$PO_3H_2$—, —$PO_3H$—) means a conjugate base anion group derived from acid first dissociation or acid second dissociation of a phosphono group (—$PO_3H_2$). Usually, this group is preferably used in combination with a counter cation. Examples of the counter cation include commonly known cations, that is, various oniums (e.g., ammoniums, sulfoniums, phosphoniums, iodoniums, and aziniums) and metal ions (e.g., $Na^+$, $K^+$, $Ca^{2+}$, and $Zn^{2+}$).

The substituted phosphonato group is a conjugate base anion group of the above-described substituted phosphono groups wherein one hydroxyl group is substituted by an organic oxo group. Specific examples thereof include the aforesaid conjugate base of a monoalkylphosphono group (—$PO_3H(alkyl)$) and a conjugate base of a monoarylphosphono group (—$PO_3H(aryl)$).

In addition, any two of $R^{20}$ to $R^{29}$ may form one or more rings, any two of $R^{30}$ to $R^{44}$ may form one or more rings, any two of $R^{45}$ to $R^{49}$ may form one or more rings, and any two of $R^{50}$ to $R^{55}$ may form one or more rings.

In the following general formula (9), $R^1$ to $R^8$, $Q^1$, $Q^2$, $T^1$, $T^2$, X, $A^-$, and $B^-$ are the same as defined with respect to the general formula (3), and $Y^+$ is the same as described with respect to the general formula (4).

General formula (9)

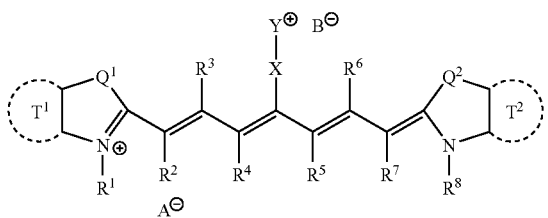

In the invention, specific examples of the particular cyanine dyes (A) which can preferably be used include the following illustrative compounds (IR-1) to (IR-82) which, however, do not limit the invention in any way.
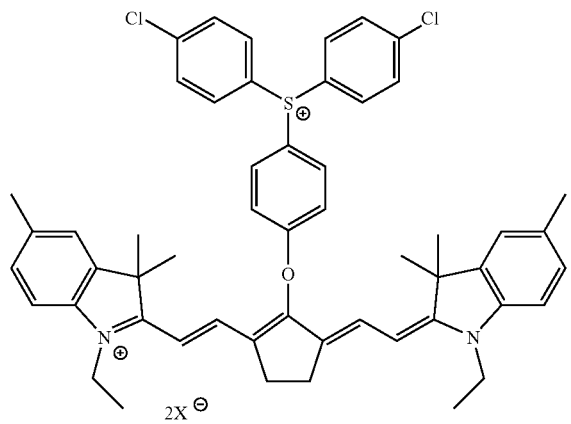
2X⁻
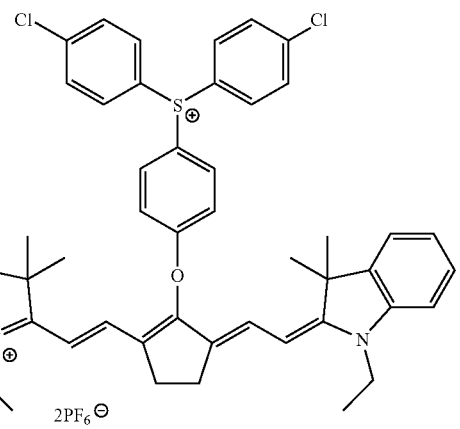
(IR-11)
2PF₆⁻
(IR-1)
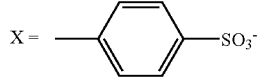
X =
(IR-2) PF₆⁻
(IR-3) ClO₄⁻
(IR-4) 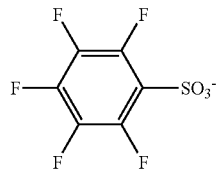
(IR-5) CF₃SO₃⁻
(IR-6) BF₄⁻
(IR-7) 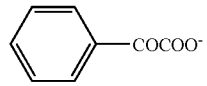
(IR-8) 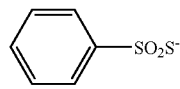
(IR-9) 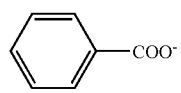
(IR-10) 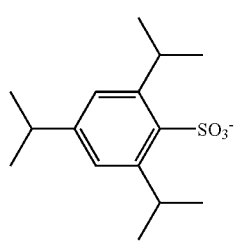
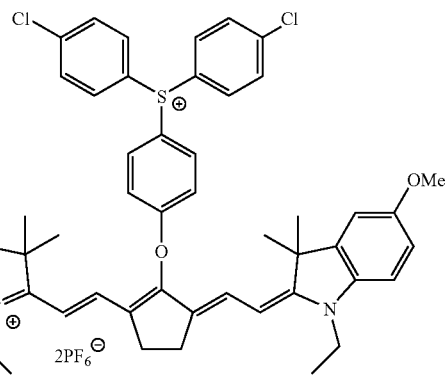
2PF₆⁻
(IR-12)
(IR-13)
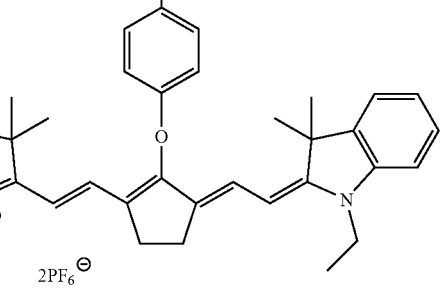
2PF₆⁻

(IR-14)
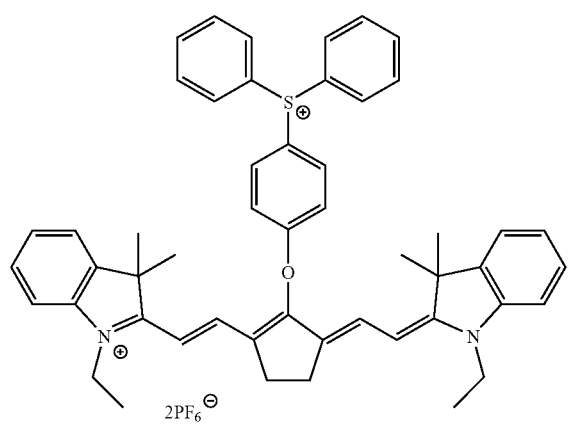
(IR-17)
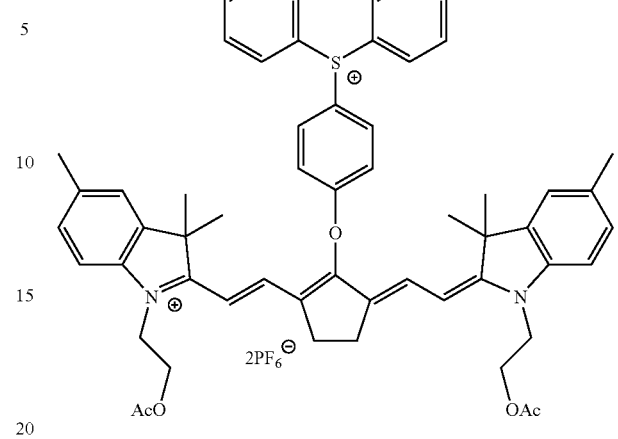
(IR-15)
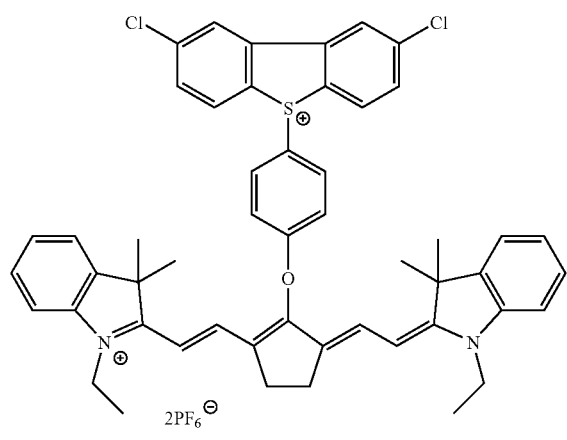
(IR-18)
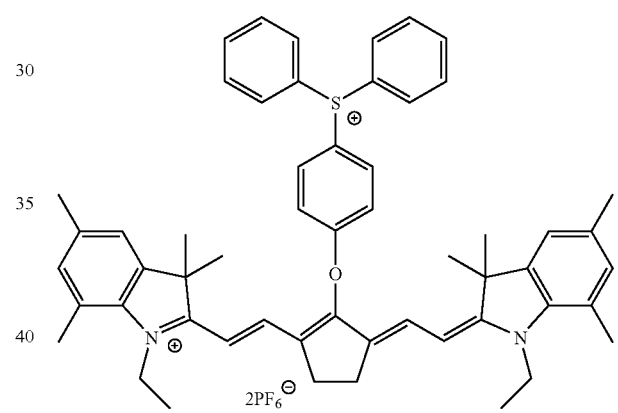
(IR-16)
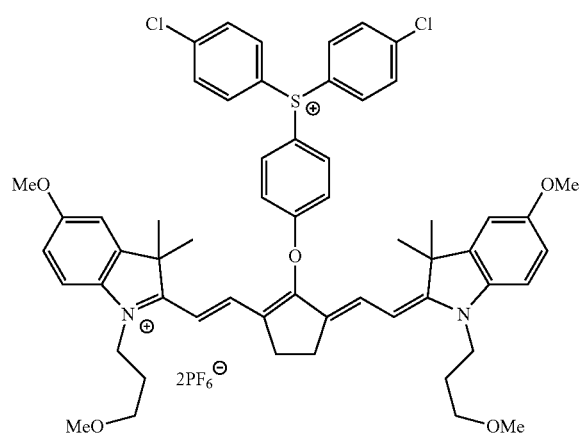
(IR-19)
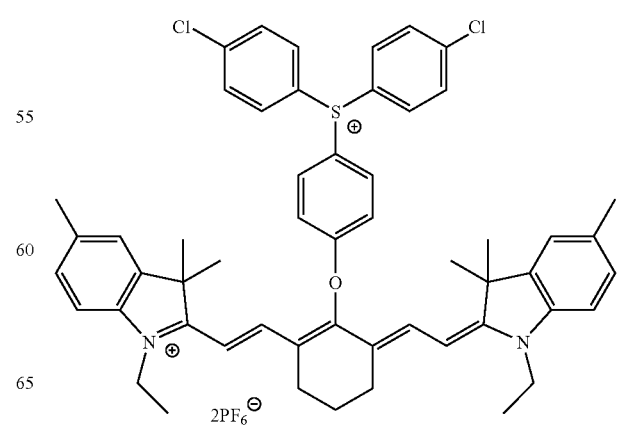

-continued
(IR-20)
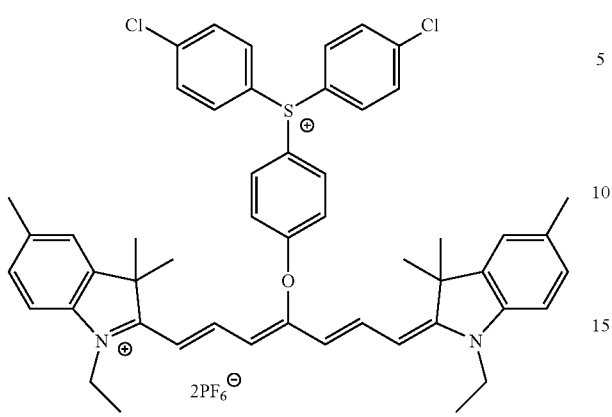
(IR-21)
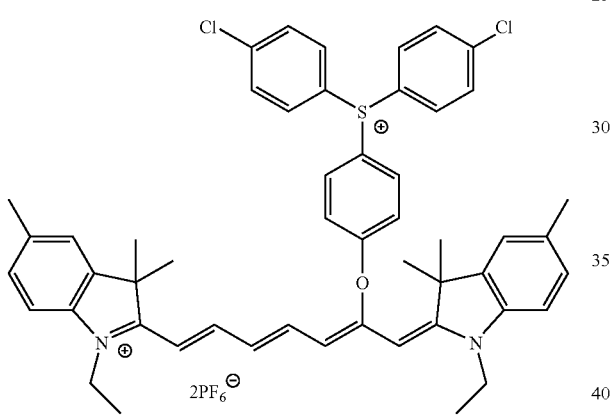
(IR-22)
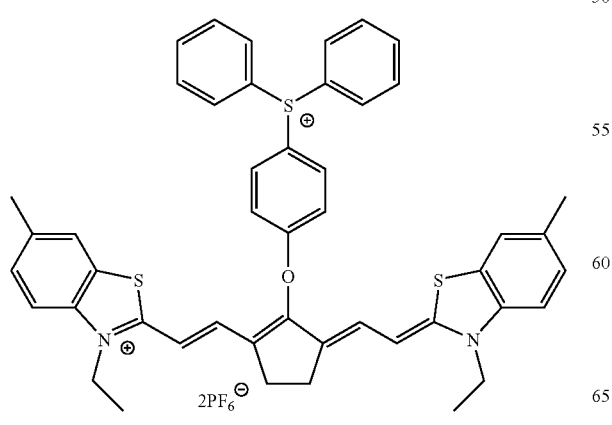
-continued
(IR-23)
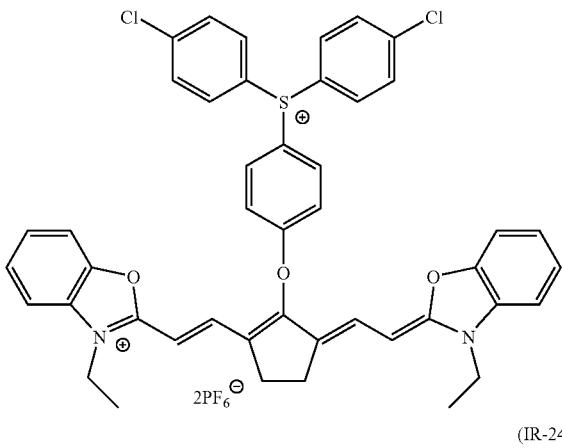
(IR-24)
(IR-25)
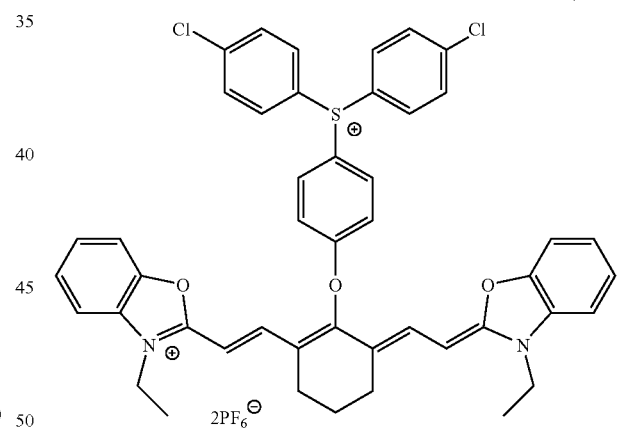
(IR-26)
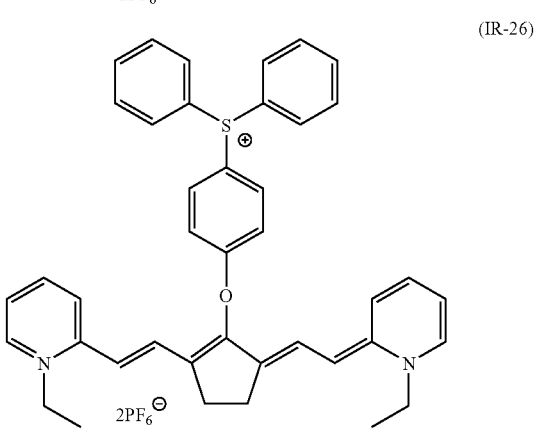

(IR-27)
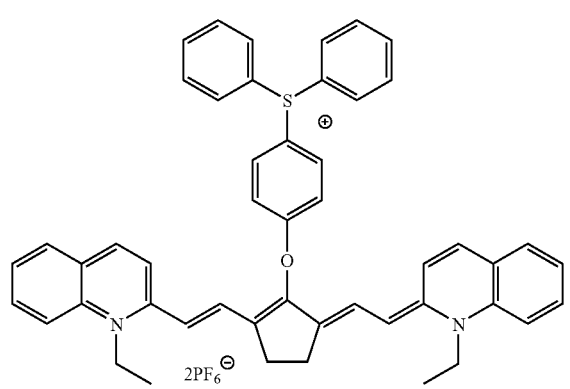
(IR-28)
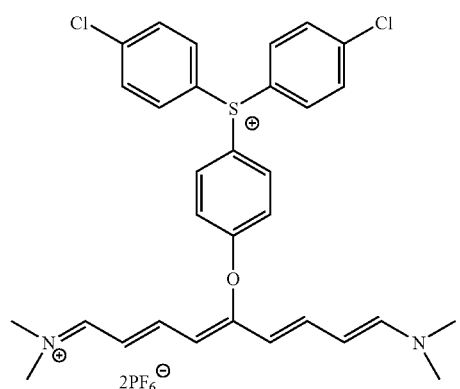
(IR-29)
(IR-30)
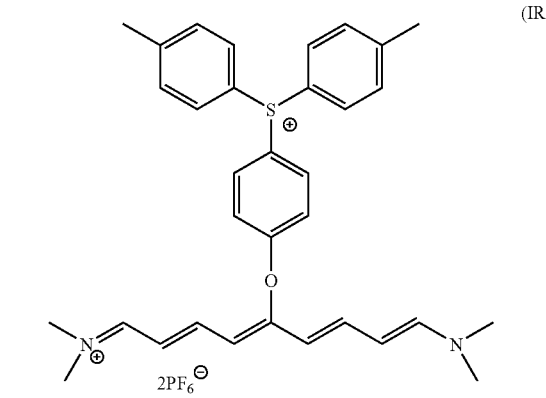
(IR-31)
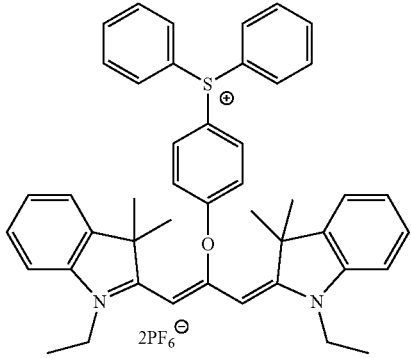
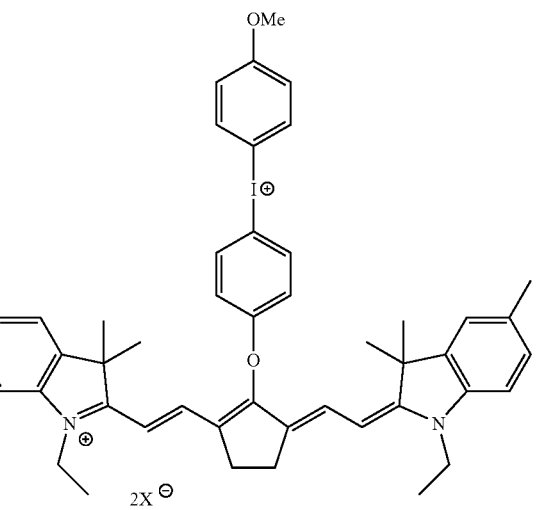
(IR-32)
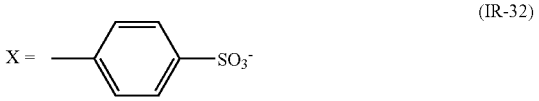
(IR-33)
PF$_6^-$
(IR-34)
ClO$_4^-$
(IR-35)
(IR-36)
(IR-37)
CF$_3$SO$_3^-$
(IR-38)
BF$_4^-$ -continued
(IR-39)
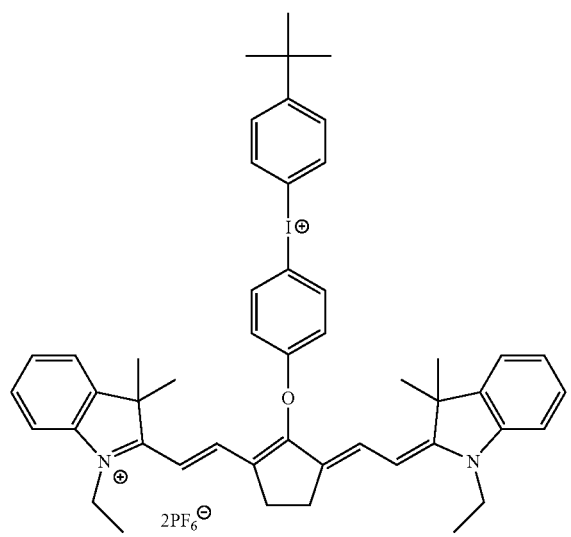
(IR-40)
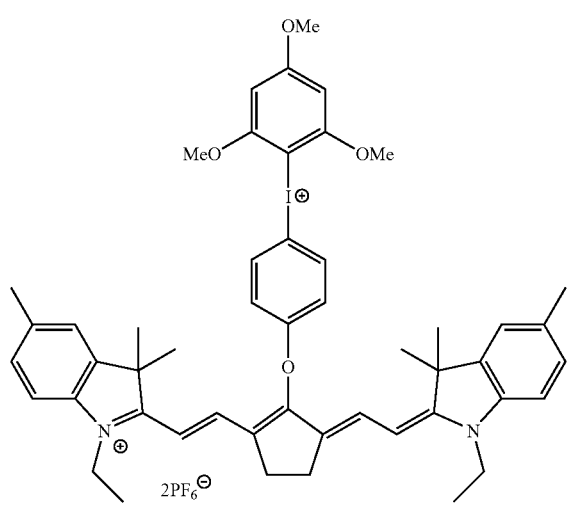
(IR-41)
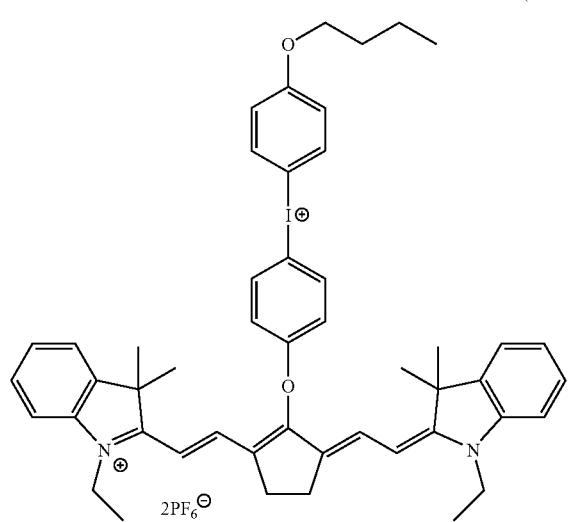
-continued
(IR-42)
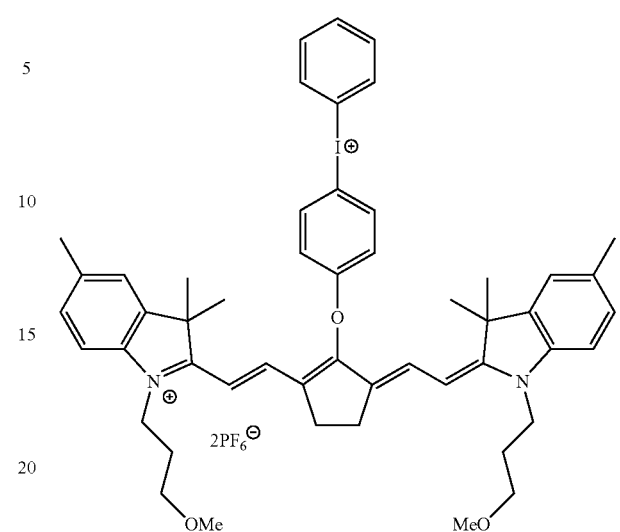
(IR-43)
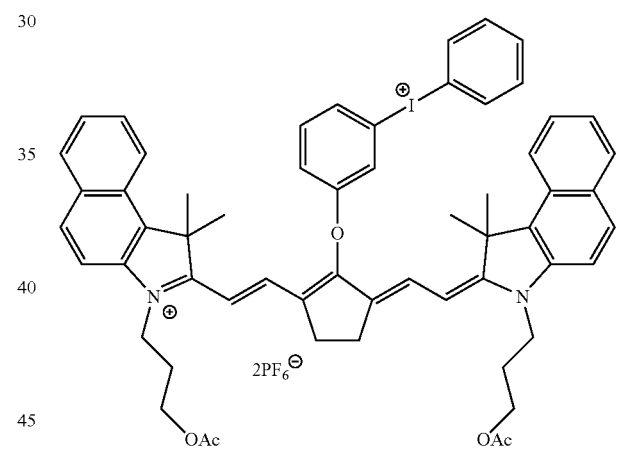
(IR-44)
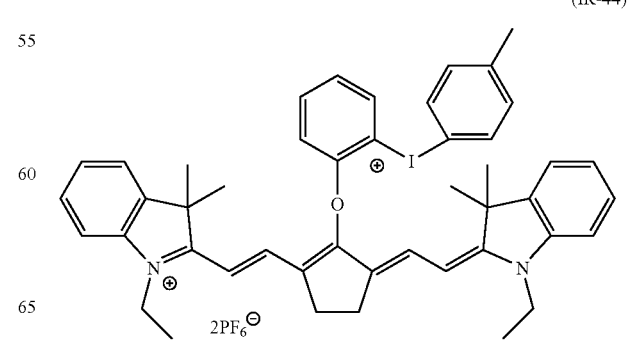

-continued
(IR-45)
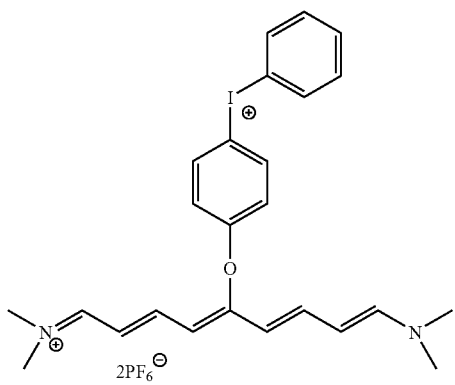
(IR-46)
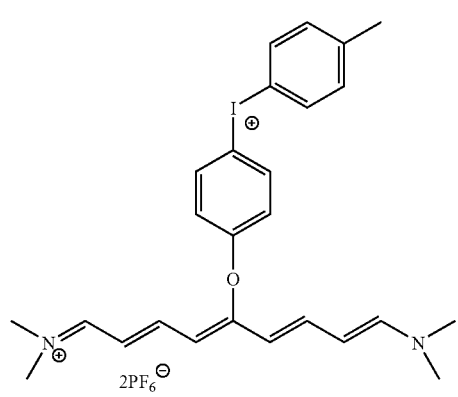
(IR-47)
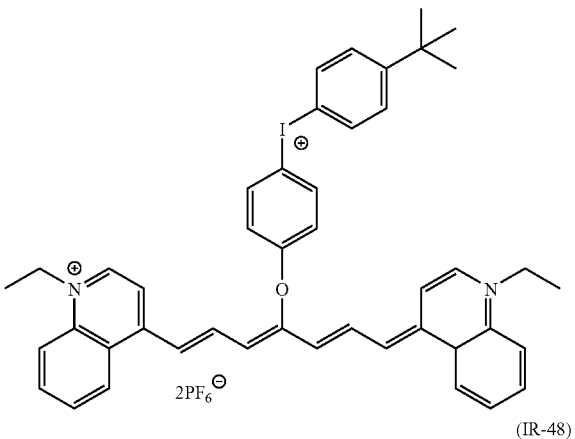
(IR-48)
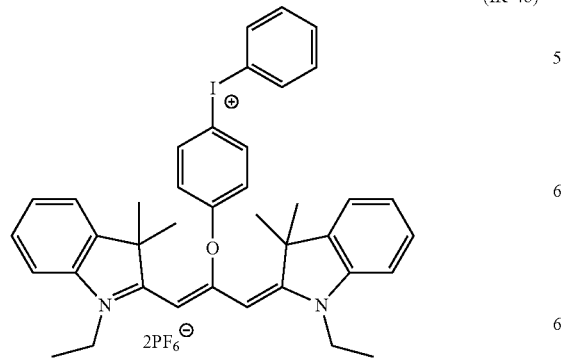
-continued
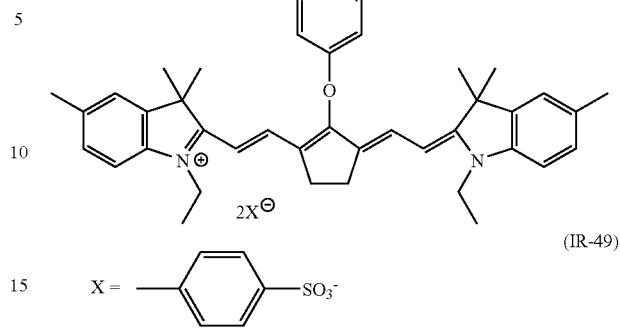
(IR-49)
X = 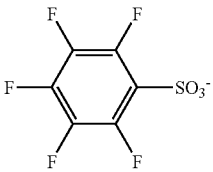
(IR-50) $PF_6^-$
(IR-51) $ClO_4^-$
(IR-52)
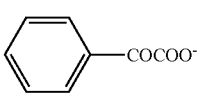
(IR-53)
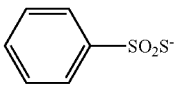
(IR-54) $CF_3SO_3^-$
(IR-55) $BF_4^-$
(IR-56)
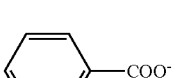
(IR-57)
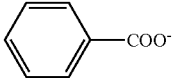
(IR-58)
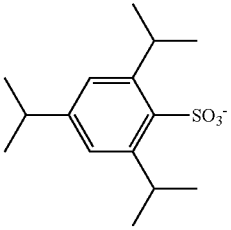
(IR-59)
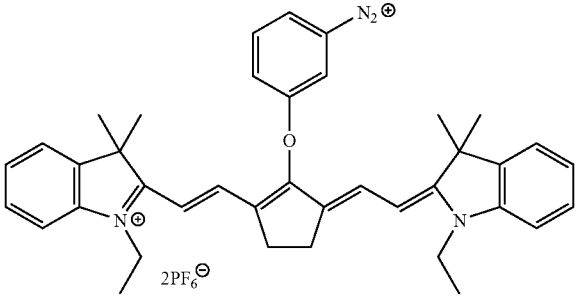

-continued
(IR-60)
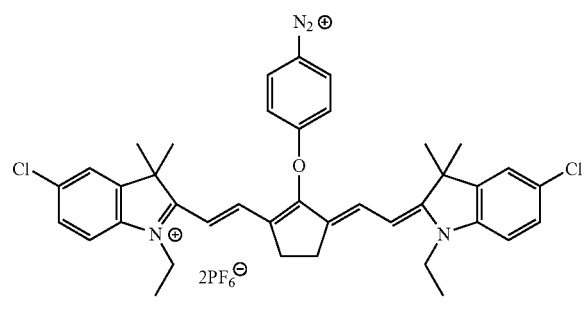
(IR-61)
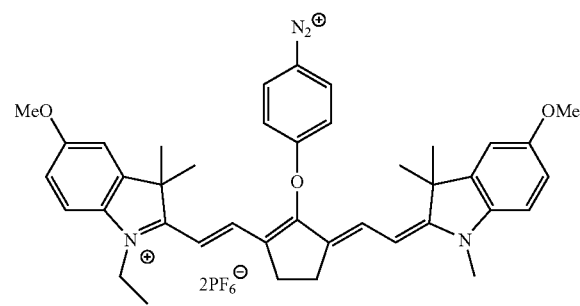
(IR-62)
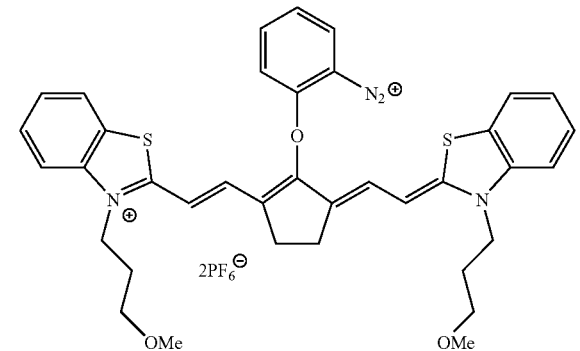
(IR-63)
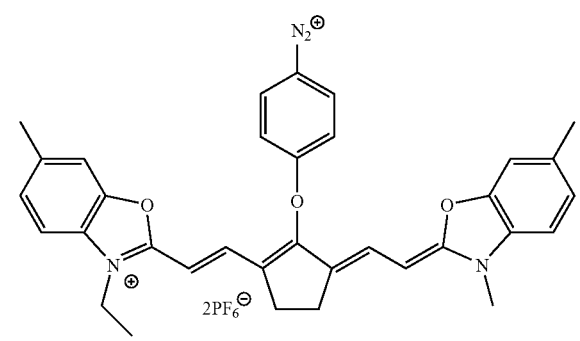
-continued
(IR-64)
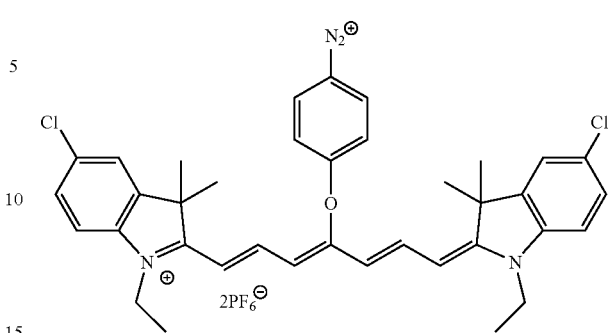
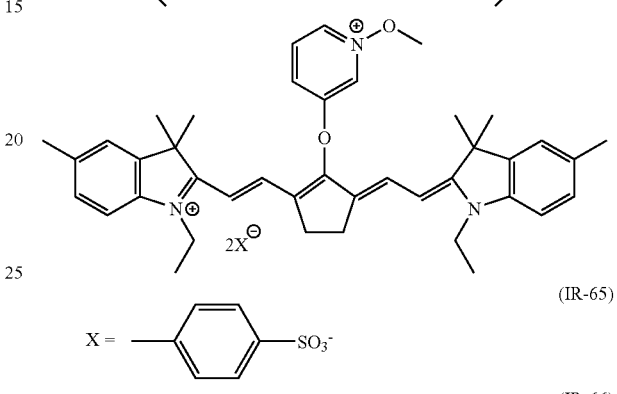
(IR-65)
X = 
(IR-66) PF$_6^-$
(IR-67) ClO$_4^-$
(IR-68)
(IR-69)
(IR-70) CF$_3$SO$_3^-$
(IR-71) BF$_4^-$
(IR-72)
(IR-73)
(IR-74)

-continued (IR-75)

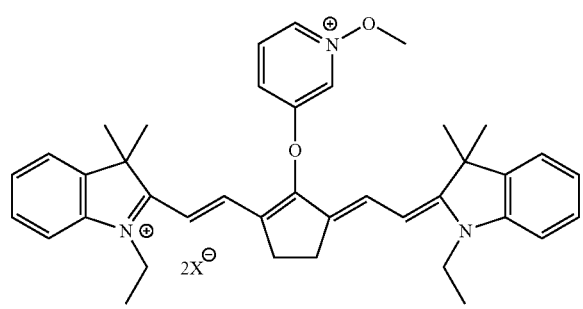

(IR-76)

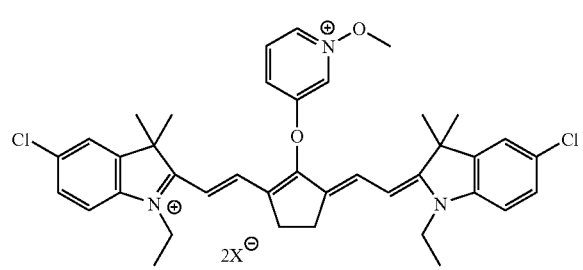

(IR-77)

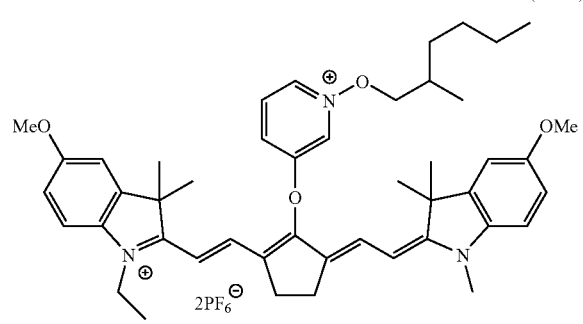

(IR-78)

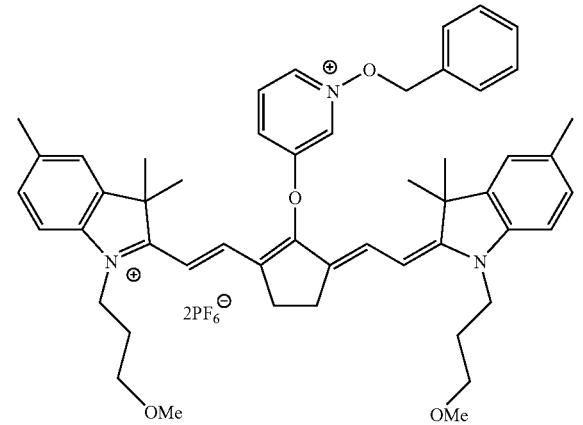

-continued (IR-79)

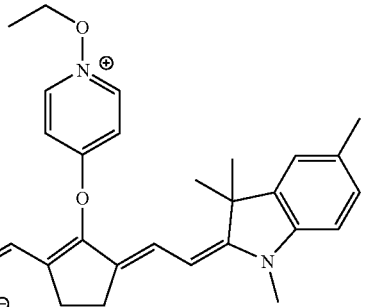

(IR-80)

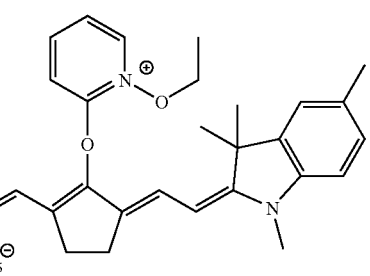

(IR-81)

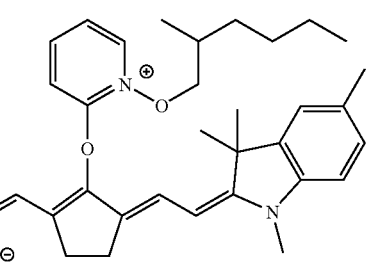

(IR-82)

The particular cyanine dye (A) may be added to the same layer as that which contains other components of the photosensitive composition or to a differently provided layer. The dye is added so that, upon preparation of a lithographic printing plate precursor, the absorbance of the image recording layer at the maximum absorption wavelength in the range of from 760 nm to 1,200 nm in wavelength falls within the range of from 0.3 to 1.2, preferably from 0.4 to 1.1 by reflection measuring method. When the dye is added to the composition within this range, the polymerization reaction proceeds uniformly in the depth direction of the image recording layer, resulting in good film strength of image areas and good adhesion properties to the support.

The absorbance of the image recording layer can be adjusted through the amount of the infrared ray absorbent added to the image recording layer and through the thickness of the image recording layer. The absorbance can be measured in a conventional manner. As the method for measuring the absorbance, there are illustrated, for example, a method of forming on a reflective support such as aluminum an image recording layer having a dry thickness properly determined in a range necessary as a lithographic printing plate, and measuring the reflection density by means of an optical densitometer and a method of measuring according to a reflection method using an integrating sphere by means of a spectrophotometer.

The addition amount of the particular cyanine dye (A) to the image recording layer is preferably from 0.1 to 30% by weights more preferably from 0.5 to 20% by weight, still more preferably from 1 to 10% by weight, based on the weight of the whole solid components.

<Other Infrared Ray Absorbents>

In the image recording layer of the invention may be used other infrared ray absorbents together with the particular cyanine dye (A) within the range of not spoiling the invention. Examples of such other infrared ray absorbents include known infrared ray absorbing dyes and pigments.

As the infrared ray absorbents, commercially available dyes and known dyes described in literature (such as Senryo Binran (Dye Handbook) edited by Yuki Gosei Kagaku Kyokai (Organic Synthetic Chemistry Association), published in 1970) can be used. Specifically, examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium pigments, pyrylium salts, metal thiolate complexes and the like. Examples of preferred dyes include cyanine dyes described in JP-A-58-125246, JP-A-59-84356, and JP-A-60-78787; methine dyes described in JP-A-58-173696, JP-A-58-181690, and JP-A-58-194595; naphthoquinone dyes described in JP-A-58-112793, JP-A-58-224793, JP-A-59-48187, JP-A-59-73996, JP-A-60-52940, and JP-A-60-63744; squarylium dyes described in JP-A-58-112792; and cyanine dyes described in U.K. Patent No. 434,875.

In addition, near infrared absorption sensitizing agents described in U.S. Pat. No. 5,156,938 can be preferably used. Moreover, substituted aryl benzo(thio)pyrylium salts described in U.S. Pat. No. 3,881,924; trimethine thiopyrylium salts described in JP-A-57-142645 (U.S. Pat. No. 4,327,169); pyrylium-containing compounds described in JP-A-58-181051, JP-A-58-220143, JP-A-5941363, JP-A-59-84248, JP-A-59-84249, JP-A-59146063, and JP-A-59-146061; cyanine dyes described in JP-A-59-216146; pentamethine thiopyrylium salts disclosed in U.S. Pat. No. 4,283,475, and pyrylium compounds described in JP-B-5-13514 and JP-B-5-19702 can be preferably used as well. Further, near infrared absorption dyes represented by formulae (I) and (II) disclosed in U.S. Pat. No. 4,756,993 can be illustrated as other examples of preferable dyes.

Further, as other preferred examples of the infrared ray absorbing dyes of the invention include those particular indoleninecyanine dyes as illustrated below described in JP-A-2002-278057.

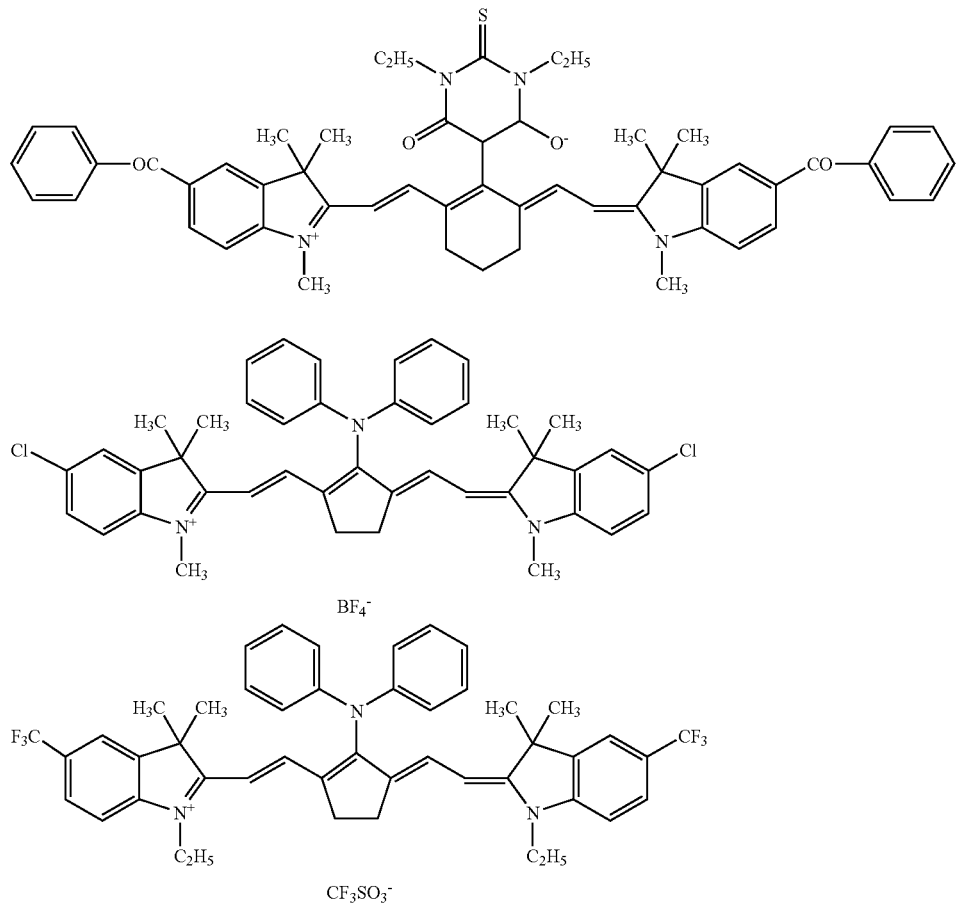

Among these dyes, particularly preferred are cyanine dyes, squarylium dyes, pyrylium salts, nickel thiolate complexes, and indoleninecyanine dyes. From the standpoint of change in color due to electron transfer, those dyes are preferred which have within the molecule a 5-membered ring, in particular, a nitrogen-containing 5-membered ring. Cyanine dyes and indoleninecyanine dyes are more preferred and, as one particularly preferred example, there are illustrated cyanine dyes represented by the following general formula (i).

General formula (i)

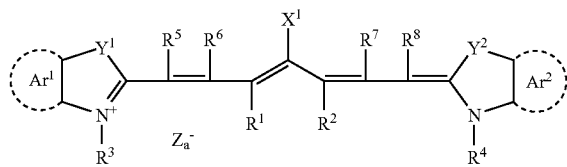

In the general formula (i), $X^1$ represents a hydrogen atom, a halogen atom, —N(Aryl)$_2$, $X^2$-L$^1$ or a group represented by the following structural formula. Here, Aryl represents an aryl group which may have a substituent, $X^2$ represents an oxygen atom, a nitrogen atom or a sulfur atom, and $L^1$ represents a hydrocarbon group containing from 1 to 12 carbon atoms, a hetero atom-containing aromatic ring, or a hetero atom-containing hydrocarbon group containing from 1 to 12 carbon atoms. Additionally, the term "hetero atom" means N, S, O, halogen atom or Se.

In the following formula, $X_a^-$ is the same as defined for $Z_a^-$ to be described hereinafter, and $R^a$ represents a substituent selected from among a hydrogen atom, an alkyl group, an aryl group, and a substituted or unsubstituted amino group.

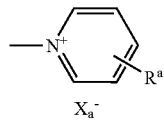

$R^1$ and $R^2$ each independently represents a hydrocarbon group containing from 1 to 12 carbon atoms. In view of storage stability of a coating solution for forming the recording layer, $R^1$ and $R^2$ each preferably represents a hydrocarbon group containing 2 or more carbon atoms and, particularly preferably, $R^1$ and $R^2$ are connected to each other to form a 5- or 6-membered ring.

$Ar^1$ and $Ar^2$, which may be the same or different, each represents an aromatic hydrocarbon group which may have a substituent. Preferred examples of the aromatic hydrocarbon group include a benzene ring and a naphthalene ring. Preferred examples of the substituent include a hydrocarbon group containing 12 or less carbon atoms, a halogen atom, and an alkoxy group containing 12 or less carbon atoms, with a hydrocarbon group containing 12 or less carbon atoms and an alkoxy group containing 12 or less carbon atoms being most preferred. $Y^1$ and $Y^2$, which may be the same or different, each represents sulfur atom or a dialkylmethylene group containing 12 or less carbon atoms. $R^3$ and $R^4$, which may be the same or different, each represents a hydrocarbon group containing 20 or less carbon atoms which may have a substituent. Preferred substituents include an alkoxy group containing 12 or less carbon atoms, a carboxyl group, and a sulfo group, with an alkoxy group containing 12 or less carbon atoms being most preferred. $R^5$, $R^6$, $R^7$, and $R^8$, which may be the same or different, each represents a hydrogen atom or a hydrocarbon group containing 12 or less carbon atoms, with a hydrogen atom being preferred in view of availability of starting materials. $Z_a^-$ represents a counter anion. However, with those cyanine dyes represented by the general formula (ii) which have an anionic substituent within its structure and which do not require neutralization of charge, $Z_a^-$ is not necessary. In view of storage stability of the coating solution for forming the recording layer, preferred examples of $Z_a^-$ include a halogen ion, a perchlorate ion, a tetrafluoroborate ion, a hexafluorophosphate ion and a sulfonate ion. Particularly preferred are a perchlorate ion, a tetrafluoroborate ion, a hexafluorophosphate ion and an arylsulfonate ion.

In addition, from the standpoint of improving plate-inspecting properties, $Z_a^-$ is preferably an inorganic anion or a counter anion of a strong acid. From such standpoint, there are illustrated $PF_6^-$, $BF_4^-$; $CF_3SO_3^-$, and $C_4F_9SO_3^-$. Of these, $PF_6^-$ is the most preferred.

As specific examples of the cyanine dyes represented by the general formula (i) and preferably used in the invention, there can be illustrated those dyes which are described in JP-A-2001-133969, paragraph nos. [0017] to [0019].

In addition, other particularly preferred examples include particular indoleninecyanine dyes described in the foregoing JP-A-2002-278057, As pigments to be used in the invention, commercially available pigments and those pigments which are described in the Color Index (C. I.) Handbook; Saishin Ganryo Binran (Newest Pigment Handbook) edited by Nippon Ganryo Gijutsu Kyokai (Japan Pigment Technology Association), published in 1977; Saishin Ganryo Oyo Gijutsu (Newest Pigment Application Technology) by CMC Press, published in 1986; and Insatsu Ink Gijutsu (Printing Ink Technology) by CMC Press, published in 1984 can be utilized.

Examples of the pigments include black pigments, yellow pigments, orange pigments, brown pigments, red pigments, purple pigments, blue pigments, green pigments, fluorescent pigments, metal powder pigments, and polymer-bonded pigments. Specifically, insoluble azo pigments, azo take pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, and the like can be used. Among these pigments, carbon black is preferred.

These pigments may be used with or without surface treatment. Examples of surface treatment methods include a method of surface coating with a resin or a wax, a method of depositing a surfactant, and a method of bonding a reactive substance (such as a silane coupling agent, an epoxy compound or polyisocyanate) with the pigment surface. The above-mentioned surface treatment methods are described in Kinzokusekken no Seishitsu to Oyo (Natures and Applications of Metal Soaps) by Sachi Press; Insatsu Ink Gijutsu (Printing Ink Technology) by CMC Press, published in 1984; and Saishin Ganryo Oyo Gijutsu (Newest Pigment Application Technology) by CMC Press, published in 1986.

The particle size of the pigment is preferably in the range of from 0.01 μm to 10 μm, more preferably in the range of from 0.05 μm to 1 μm, and particularly preferably in the range of from 0.1 μm to 1 μm. Within this range, good stability of the pigment dispersion in a coating solution for forming an image recording layer and good uniformity of the image recording layer can be obtained.

Known dispersing methods employed in ink production or toner production can be used as methods of dispersing the pigment. Examples of dispersing machine include an ultrasonic dispersing machine, a sand mill, an attritor, a pearl mill, a super mill, a ball mill, an impeller, a disperser, a KD mill, a colloid mill, a dynatron, a triple roll mill, and a pressure kneader. Details thereof are described in Saishin Ganryo Oyo Gijutsu (Newest Pigment Application Technology) by CMC Press, published in 1986.

These other infrared ray absorbents may be added to the same layer as that which contains the particular cyanine dye (A) and other components of the photosensitive composition or to a differently provided layer. The dye is added so that, upon preparation of a lithographic printing plate precursor, the absorbance of the image recording layer containing the all infrared ray absorbents including the particular cyanine dye (A) at the maximum absorption wavelength in the range of from 760 nm to 1,200 nm in wavelength falls within the range of from 0.3 to 1.2, preferably from 0.4 to 1.1 by reflection measuring method. Within this range, the polymerization reaction proceeds uniformly in the depth direction of the image recording layer, resulting in good film strength of image areas and good adhesion properties to the support. The absorbance of the image recording layer can be adjusted and measured in the same manner as has been described hereinbefore.

The addition amount to the image recording layer is preferably from 0.1 to 30% by weight, more preferably from 0.5 to 20% by weight, still more preferably from 1 to 10% by weight, based on the total weight of the solid components in the image recording layer. Additionally, the content of other infrared ray absorbent to be used together with the particular cyanine dye (A) is preferably from 0 to 100 mol % based on the particular cyanine dye (A). Within this range, excellent exposure sensitivity, and uniformity and strength of the film can be obtained at the same time.

In the case where the photosensitive composition of the invention is a negative-working responsive composition, a polymerization initiator can be used, as needed, in addition to the particular cyanine dye (A) having radical polymerization-initiating ability.

<Polymerization Initiators>

The polymerization initiators to be used in the invention are compounds which generate a radical by the energy of light, heat or both of them and initiate and accelerate polymerization of a compound having a polymerizable unsaturated group. As the polymerization initiators which can be used in the invention, there can be used known thermal polymerization initiators, compounds having a bond of small bond dissociation energy, and photo polymerization initiators. Compounds preferably usable in the invention and capable of generating a radical are those compounds which generate a radical by thermal energy and initiate and accelerate polymerization of a compound having a polymerizable unsaturated group. As the thermally radical-generating agents in accordance with the invention, known polymerization initiators and compounds having a bond of small bond dissociation energy can properly be selected to use. In addition, compounds capable of generating a radical may be used independently or in combination of two or more thereof.

Examples of the radical-generating compound include organic halogen compounds, carbonyl compounds, organic peroxides, azo polymerization initiators, azide compounds, metallocene compounds, hexaarylbiimidazole compounds, organic boric acid compounds, disulfonic acid compounds, oxime ester compounds, and onium salt compounds.

The organic halogen compounds described above specifically include compounds described in Wakabayashi et al., Bull. Chem. Soc. Japan, 42, 2924 (1969), U.S. Pat. No. 3,905, 815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, Journal of Heterocyclic Chemistry, 1, No. 3 (1970). Among them, oxazole compounds and s-triazine compounds each substituted with a trihalomethyl group are preferred.

More preferred are s-triazine derivatives in which at least one mono-, di- or tri-halogen substituted methyl group is connected to the s-triazine ring are preferred. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

The carbonyl compounds described above include benzophenone derivatives such as benzophenone, Michler's ketone, 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexylphenylketone, $\alpha$-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, and 1,1,1-trichloromethyl-(p-butylphenyl)ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; and benzoic acid ester derivatives such as ethyl p-dimethylaminobenzoate and ethyl p-diethylaminobenzoate.

As the azo compound, the azo compounds described in JP-A-8-108621 can be used.

Examples of the organic peroxide compound include trimethyl cyclohexanone peroxide, acetyl acetone peroxide, 1,1-bis(tert-butylperoxy)-3,3,5-trimethyl-cyclohexane, 1,1-bis(tert-butylperoxy)cyclohexane, 2,2-bis(tert-butylperoxy) butane, tert-butyl hydroperoxide, cumene hydroperoxide, diisopropyl benzene hydroperoxide, 2,5-dimethylhexane-2, 5-dihydroperoxide, 1,1,3,3-tetramethylbutyl hydroperoxide, tert-butyl cumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxy dicarbonate, di-2-ethylhexyl peroxy dicarbonate, di-2-ethoxyethyl peroxy dicarbonate, dimethoxy isopropyl peroxy carbonate, di(3-methyl-3-methoxybutyl) peroxy dicarbonate, tert-butyl peroxy acetate, tert-butyl peroxy pivalate, tert-butyl peroxy neodecanoate, tert-butyl peroxy octanoate, tert-butyl peroxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), and carbonyl di(t-hexylperoxy dihydrogen diphthalate).

As the metallocene compound, there are illustrated various titanocene compounds described in JP-A-59-152396, JP-A-61-151197, JP-A-63-41484, JP-A-2-249; JP-A-2-4705 and JP-A-5-83588. Examples thereof include di-cyclopentadienyl-Ti-bis-phenyl, di-cyclopentadienyl-Ti-bis-2,6-difluorophen-1-yl, di-cyclopentadienyl-Ti-bis-2,4-difluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl di-methylcyclopentadienyl-Ti-bis-2,3,5,6-tetrafluorophen-1-yl, di-methylcyclopentadienyl-Ti-bis-2,3,4,5,6-pentafluorophen-1-yl, and iron-arene complexes described in JP-A-1-304453 and JP-A-1-152109.

As the hexaaryl biimidazole compound, there are illustrated, for example, various compounds described in JP-B-6-29285, U.S. Pat. Nos. 3,479,185, 4,311,783, and 4,622,286. Specific examples thereof include 2,2'-bis(o-chlorophenyl)-4,4',5,5'-tetraphenylbiimidazole, 2,2'-bis(o-bromophenyl))-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the organic borate compound include organic borate compounds described in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Kunz, Martin, Rad Tech '98, Proceeding Apr. 19-22, 1998, Chicago; organic boron sulfonium complexes and organic boron oxosulfonium complexes described in JP-A-6-157623, JP-A-6-175564 and JP-A-6-175561; organic boron iodonium complexes described in JP-A-6-175554 and JP-A 6-175553; organic boron phosphonium complexes described in JP-A-9-188710; and organic boron transition metal coordination complexes described in JP-A-6-348011, JP-A-7-128785, JP-A-7-140589, JP-A 7-306527, and JP-A-7-292014.

As the disulfone compound, there are illustrated the compounds described in JP-A-61-166544 and JP-A-2003-328465.

As the oxime ester compound, there are illustrated the compounds described in J. C. S. Perkin II (1979) 1653-1660), J. C. S. Perkin II (1979) 156-162, Journal of Photopolymer Science and Technology (1995) 202-232 and JP-A-2000-66385, the compounds described in JP-A-2000-80068 and, specifically, the compounds shown by the following structures.

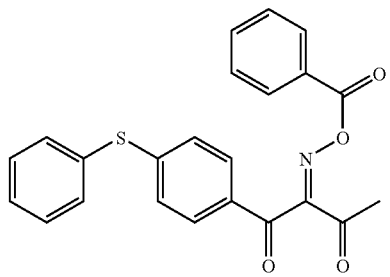

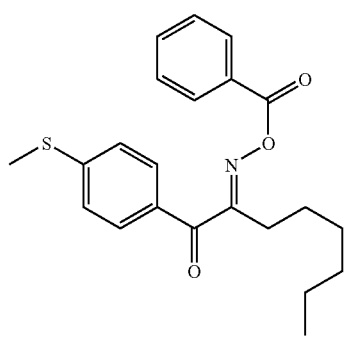

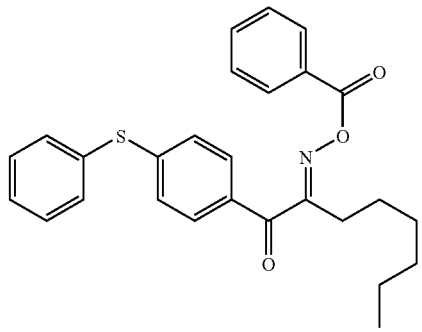

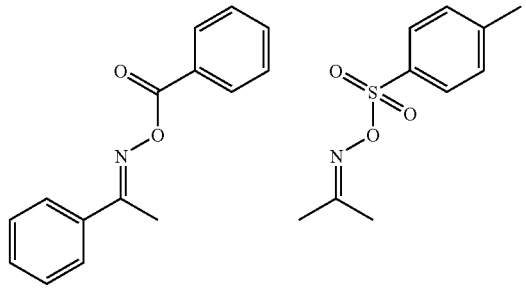

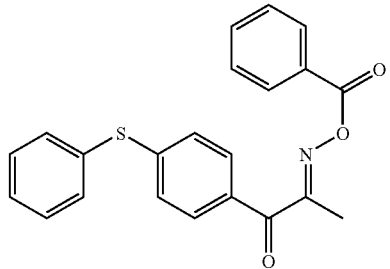

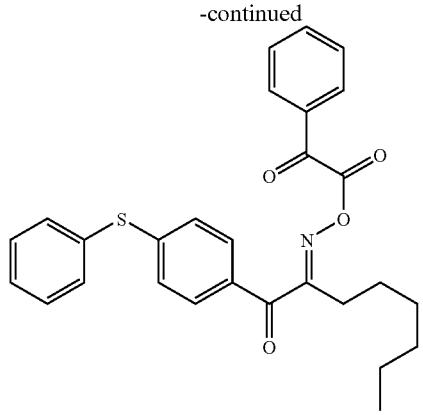
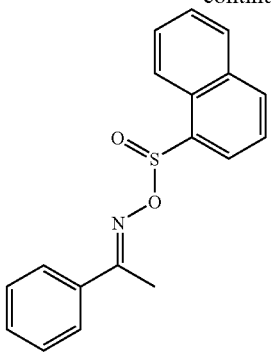
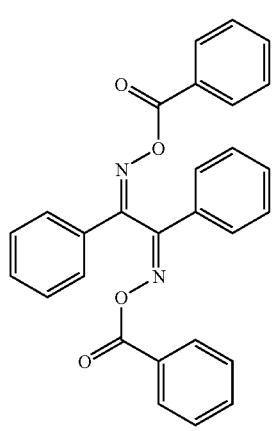
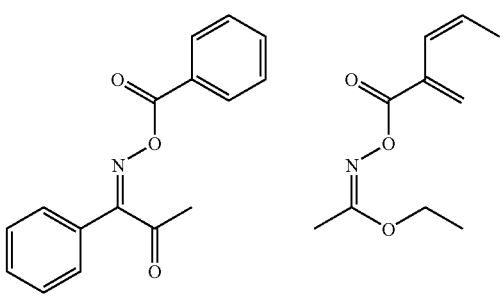
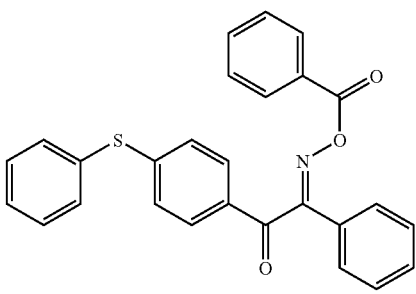
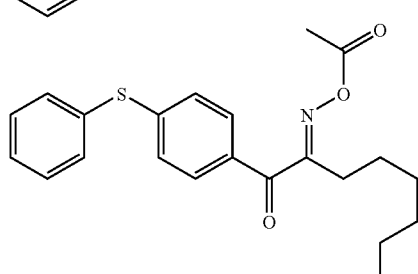
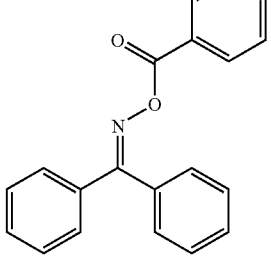
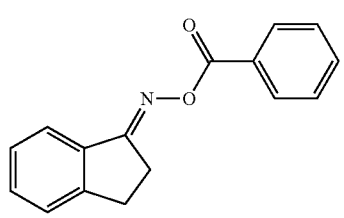
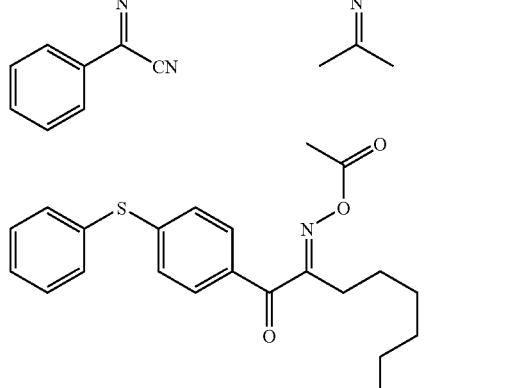
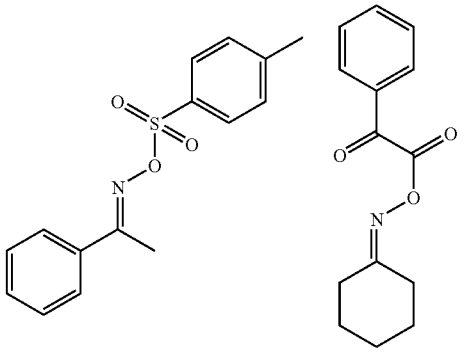

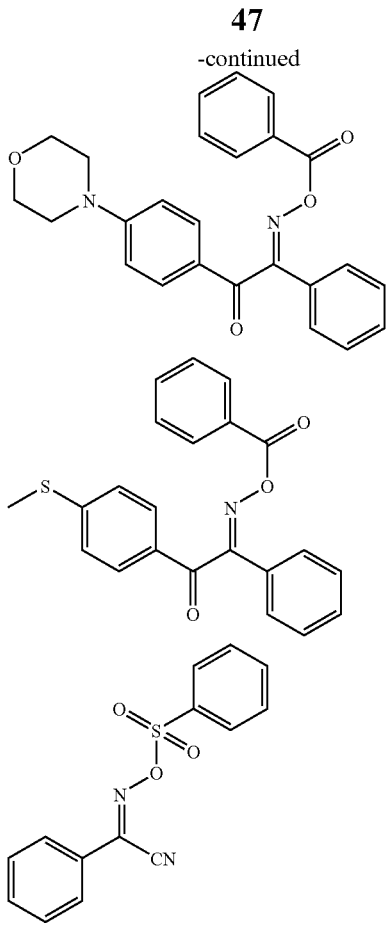

Examples of the onium salt compound include diazonium salts described in S. I. Schlesinger, Photogr. Sci. Eng., 18, 387 (1974) and T. S. Bal et al., Polymer, 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent No. 104,143, U.S. Pat. Nos. 339,049 and 410,201, JP-A-2-150848 and JP-A-2-296514; sulfonium salts described in European Patent Nos. 370,693, 390,214, 233,567, 297,443 and 297,442, U.S. Pat. Nos. 4,933,377, 161,811, 410,201, 339,049, 4,760,013, 4,734,444 and 2,833,827, and German Patent Nos. 2,904,626, 3,604,580 and 3,604,581;

selenonium salts described in J. V. Crivello et al., Macromolecules, 10(6), 1307 (1977) and J. V. Crivello et al., J. Polymer Sci., Polymer Chem. Ed., 17, 1047 (1979); and arsonium salts described in C. S. Wen et al., Teh, Proc. Conf. Rad. Curing ASIA, p. 478, Tokyo, October (1988).

The oxime ester compounds, diazonium salts, iodonium salts, sulfonium salts, and ammonium salts are preferred from the viewpoint of reactivity and stability. In the invention, these onium salts function not as acid generators but as ionic radical polymerization initiators.

In the invention, the onium salts represented by the following formulae (RI-I) to (RI-IV) are preferably used.

 (RI-I)

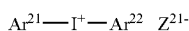 (RI-II)

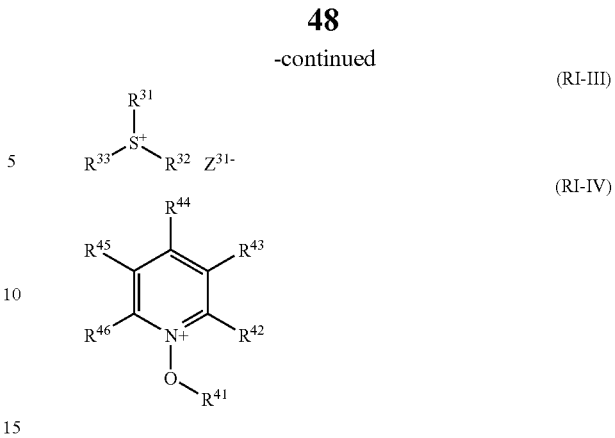

In the formula (RI-I), $Ar^{11}$ represents an aryl group containing 20 or less carbon atoms, which may have 1 to 6 substituents, and preferred examples of the substituents include an alkyl group containing from 1 to 12 carbon atoms, an alkenyl at group containing from 1 to 12 carbon atoms, an alkynyl group containing from 1 to 12 carbon atoms, an aryl group containing from 1 to 12 carbon atoms, an alkoxy group containing from 1 to 12 carbon atoms, an aryloxy group containing from 1 to 12 carbon atoms, a halogen atom, an alkylamino group containing from 1 to 12 carbon atoms, a dialkylamino group containing from 1 to 12 carbon atoms, alkyl amido group containing from 1 to 12 carbon atoms, an aryl amido group containing from 1 to 12 carbon atoms, a carbonyl group, a carboxyl group, a cyano group, a sulfonyl group, a thioalkyl group containing from 1 to 12 carbon atoms, and a thioaryl group containing from 1 to 12 carbon atoms. $Z^{11-}$ represents a monovalent anion and is a halogen ion, a perchlorate ion, a hexafluorophosphate ion, a tetrafluoroborate ion, a sulfonate ion, a sulfinate ion, a thiosulfonate ion or a sulfate ion. $Z^{11-}$ preferably represents a perchlorate ion, a hexafluorophosphate ion, a tetrafluoroborate ion, a sulfonate ion, or a sulfinate ion in view of stability and viewability.

In the formula (RI-II), $Ar^{21}$ and $Ar^{22}$ each independently represents an aryl group containing 20 or less carbon atoms, which may have 1 to 6 substituents, and preferred examples of the substituents include an alkyl group containing from 1 to 12 carbon atoms, an alkenyl group containing from 1 to 12 carbon atoms, an alkynyl group containing from 1 to 12 carbon atoms, an aryl group containing from 1 to 12 carbon atoms, an alkoxy group containing from 1 to 12 carbon atoms, an aryloxy group containing from 1 to 12 carbon atoms, a halogen atom, an alkylamino group containing from 1 to 12 carbon atoms, a dialkylamino group containing from 1 to 12 carbon atoms, an alkylamido group containing from 1 to 12 carbon atoms, an arylamido group containing from 1 to 12 carbon atoms, a carbonyl group, a carboxyl group, a cyano group, a sulfonyl group, a thioalkyl group containing from 1 to 12 carbon atoms, and a thioaryl group containing from 1 to 12 carbon atoms. $Z^{21-}$ represents a monovalent anion and is a halogen ion, a perchlorate ion, a hexafluorophosphate ion, a tetrafluoroborate ion, a sulfonate ion, a sulfinate ion, a thiosulfonate ion or a sulfate ion. $Z^{21-}$ preferably represents a perchlorate ion, a hexafluorophosphate ion, a tetrafluoroborate ion, a sulfonate ion, a sulfinate ion, or a carboxylate ion in view of stability and viewability, In the formula (RI-III), $R^{31}$, $R^{32}$ and $R^{33}$ each independently represents an aryl group, alkyl group, alkenyl group or alkynyl group containing 20 or less carbon atoms which may have 1 to 6 substituents, and is preferably an aryl group in view of reactivity and safety. Preferred examples of the substituents include an alkyl group containing from 1 to 12 carbon atoms, an alkenyl group containing from 1 to 12 carbon atoms, an alkynyl group containing from 1 to 12 carbon atoms, an aryl group containing from 1 to 12 carbon atoms, an alkoxy group containing from 1 to 12 carbon atoms, an aryloxy group containing from 1 to 12 carbon atoms, a halogen atom, an alkylamino group containing from 1 to 12 carbon atoms, a dialkylamino group containing from 1 to 12 carbon atoms, an alkylamido group containing from 1 to 12 carbon atoms, an arylamido group containing from 1 to 12 carbon atoms, a carbonyl group, a carboxyl group, a cyano group, a sulfonyl group, a thioalkyl group containing from 1 to 12 carbon atoms, and a thioaryl group containing from 1 to 12 carbon atoms. $Z^{31-}$ represents a monovalent anion of a halogen ion, a perchlorate ion, a hexafluorophosphate ion, a tetrafluoroborate ion, a sulfonate ion, a sulfinate ion, a thiosulfonate ion or a sulfate ion. $Z^{31-}$ preferably represents a perchlorate ion, a hexafluorophosphate ion, a tetrafluoroborate ion, a sulfonate ion, a sulfinate ion, or a carboxylate ion from the viewpoint of stability and reactivity. More preferred are carboxylate ions described in JP-A-2001-343742, and particularly preferred are carboxylate ions described in JP-A-2002-148790.

In the formula (RI-IV), $R^{31}$ represents an alkyl group containing from 1 to 20 carbon atoms which may have a substituent, $R^{42}$, $R^{43}$, $R^{44}$, $R^{45}$, and $R^{46}$ each independently represents an aryl group, alkyl group, alkenyl group or alkynyl group containing 20 or less carbon atoms which may have 1 to 6 substituents, and is preferably an aryl group in view of reactivity and safety. Preferred examples of the substituents include an alkyl group containing from 1 to 12 carbon atoms, an alkenyl group containing from 1 to 12 carbon atoms, an alkynyl group containing from 1 to 12 carbon atoms, an aryl group containing from 1 to 12 carbon atoms, an alkoxy group containing from 1 to 12 carbon atoms, an aryloxy group containing from 1 to 12 carbon atoms, a halogen atom, an alkylamino group containing from 1 to 12 carbon atoms, a dialkylamino group containing from 1 to 12 carbon atoms, an alkylamido group containing from 1 to 12 carbon atoms, an arylamido group containing from 1 to 12 carbon atoms, a carbonyl group, a carboxyl group, a cyano group, a sulfonyl group, a thioalkyl group containing from 1 to 12 carbon atoms, and a thioaryl group containing from 1 to 12 carbon atoms. $R^{41}$ and $R^{43}$, $R^{42}$ and $R^{43}$, $R^{43}$ and $R^{44}$, $R^{44}$ and $R^{45}$, and $R^{45}$ and $R^{46}$, may be connected to each other to form a ring. $Z^{31-}$ represents a monovalent anion of a halogen ion, a perchlorate ion, a hexafluorophosphate ion, a tetrafluoroborate ion, a sulfonate ion, a sulfinate ion, a thiosulfonate ion or a sulfate ion. $Z^{31-}$ preferably represents a perchlorate ion, a hexafluorophosphate ion, a tetrafluoroborate ion, a sulfonate ion, a sulfinate ion, or a carboxylate ion from the viewpoint of stability and viewability.

Examples of the onium salts preferably used as the polymerization initiators in the invention are illustrated below which, however, do not limit the invention in any way.

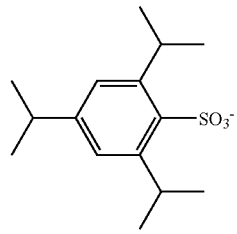

(N-1)

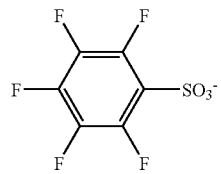

(N-2)

PF$_6^-$ (N-3)

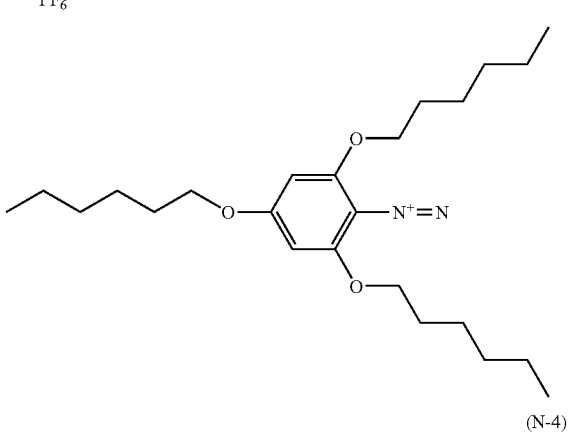

(N-4)

ClO$_4^-$ (N-5)

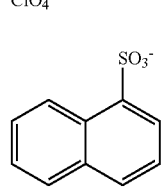

(N-6)

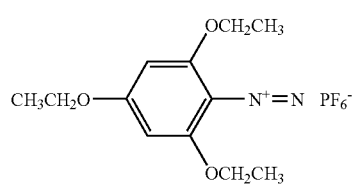

(N-7)

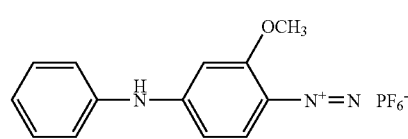

(N-8)

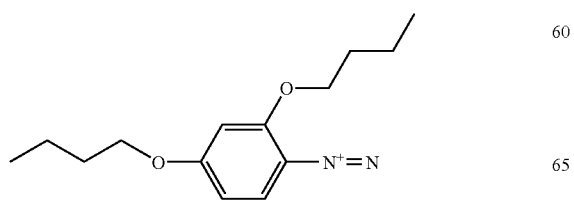

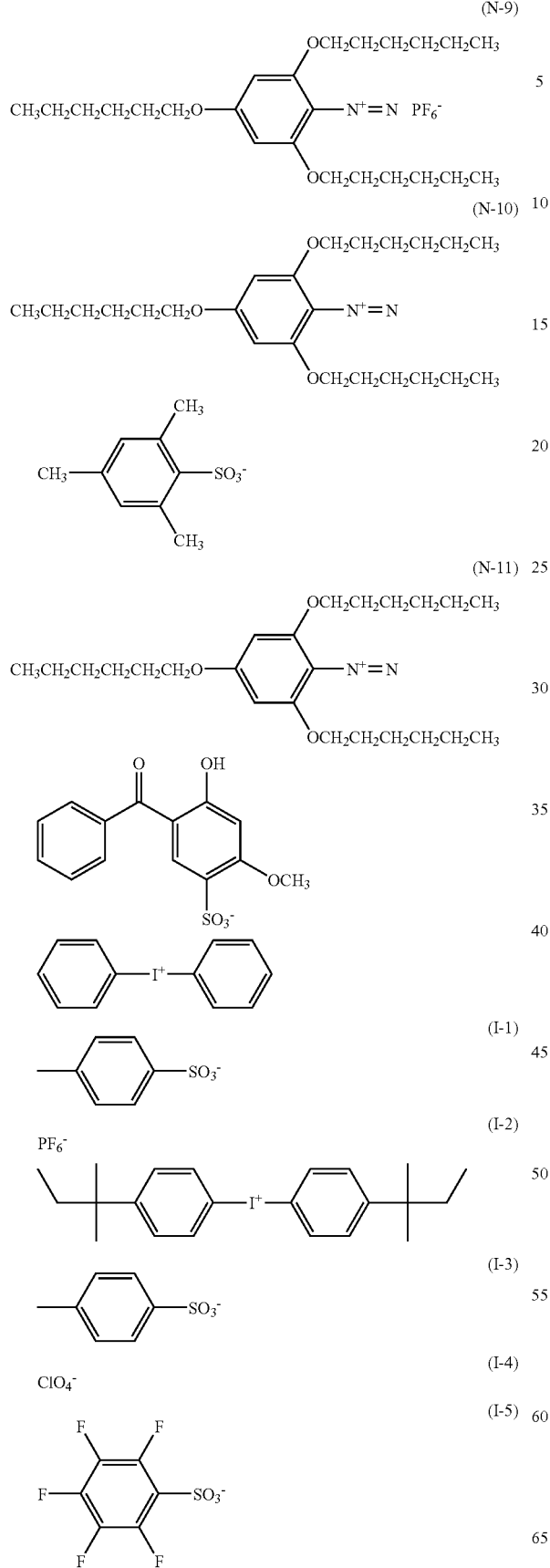
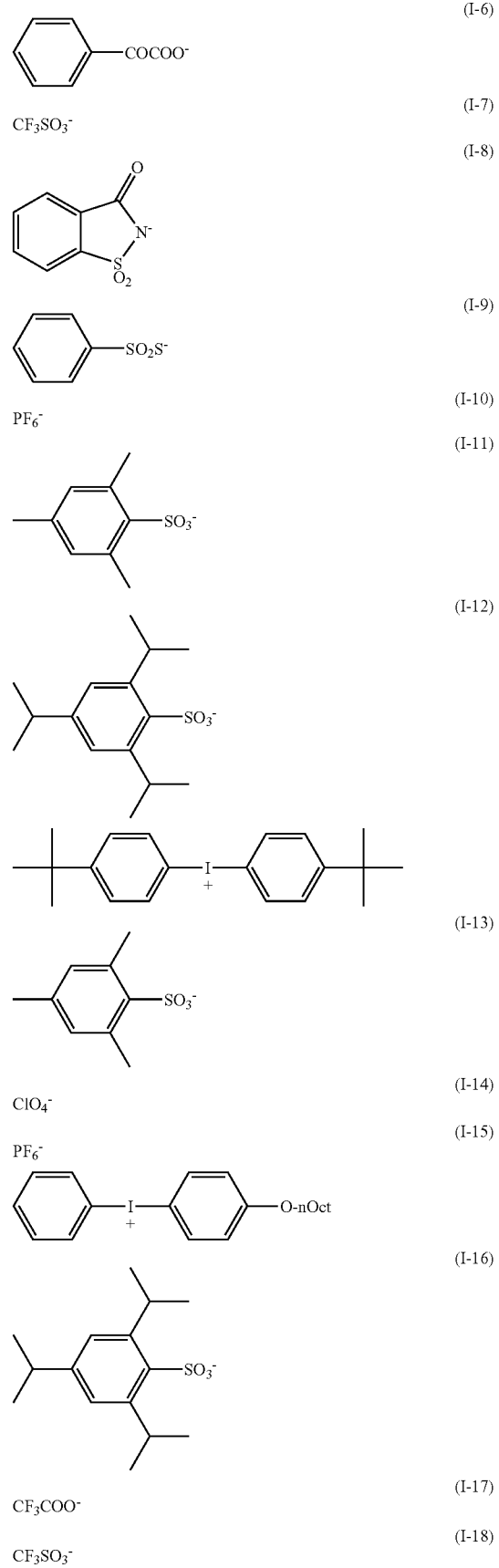

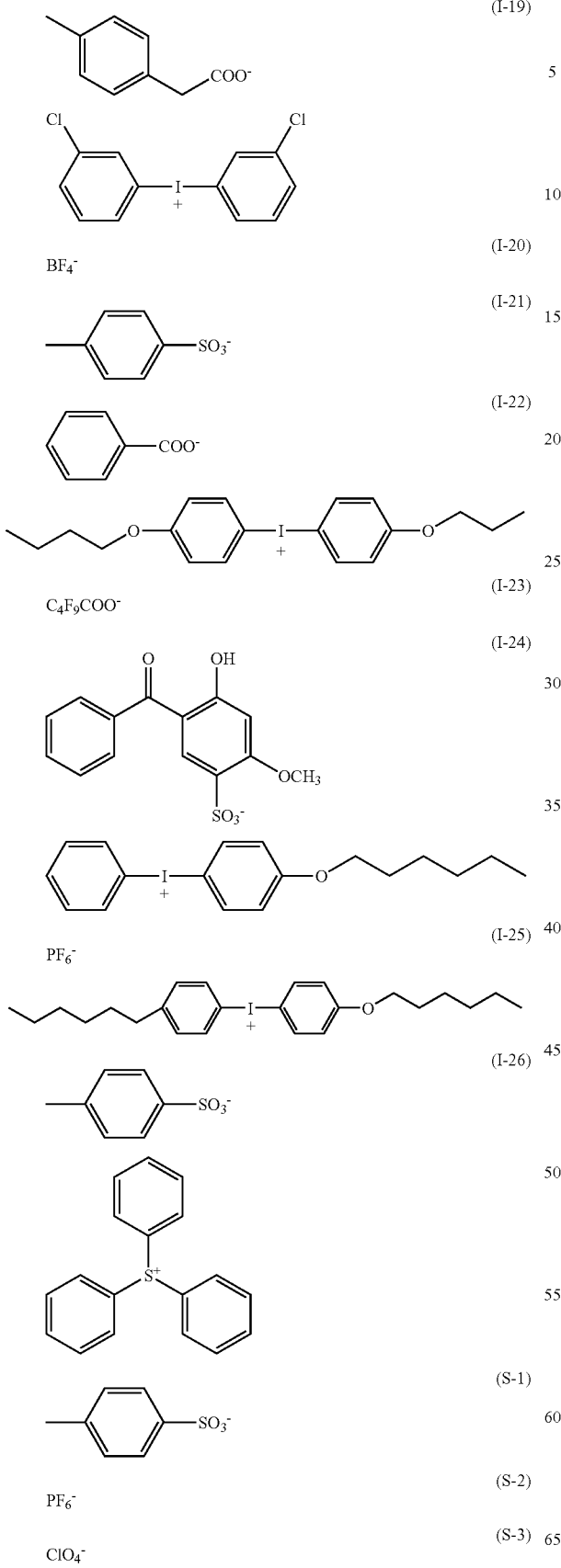

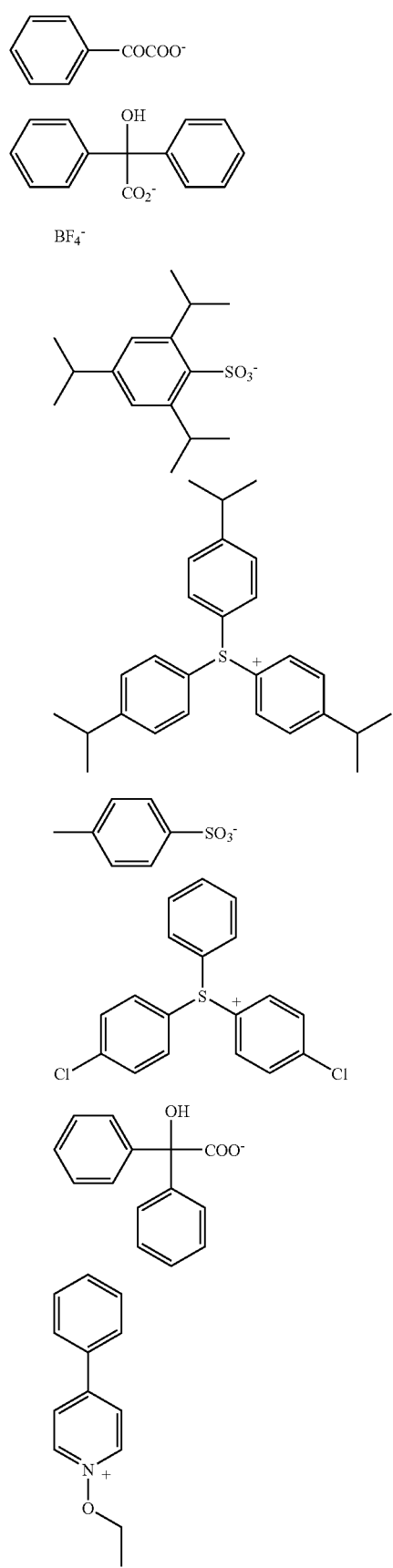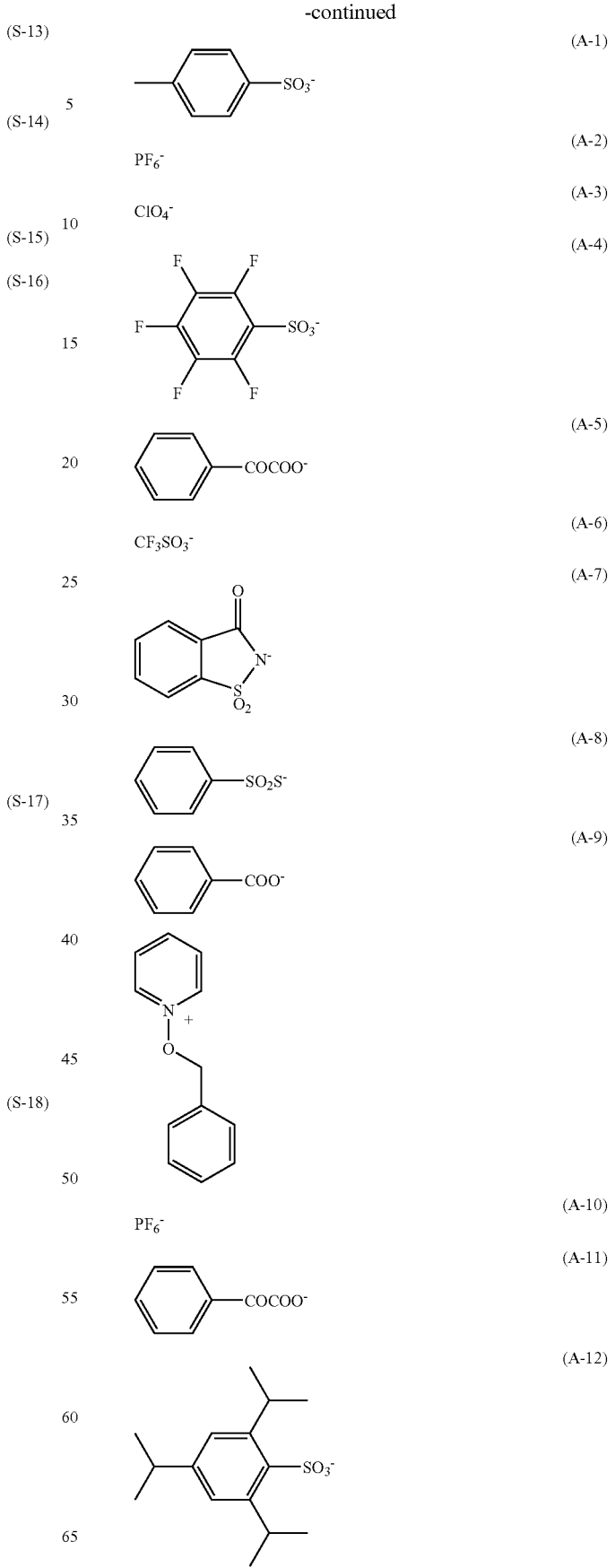

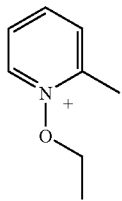

(A-13)

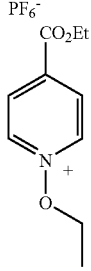

(A-14)

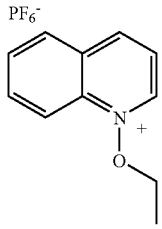

(A-15)

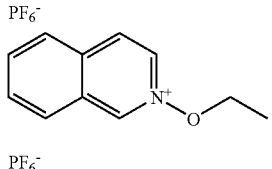

(A-16)

Of these polymerization initiators, those onium salts which have an inorganic anion, e.g. $PF_6^-$ or $BF_4^-$, as a counter ion are preferred from the standpoint of improving viewability. Further, diaryliodonium and ammonium are preferred as oniums due to their excellent color-forming properties.

Use of such polymerization initiators having excellent color-forming properties serves to more improve viewability coupled with the effects of the particular cyanine dye (A).

The polymerization initiator may be added in a content of from 0.1 to 50% by weight, preferably from 0.5 to 30% by weight, particularly preferably from 1 to 20% by weight, based on the weight of the whole solid components constituting the image recording layer. When the content is within the above range, high sensitivity and excellent stain resistance of non-image areas during printing can be achieved. These polymerization initiators may be used independently or in combination of two or more thereof. The polymerization initiator may be added to the same layer as that which contains other components or to a differently provided layer.

In the case where the photosensitive composition of the invention is a negative-working responsive composition, it further contains a binder polymer (B) and a polymerizable monomer (C) in addition to the above-described particular cyanine dye (A).

<Binder Polymers (B)>

As the binder polymer which can be used in the invention, conventionally known ones can be used with no limitations, with film-forming linear organic polymers being preferred. Examples of such binder polymer include acryl resins, polyvinyl acetal resins, polyurethane resins, polyurea resins, polyimide resins, polyamide resins, epoxy resins, methacryl resins, polystyrene series resins, novolak type phenolic resins, polyester resins, synthetic rubbers, and natural rubbers.

In order to improve film strength in image areas, the binder polymer preferably has cross-linking properties. In order to impart cross-linking properties to the binder polymer, it suffices to introduce a cross-linkable functional group such as an ethylenically unsaturated bond into the main chain or side chain of a high polymer. The cross-linkable functional group may also be introduced by co-polymerization.

Examples of a polymer having an ethylenically unsaturated bond in the main chain of the molecule include poly-1,4-butadiene and poly-1,4-isoprene.

Examples of a polymer having an ethylenically unsaturated bond in the side chain of the molecule include polymers of esters or amides of acrylic acid or methacrylic acid wherein the ester residue or amide residue (R in —COOR or CONHR) has the ethylenically unsaturated bond.

Examples of the residue (R described above) having an ethylenically unsaturated bond include —$(CH_2)_nCR^1$=$CR^2R^3$, —$(CH_2O)_nCH_2CR^1$=$CR^2R^3$, —$(CH_2CH_2O)_nCH_2CR^1$=$CR^2R^3$, —$(CH_2)_n$NH—CO—$CH_2CR^1$=$CR^2R^3$, —$(CH_2)_n$—O—CO—$CR^1$=$CR^2R^3$, and $(CH_2CH_2O)_2$—X (wherein $R^1$ to $R^3$ each represents a hydrogen atom, a halogen atom or an alkyl, aryl, alkoxy or aryloxy group containing from 1 to 20 carbon atoms, $R^1$ and $R^2$ or $R^3$ may be connected to each other to form a ring, n represents an integer of from 1 to 10, and X represents a dicyclopentadienyl residue).

Specific examples of the ester residue include —$CH_2CH$=$CH_2$ (described in JP-B-7-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$, and $CH_2CH_2O$—X (wherein X represents a dicyclopentadienyl residue).

Specific examples of the amide residue include —$CH_2CH$=$CH_2$, —$CH_2CH_2$—Y (wherein Y represents a cyclohexene residue), and —$CH_2CH_2$—OCO—$CH$=$CH_2$.

The cross-linkable binder polymer is cured by, for example, addition of a free radical (a polymerization-initiating radical or a living radical in the middle of polymerization of a polymerizable monomer) to the cross-linkable functional group and subsequent addition polymerization directly between polymer molecules or through a polymer chain of the polymerizable monomer to form cross linkages between polymer molecules. Or, atoms (for example, a hydrogen atom on the carbon atom adjacent to the functional cross-linkable group) of the polymer molecules are abstracted by free radicals to generate polymer radicals, and the polymer radicals are then bound to each other to form cross linkages between polymer molecules, thus the binder polymer being cured.

The content of the cross-linkable group (content of radical-polymerizable, unsaturated double bond measured by iodometric titration) in the binder polymer is preferably from 0.1 to 10.0 mmol, more preferably from 1.0 to 7.0 mmol, most preferably from 2.0 to 5.5 mmol. Within this range, there can be obtained good sensitivity and good storage stability.

From the standpoint of improving on-machine developability, the binder polymer preferably has a high solubility or dispersibility in an ink and/or dampening water.

In order to improve solubility or dispersibility in an ink, oleophilic binder polymer is preferred whereas, in order to improve solubility or dispersibility in dampening water, hydrophilic binder polymer is preferred. Thus, in the invention, it is also effective to use an oleophilic binder polymer and a hydrophilic binder polymer in combination.

Preferred examples of the hydrophilic binder polymer include those which have a hydrophilic group such as a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group or a phosphoric acid group.

Specific examples thereof include gum arabi, casein, gelatin, starch derivatives, carboxymethylcellulose and the sodium salt thereof, cellulose acetate, sodium alginate, vinyl acetate-maleic acid copolymers, styrene-maleic acid copolymers, polyacrylic acids and the salts thereof, polymethacrylic acids and the salts thereof, hydroxyethyl methacrylate homopolymer and copolymer, hydroxyethyl acrylate homopolymer and copolymer, hydroxypropyl methacrylate homopolymer and copolymer, hydroxypropyl acrylate homopolymer and copolymer, hydroxybutyl methacrylate homopolymer and copolymer, hydroxybutyl acrylate homopolymer and copolymer, polyethylene glycols, hydroxypropylene polymers, polyvinyl alcohols, hydrolyzed polyvinyl acetate having a hydrolysis degree of 60 mol % or more, preferably 80 mol % or more, polyvinyl formal, polyvinyl butyral, polyvinylpyrrolidone, acrylamide homopolymer and copolymer, methacrylamide homopolymer and copolymer, N-methylolacrylamide homopolymer and copolymer, polyvinylpyrrolidone, alcohol-soluble nylon, and polyether between 2,2-bis-(4-hydroxyphenyl)-propane and epichlorohydrin.

The weight-average molecular weight of the binder polymer is preferably 5,000 or more, more preferably from 10,000 to 300,000, and the number-average molecular weight is 1,000 or more, more preferably from 2,000 to 250,000. The polydiversity (weight-average molecular weight/number-average molecular weight) thereof is preferably from 1.1 to 10.

The binder polymer may be either of random polymer and block polymer, with random polymer being more preferred. The binder polymers may be used independently or as a mixture of two or more thereof.

The binder polymer can be synthesized according to conventionally known processes. Examples of solvents to be used upon synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, dimethylsulfoxide, and water. These are used independently or as a mixture of two or more thereof.

As the radical polymerization initiator to be used upon synthesis of the binder polymer, known compounds such as azo initiators and peroxide initiators can be used.

The content of the binder polymer (B) is from 0 to 90% by weight, preferably from 0 to 80% by weight, more preferably from 0 to 70% by weight, based on the weight of the whole solid components of the image recording layer. Within this range, there can be obtained good strength of image areas and good image-forming properties.

In the case of using the photosensitive composition of the invention in a negative-working image recording layer, it is preferred to further incorporate a polymerizable monomer (C). Individual components in the photosensitive layer constituting the negative-working image recording layer will be described in detail hereinafter.

Additionally, in view of the characteristic properties of the invention, the cyanine dyes described in claims may naturally be used in a positive-working image recording layer as well. (This is apparent from the comparison of Examples 7 and 8 with Comparative Example 2.) As components constituting the photosensitive composition to be used in the positive-working image recording layer, those which are described in JP-A-2004-341405 and JP-A-2006-258979 can properly be selected to use.

<(C) Polymerizable Monomers>

In order to effectively conduct the curing reaction, a polymerizable monomer is preferably incorporated in the image recording layer of the invention. The polymerizable monomer which can be used in the invention is an addition-polymerizable compound having at least one ethylenically unsaturated double bond, and is selected from compounds each having at least one, preferably two or more, terminal ethylenically unsaturated bonds. Such compounds are known widely in the related industrial field, and in the invention, the polymerizable compounds can be used with no particular limitations. The polymerizable compound may be in the chemical form of, for example, a monomer, a prepolymer (i.e., a dimer, a trimer or an oligomer), a mixture thereof, or a copolymer thereof. Examples of the monomer and the copolymer thereof include unsaturated carboxylic acids (e.g., acrylic acid, methacrylic acid, itaconic acid, crotonic acid, isocrotonic acid, and maleic acid), esters thereof, and amides thereof. Preferably, an ester between an unsaturated carboxylic acid and an aliphatic polyhydric alcohol; and an amide between an unsaturated carboxylic acid and an aliphatic polyvalent anine are used. In addition, an addition-reaction product of an unsaturated carboxylic ester or amide having a nucleophilic substituent such as a hydroxyl group, an amino group, or a mercapto group, with a monofunctional or multifunctional isocyanate or an epoxy compound; and a dehydration condensation reaction product of an unsaturated carboxylic ester or amide having a nucleophilic substituent such as a hydroxyl group, an amino group, or a mercapto group, with a monofunctional or multifunctional carboxylic acid is preferably used as well. Further, an addition-reaction product of an unsaturated carboxylic ester or amide having an electrophilic substituent such as an isocyanate group or an epoxy group, with a monofunctional or multifunctional alcohol, amine or thiol; and, further, a substitution-reaction product of an unsaturated carboxylic ester or amide having an eliminatable substituent such as a halogen group or a tosyloxy group, with a mono functional or multifunctional alcohol, amine or thiol are also preferred. As other examples, compounds described above wherein the unsaturated carboxylic acid is replaced by an unsaturated phosphonic acid, styrene, a vinyl ether, or the like can be used as well.

Specific examples of the monomer of ester between an aliphatic polyhydric alcohol and an unsaturated carboxylic acid include acrylic esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers, and isocyanuric acid EO-modified triacrylate.

Examples of methacrylic esters include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2 hydroxypropoxy)phenyl]dimethyl methane, and bis[-p-(methacryloxyethoxy)phenyl]dimethyl methane.

Examples of itaconic esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic esters include ethylene glycol dicrotonate, tetramethylene glycol dicrotonate, pentaerythritol dicrotonate, and sorbitol tetradicrotonate. Examples of isocrotonic esters include ethylene glycol diisocrotonate, pentaerythritol diisocrotonate, and sorbitol tetraisocrotonate. Examples of maleic esters include ethylene glycol dimaleate, triethylene glycol dimaleate, pentaerythritol dimaleate, and sorbitol tetramaleate.

As examples of other esters, there can be preferably used, for example, aliphatic alcohol-based esters described in JP-B-51-47334 and JP-A-57-196231, esters each having an aromatic skeleton described in JP-A-59-5240, JP-A-59-5241 and JP-A-2-226149, and esters each having an amino group described in JP-A-1-165613. It is also possible to use a mixture of ester monomers described above.

Specific examples of the monomer of amide between an aliphatic polyvalent amine and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bisacrylamide, and xylylene bis-methacrylamide. Preferable examples of other amide type monomers include those each having a cyclohexylene structure and described in JP-B-54-21726.

An urethane series addition-polymerizable compound produced by addition reaction between an isocyanate and a hydroxyl group is also preferred. Specific examples thereof include a vinyl urethane compound described in JP-B-48-41708 having two or more polymerizable vinyl groups per molecule, which is obtained by adding a vinyl monomer having a hydroxyl group and represented by the following formula (b) to a polyisocyanate compound having two or more isocyanate groups per molecule.

$$CH_2=C(R^4)COOCH_2CH(R^5)OH \quad (b)$$

In the formula (b), $R^4$ and $R^5$ each independently represents H or $CH_3$.

In addition, the urethane acrylates described in JP-A-51-37193, JP-B-2-32293 and JP-B-2-16765 and the urethane compounds having ethylene oxide type skeletons and described in JP-B-58-49860, JP-B-56-17654, JP-B-62-39417 and JP-B-62-39418 are also preferred. Further, addition-polymerizable compounds each containing an amino structure or sulfide structure within the molecule and described in JP-A-63-277653, JP-A-63-260909 and JP-A-1-105238 can be used to obtain photo-polymerizable compositions extremely excellent in photosensitive speed.

Other examples of the polymerizable compound further include multi-functional acrylates and methacrylates such as polyester acrylates described in JP-A-48-64183, JP-B-49-43191 and JP-B-52-30490 and epoxy acrylates obtained reacting epoxy resins with acrylic acid or methacrylic acid.

Further, particular unsaturated compounds described in JP-B-46-43946, JP-B-1-40337 and JP-B-1-40336, and vinyl phosphonic acid compounds described in JP-A-2-25493 can be illustrated. In some cases, a structure containing a perfluoroalkyl group described in JP-A-61-22048 can preferably be used. Further, photo-curable monomers and oligomers presented in the Journal of Japanese Adhesive Society, vol. 20, No. 7, pp. 300-308 (1984) can be used as well.

Details (such as the structure, amount, and whether used alone or in combination with another addition-polymerizable compound) of these addition-polymerizable compounds may be arbitrary determined in accordance with the design of the performance of the resultant lithographic printing plate precursor. For example, the addition polymerizable compound can be selected from the following viewpoints.

In view of the sensitivity, the addition-polymerizable compound preferably has a structure containing many unsaturated groups per molecule and, in many cases, the addition-polymerizable compound preferably has two or more functionalities. In order to increase the strength of the image areas, i.e., cured areas, the addition-polymerizable compound preferably has three or more functionalities. It is also effective to control both the sensitivity and the strength by using a combination of addition-polymerizable compounds (e.g. acrylates, methacrylates, styrene compounds, and vinyl ether compounds) having different functionalities and different polymerizable groups. Selection and manner of use of the addition-polymerizable compound is an important factor for compatibility with other components (e.g. a binder polymer, an initiator, and a colorant) in the image recording layer and for dispersibility in the image recording layer. The compatibility may be improved by using, for example, an addition-polymerizable compound with low purity or a combination of two or more addition-polymerizable compounds. A particular structure may be selected for the purpose of improving the adhesion properties of the image recording layer to a support, a protective layer to be described hereinafter.

The addition-polymerizable monomer (C) is used in the range of preferably from 5 to 80% by weight, more preferably from 25 to 75% by weight, based on the weight of the non-volatile components in the image recording layer. The monomers may be used independently or in combination of two or more thereof. Besides, as to use of the polymerizable monomers, a proper layer structure, a proper compounding, and a proper addition amount can be selected arbitrary, considering the degree of polymerization inhibition caused by oxygen, the resolution, the fogging property, the change in reflectance, and the surface adhesiveness of the image recording layer. Further, in some cases, a layer structure wherein an undercoat layer or an overcoat layer is provided and a coating method for forming the layer structure may be employed.

The polymerizable monomer (C) and the binder polymer (B) are preferably used in a weight ratio of from 0.5/1 to 4/1.

The image recording layer (negative-working responsive) of the lithographic printing plate precursor of the invention may contain, in addition to the above-described components (A) to (C), various compounds according to the end use thereof within the range of not spoiling the effects of the invention.

<Photosensitive Composition Capable of Forming an On-Machine-Developable Image Recording Layer>

The photosensitive composition for forming an on-machine-developable image recording layer preferably contains (D) microcapsules or microgel. Such photosensitive composition permits recording by irradiation with laser light, and the image recording layer is preferably a so-called on-machinedevelopable image recording layer which, after recording by laser exposure, permits removal of non-image areas by subjecting the layer to a printing step without any wet development processing step to print, during which the non-image areas are removed by the oily components and the hydrophilic components such as an ink or dampening water in the course of printing. Hereinafter, individual components of the photosensitive composition constituting the on-machine-developable image recording layer will be described in detail.

<Surfactant>

In the invention, use of a surfactant in the image recording layer preferably is preferred in order to accelerate on-machine developability upon initiation of printing and to improve the surface property of the coated layer. Examples of the surfactant include a nonionic surfactant, an anionic surfactant, a cationic surfactant, an amphoteric surfactant, and a fluorine-containing surfactant. The surfactants may be used independently or in combination of two or more thereof.

The nonionic surfactant to be used in the invention is not particularly limited, and known nonionic surfactants can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene castor oils, polyoxyethylene glycerin fatty acid partial esters, fatty acid diethanol amides, N,N-bis-2-hydroxyalkylamines, polyoxyethylene alkyl amine, triethanol amine fatty acid esters, trialkylamine oxides, polyethylene glycol, and polyethylene glycol-polypropylene glycol copolymers.

The anionic surfactant to be used in the invention is not particularly limited, and conventionally known anionic surfactants can be used. Examples thereof include fatty acid salts, abietates, hydroxyalkane sulfonates, alkane sulfonates, dialkylsulfosuccinic ester salts, linear alkylbenzene sulfonates, branched alkylbenzene sulfonates, alkylnaphthalene sulfonates, alkylphenoxypolyoxyethylene propyl sulfonates, polyoxyethylene alkylsulfophenyl ether salts, N-methyl-N-oleyl-taurine sodium salt, N-alkylsulfosuccinic monoamide disodium salt, petroleum sulfonates, sulfated beef tallow, sulfuric ester salts of alkyl esters of fatty acids, alkyl sulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkyl phosphoric ester salts, polyoxyethylene alkyl ether phosphoric ester salts, polyoxyethylene alkylphenyl ether phosphoric ester salts, partially saponified styrene-maleic anhydride copolymers, partially saponified olefin-maleic anhydride copolymers, and naphthalenesulfonate formalin condensates.

The cationic surfactant to be used in the invention is not particularly limited, and conventionally known cationic surfactants can be used. Examples thereof include alkylamine salts, quaternary ammonium salts, polyoxyethylene alkylamine salts, and polyethylene polyamine derivatives.

The amphoteric surfactant used in the invention is not particularly limited, and conventionally known amphoteric surfactants can be used. Examples thereof include carboxy betaines, aminocarboxylic acids, sulfobetaines, aminosulfates and imidazolines.

Additionally, in the above-described surfactants, it is possible to read the term "polyoxyethylene" as "polyoxyalkylene" such as polyoxymethylene, polyoxypropylene or polyoxybutylene and, in the invention, such surfactants can be used as well.

Further preferred surfactants include fluorine-containing surfactants which contain a perfluoroalkyl group within the molecule. Examples of the fluorine-containing surfactants include anionic surfactants such as perfluoroalkyl carboxylates, perfluoroalkyl sulfonates and perfluoroalkyl phosphates; amphoteric surfactants such as perfluoroalkyl betaine; cationic surfactants such as perfluoroalkyl trimethylammonium salts; and nonionic surfactants such as perfluoroalkylamine oxides, perfluoroalkyl ethylene oxide adducts, oligomers each having a perfluoroalkyl group and a hydrophilic group, oligomers each having a perfluoroalkyl group and an oleophilic group, oligomers each having a perfluoroalkyl group, a hydrophilic group, and an oleophilic group, and urethanes each having a perfluoroalkyl group and an oleophilic group. In addition, the fluorine-containing surfactants described in JP-A-62-170950, JP-A-62-226143, and JP-A-60-168144 are also preferred.

The surfactants may be used independently or in combination of two or more thereof.

The content of the surfactant is preferably from 0.001 to 10% by weight, more preferably from 0.01 to 7% by weight, based on the weight of the whole solid components of the image recording layer.

<Colorant>

In the invention, various compounds other than the above-mentioned compounds may be further added as needed. For example, dyes having large absorption in the visible light range can be used as colorants for an image. Specific examples of the colorants include Oil Yellow #101, Oil Yellow #103, Oil Pink #312, Oil Green BG, Oil Blue BOS, Oil Blue #603, Oil Black BY, Oil Black BS, Oil Black T-505 (which are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes described in JP-A-62-293247. In addition, pigments such as phthalocyanine pigments, azo pigments, carbon black, and titanium oxide can preferably be used as well.

The addition of the colorants is preferred since the addition enables easy differentiation between the image areas and the non-image areas after image formation. Additionally, the addition amount of the colorant is from 0.01 to 10% by weight based on the weight of the whole solid components of the image recording layer.

<Print-Out Agent>

A compound whose color can be changed by an acid or by a radical can be added to the image recording layer of the invention in order to form a print-out image. As such compound, various coloring materials such as a diphenyl methane coloring material, a triphenyl methane coloring material, a thiazine coloring material, an oxazine coloring material, a xanthene coloring material, an anthraquinone coloring material, an iminoquinone coloring material, an azo coloring material, and an azomethine coloring material can effectively be used.

Specific examples thereof include dyes such as Brilliant Green, Ethyl Violet, Methyl Green, Crystal Violet, Basic Fuchsia, Methyl Violet 2B, Quinaldine Red, Rose Bengal, Metanil Yellow, Thymol Sulfophthalein, Xylenol Blue, Methyl Orange, Paramethyl Red, Congo Red, Benzopurprin 4B, α-Naphthyl Red, Nile Blue 2B, Nile Blue A, Methyl Violet, Malachite Green, Parafuchsin, Victoria Pure Blue BOH [manufactured by Hodogaya Kagaku Co., Ltd.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spirone Red BEH Special [manufactured by Hodogaya Kagaku Co., Ltd.], m-Cresol Purple, Cresol Red, Rhodamine B, Rhodamine 6G, Sulforhodamine B, Auramine, 4-p-diethylaminophenyl-iminonaphthoquinone, 2-carboxyanilino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminophenylmethane (Leuco Crystal Violet) and Pergascript Blue SRB (manufactured by Ciba-Geigy).

In addition to those described above, leuco dyes known as materials for thermal sensitive paper and pressure sensitive paper are illustrated as preferred dyes. Specific examples thereof include crystal violet lactone, malachite green lactone, benzoyl leucomethylene blue, 2-N-phenyl-N-methylamino)-6-(N-p-tolyl-N-ethyl)-amino-fluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)-fluoran, 3 (N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino) fluoran, 3-(N,N-diethylamino)-7-chlorofluoran, 3-(N,N-diethylamino)-7-benzylaminofluoran, 3-(N,N-diethylamino)-7,8-benzo-fluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)-phthalide, 3,3-bis(p-dimethylaminophenyl)-6-dimethyl aminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)-phthalide.

The amount of the dye whose color is changed by an acid or by a radical is preferably from 0.01 to 10% by weight based on the weight of the whole solid components in the image recording layer.

<Polymerization Inhibitor>

It is preferable to add a small amount of a thermal polymerization inhibitor to the image recording layer of the invention in order to inhibit undesired thermal polymerization of the radical polymerizable monomer (C) during the production or storage of the image recording layer.

Preferable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt.

The addition amount of the thermal polymerization inhibitor is preferably from about 0.01 to about 5% by weight based on the weight of the whole solid components of the image recording layer.

<Higher Fatty Acid Derivatives>

In order to prevent the polymerization inhibition by oxygen, a higher fatty acid derivative such as behenic acid or behenic amide may be added to the image recording layer of the invention such that the higher fatty acid derivative is present on the surface of the image recording layer in the course of drying after the coating. The addition amount of the higher fatty acid derivative is preferably from about 0.1 to about 10% by weight based on the weight of the whole solid components of the image recording layer.

<Plasticizer>

The image recording layer of the invention may contain a plasticizer in order to improve on-machine developability. Examples of the plasticizer include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, and diallyl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylate; phosphoric esters such as tricresyl phosphate and triphenyl phosphate; fatty dibasic acid esters such as diisobutyl adipate, dioctyl adipate, dimethyl sebacate, dibutyl sebacate, dioctyl azelate, and dibutyl maleate; polyglycidyl methacrylate; triethyl citrate; glycerin triacetyl ester, and butyl laurate.

The content of the plasticizer is preferably from about 30 wt % or less based on the weight of the whole solid components of the image recording layer.

<Inorganic Fine Particles>

The image recording layer of the invention may further contain inorganic fine particles in order to improve the strength of the cured film in the image areas and the on-machine developability of the non-image areas.

Examples of the inorganic fine particles include silica, alumina, magnesium oxide, titanium oxide, magnesium carbonate, calcium alginate and mixtures thereof. Even inorganic fine particles unable to convert light to heat can be used for reinforcement of the coating film and improvement of the interfacial adhesion properties by surface roughening.

The average particle size of the inorganic fine particles is preferably from 5 nm to 10 μm, more preferably from 0.5 to 3 μm. When the average particle size is within the above range, the inorganic fine particles can be dispersed stably in the image recording layer, whereby sufficient film strength of the image recording layer can be obtained and a highly hydrophilic non-image areas which are scarcely stained during printing can be obtained.

The inorganic fine particles as described above are easily available as commercially available products such as colloidal silica dispersions.

The content of the inorganic fine particles is preferably 20% by weight or less, more preferably 10% by weight or less, based on the weight of the whole solid components of the image recording layer.

<Low-Molecular Hydrophilic Compound>

The image recording layer of the invention may further contain a hydrophilic low-molecular compound in order to improve the on-machine developability. Examples of the hydrophilic low-molecular compound include water-soluble organic compounds such as glycols, e.g., ethylene glycol, diethylene glycol, triethylene glycol, propylene glycol, dipropylene glycol, and tripropylene glycol; ether derivatives thereof and ester derivatives thereof; polyhydroxy compounds, e.g., glycerin and pentaerythritol; organic amines, e.g., triethanolamine, diethanolamine, and monoethanolamine, and salts thereof; organic sulfonic acids, e.g., toluene-sulfonic acid and benzenesulfonic acid, and salts thereof; organic phosphonic acids, e.g., phenyl phosphonic acid, and salts thereof; and organic carboxylic acids, e.g., tartaric acid, oxalic acid, citric acid, malic acid, lactic acid, gluconic acid, and amino acids, and salts thereof.

<(D) Microcapsules•Microgel>

In the invention, several embodiments may be employed as methods for incorporating, in the image recording layer, the components (A) to (C) and other components which constitute the image recording layer. In one embodiment, the image recording layer is a molecular dispersion type image recording layer obtained by coating a solution in which the components are dissolved in a suitable solvent, as described in JP-A-2002-287334. In another embodiment, the image recording layer is a microcapsule-type image recording layer containing microcapsules which contain some of or all of the components, as described in JP-A-2001-277740 and JP-A-2001-277742. In the microcapsule-type image recording layer, the components may also be contained in the space in the image recording layer, the space being out of the microcapsules. In a preferred embodiment, the microcapsule-type image recording layer contains hydrophobic constituent components within the microcapsules and the the hydrophilic components are contained in the space out of the microcapsules. As a further embodiment, there is illustrated an embodiment wherein the image recording layer contains cross-linked resin particles, i.e., microgel. Such microgel can contain part of the constituent components within, or on the surface, thereof. In particular, an embodiment wherein a polymerizable monomer is allowed to exist on the surface thereof to form a reactive microgel is particularly preferred from the standpoint of image-forming sensitivity and printing durability.

For attaining better on-machine developability, the image recording layer is preferably a microcapsule-type or microgel type image recording layer.

A known method may be employed for encapsulating or microgelling the image recording layer-constituting components.

Examples of the encapsulation method include, though not limitative, a method of utilizing coacervation described in U.S. Pat. Nos. 2,800,457 and 2,800,458; a method of interfacial polymerization described in U.S. Pat. No. 3,287,154, JP-B-38-19574, and JP-B-42-446; a method of precipitating polymers described in U.S. Pat. Nos. 3,418,250 and 3,660, 304; a method of using an isocyanate polyol wall material described in U.S. Pat. No. 3,796,669; a method of using an isocyanate wall material described in U.S. Pat. No. 3,914, 511; a method of using an urea-formaldehyde type or urea-formaldehyde-resorcinol type wall-forming material described in U.S. Pat. Nos. 4,001,140, 4,087,376, and 4,089, 802; a method of using a wall material such as melamine-formaldehyde resin or hydroxy-cellulose described in U.S. Pat. No. 4,025,445; a method of in situ polymerization of monomers described in JP-B-36-9163 and JP-B-51-9079; a method of spray drying described in GB Patent No. 930422 and U.S. Pat. No. 3,111,407; and a method of electrolytic dispersion cooling described in GB Patent Nos. 952807 and 967074.

The microcapsule wall to be used in the invention preferably has 3-dimensional crosslinkages, and is preferably swellable with a solvent. From such a viewpoint, the wall material for the microcapsules is preferably polyurea, polyurethane, polyester, polycarbonate, polyamide, or a mixture thereof, with polyurea and polyurethane being particularly preferred. A compound having a cross-linkable functional group such as an ethylenically unsaturated bond and capable of being introduced into the binder may be introduced into the microcapsule wall.

On the other hand, the microgel may be prepared by a granulation method utilizing interfacial polymerization described in JP-B-38-19574 and JP-B-42-446, or a granulation method utilizing non-aqueous dispersion polymerization described in JP-A-5-61214, but the present invention is not limited to these methods.

As for the method utilizing interfacial polymerization, the above-described known methods for producing a microcapsule may be applied.

The microgel to be preferably used in the invention is a microgel having three-dimensional crosslinkage and being granulated by interfacial polymerization. From this standpoint, the material to be used therefor is preferably polyurea, polyurethane, polyester, polycarbonate, polyamide or a mixture thereof particularly preferably polyurea or polyurethane.

The average particle size of the microcapsule or microgel is preferably from 0.01 to 3.0 µm, more preferably from 0.05 to 2.0 µm, particularly preferably from 0.10 to 1.0 µm. Within this range, good resolution and good aging stability can be obtained.

In addition, the photosensitive composition of the invention may be prepared as a positive-working responsive composition as well as the above-described negative-working responsive composition.

In the case of preparing the positive-working responsive composition, a water-insoluble, aqueous alkaline solution-soluble high molecular compound (H) is further incorporated in addition to the above-described particular cyanine dye (A) to be described hereinafter.

[(H) Water-Insoluble and Alkali-Soluble Resin]

The high molecular compound (H) which can be used in the positive-working photosensitive composition includes homopolymers containing an acidic group in the main chain and/or side chain thereof, copolymers thereof, and mixtures thereof.

Among them, those high molecular compounds which have the acidic groups listed below as (1) to (6) in the main chain and/or side chain thereof are preferred in the point of solubility in an alkaline developing solution and the point of realizing dissolution-inhibiting ability.

(1) A phenol group (—Ar—OH)
(2) A sulfonamido group (—SO$_2$NH—R)
(3) A substituted sulfonamido-based acid group (hereinafter also referred to as an "active imido group") [—SO$_2$NHCOR, —SO$_2$NHSO$_2$R, —CONHSO$_2$R)
(4) A carboxylic acid group (—CO$_2$H)
(5) A sulfonic acid group (—SO$_3$H)
(6) A phosphoric acid group (—OPO$_3$H$_2$)

In the above (1) to (6), Ar represents a divalent aryl linking group which may have a substituent, and R represents a hydrogen atom or a hydrocarbon group which may have a substituent.

Of the aqueous alkaline solution-soluble high molecular compounds having an acidic group selected from (1) to (6) described above, those alkaline water-soluble high molecular compounds are preferred which have (1) a phenol group, (2) a sulfonamide group, or (3) active imido group are preferred. In particular, those aqueous alkaline solution-soluble high molecular polymers which have (1) a phenol group or (2) a sulfonamido group are most preferred from the standpoint of solubility for an alkaline developing solution and the point of ensuring sufficient development latitude and sufficient film strength.

As the aqueous alkaline solution-soluble high molecular compounds having an acidic group selected from (1) to (6), there can be illustrated the following ones.

(1) Examples of the aqueous alkaline solution-soluble high molecular compound having phenol group include: novolak resins such as polycondensation polymers of phenol and formaldehyde, polycondensation polymers of m-cresol and formaldehyde, polycondensation polymers of p-cresol and formaldehyde, polycondensation polymers of m-/p-mixed cresol and formaldehyde, and polycondensation polymers of phenol, cresol (m-, p-, or m-/p-mixture) and formaldehyde; and polycondensation copolymers of pyrogallol and acetone. Further, copolymers obtained by copolymerizing a compound having a phenol group in the side chain thereof can be exemplified. Or, copolymers obtained by copolymerizing a compound having a phenol group in the side chain thereof can be used.

Examples of the compound having a phenol group include acryl amide, methacryl amide, acrylic acid ester, methacrylic acid ester and hydroxy styrene each having a phenol group.

The aqueous alkaline solution-soluble high molecular compound preferably has a weight-average molecular weight of from $5.0 \times 10^2$ to $2.0 \times 10^4$ and a number-average molecular weight of from $2.0 \times 10^2$ to $1.0 \times 10^4$, in the point of image-forming properties. In addition, these high molecular compounds may be used independently or in combination of two or more thereof. In the case of using them in combination, it is also possible to use together a polycondensation polymer of t-butylaldehyde and formaldehyde as described in U.S. Pat. No. 4,123,279, polycondensation polymers of a phenol having as a substituent an alkyl group containing from 3 to 8, such as a polycondensation polymer of octylphenol and formaldehyde, and aqueous alkaline solution-soluble high molecular compounds having a phenol structure having an electron attractive group on the aromatic ring as described in JP-A-2000-241972 previously filed by the inventors.

(2) As aqueous alkaline solution-soluble high molecular compounds having a sulfone amido group, there can be illustrated, for example, polymers that are constituted by a minimum constituent unit as a main component derived from a compound having a sulfone amido group. Examples of such compound include compounds each having, within the molecule thereof, at least one sulfone amido group in which at least one hydrogen atom is bound to a nitrogen atom and at least one polymerizable unsaturated group. Among them, low molecular compounds having within the molecule thereof both an acryloyl group, an allyl group or a vinyloxy group and a substituted or mono-substituted aminosulfonyl group or a substituted sulfonylimino group are preferred and, for example, there are illustrated compounds represented by the following general formulae (H-1) to (H-5).

General formula (H-1)

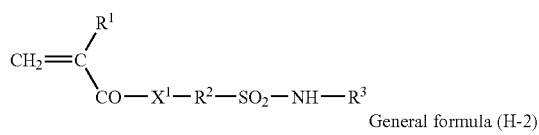

General formula (H-2)

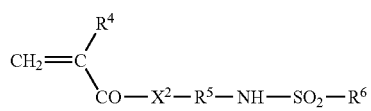

General formula (H-3)

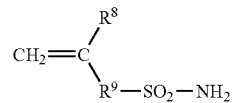

General formula (H-4)

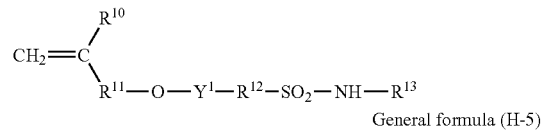

General formula (H-5)

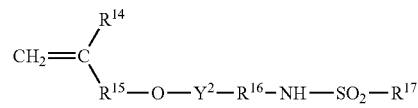

In the above formulae, $X^1$ and $X^2$ each independently represents —O— or —$NR^7$. $R^1$ and $R^4$ each independently represents a hydrogen atom or —$CH_3$. $R^2$, $R^5$, $R^9$, $R^{12}$, and $R^{16}$ each independently represents an alkylene, cycloalkylene, arylene or aralkylene group containing from 1 to 12 carbon atoms which may have a substituent. $R^3$, $R^7$, and $R^{13}$ each independently represents a hydrogen atom or an alkyl, cycloalkyl, aryl or aralkyl group containing from 1 to 12 carbon atoms which may have a substituent. $R^6$ and $R^{17}$ each independently represents an alkyl, cycloalkyl, aryl or $R^8$, $R^{10}$, and $R^{14}$ each independently represents a hydrogen atom or —$CH_3$. $R^{11}$ and $R^{15}$ each independently represents a single bond or an alkylene, cycloalkylene, arylene or aralkylene group containing from 1 to 12 carbon atoms which may have a substituent. $Y^1$ and $Y^2$ each independently represents a single bond or CO.

Of the compounds represented by the general formulae (H-1) to (H-5), m-aminosulfonylphenyl methacrylate, N-(p-aminosulfonylphenyl)methacrylamide, N-(p-aminosulfonylphenyl)acrylamide or the like can be particularly preferably used in the positive-working photosensitive composition in accordance with the invention.

(3) Examples of the aqueous alkaline solution-soluble high molecular compound having an activated imido group include polymers comprising minimum constituting units derived from compounds having an activated imido group as main constituent components. Examples of such compounds include compounds each having both an activated imido group represented by the following structural formula and a polymerizable unsaturated group at least one each within the molecule thereof.

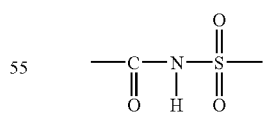

Specifically, N-(p-toluenesulfonyl)methacrylamide and N-(p-toluenesulfonyl)acrylamide can preferably be used.

(4) As the aqueous alkaline solution-soluble high molecular compounds having a carboxylic acid group, there can be illustrated, for example, polymers that are constituted by a minimum constituent unit as a main component derived from a compound having a carboxylic acid group and a polymerizable unsaturated group at least one each within the molecule thereof.

(5) As the aqueous alkaline solution-soluble high molecular compounds having a sulfonic acid group, there can be illustrated, for example, polymers that are constituted by a minimum constituent unit as a main component derived from a compound having a sulfonic acid group and a polymerizable unsaturated group at least one each within the molecule thereof.

(6) As the aqueous alkaline solution-soluble high molecular compounds having a phosphoric acid group, there can be illustrated, for example, polymers that are constituted by a minimum constituent unit as a main component derived from a compound having a phosphoric acid group and a polymerizable unsaturated group at least one each within the molecule thereof.

Regarding the minimum constituent unit constituting the aqueous alkaline solution-soluble high molecular compounds to be used in the positive-working photosensitive composition and having an acidic group that is selected from (1) through (6) described above, there is no need of using only one kind of the minimum constituent unit, but at least two kinds of the minimum constituent units having the same acidic group may be copolymerized to use or at least two kinds of the minimum constituent units having different acidic groups may be copolymerized to use, as well.

In the copolymer, the content of the compound that is copolymerized therein and has an acidic group selected from (1) through (6) is preferably 10 mol % or more, and more preferably 20 mol % or more. When the content is less than 10 mol %, the development latitude improvement effect owing to the addition thereof tends to be insufficient.

In addition, in the case where the alkali-soluble resin is used as a copolymer obtained by copolymerizing the compound, it is also possible to use other compounds not having the acidic groups (1) to (6).

The weight-average molecular weight of the alkali-soluble resin is preferably 500 or more in view of image-forming properties, with 1,000 to 700,000 being more preferred. The number-average molecular weight thereof is preferably 500 or more and, more preferably, from 750 to 650,000. The degree of dispersion (weight-average molecular weight/number-average molecular weight) is preferably in the range of from 1.1 to 10.

The sum of the contents of the alkali-soluble resins in the positive-working photosensitive composition is preferably from 30 to 98% by weight, more preferably from 40 to 95% by weight, based on the weight of the whole solid components of the photosensitive composition. When the contents are within the above-described range, they can provide, when used in an image recording layer of a lithographic printing plate precursor, excellent printing durability of a resulting printing plate, excellent sensitivity and excellent image-forming properties.

In such positive-working photosensitive composition, it is important to use the infrared ray absorbent (A) in order to effectively release the interaction. The sum of the contents of infrared ray absorbents in the interaction-releasing type positive-working photosensitive composition is preferably from 0.01 to 50% by weight, more preferably from 0.1 to 10% by weight, based on the whole solid components of the photosensitive composition. When the contents are within the above-described range, they provide excellent sensitivity and excellent image-forming properties when used in the image forming layer of a lithographic printing plate precursor.

2-2. o-Quinonediazide Compound-Containing System

As an o-quinonediazide compound-containing system, there is illustrated a positive-working photosensitive composition containing as a light-sensitive component, an o-quinonediazide compound as described in JP-A-5-246171 and JP-A-6-230582.

[Other Components]

As other components of such positive-working photosensitive composition, known additives for various image recording materials, which can be recorded by active radiation such as infrared rays when the additives are used in an image recording layer of a lithographic printing plate precursor, can properly be selected to use.

To the positive-working photosensitive composition of the invention can be added, as needed, various additives. For example, when other onium salts, aromatic sulfone compounds, aromatic sulfonic ester compounds or multifunctional amine compounds are added to an image recording layer of a lithographic printing plate precursor, dissolution inhibition ability of the aqueous alkaline solution-soluble high molecular compound into a developing solution can be improved, thus such additives being preferred.

In addition, in order to more improve sensitivity, cyclic acid anhydrides, phenols, and organic acids can be used together.

The contents of the cyclic acid anhydrides, phenols, and organic acids in the photosensitive composition are preferably from 0.05 to 20% by weight, more preferably from 0.1 to 15% by weight, particularly preferably from 0.1 to 10% by weight.

Beside these compounds, epoxy compounds, vinyl ethers and, further, hydroxymethyl group-containing phenol compounds described in IP-A-8-276558, alkoxymethyl group-containing phenol compounds, and cross-linkable compounds having the action of inhibiting dissolution in an alkaline solution and being described in JP-A-11-160860 previously filed by the inventors can properly be added according to the purpose.

In the case of using the photosensitive composition of the invention for a coating solution for forming a recording layer of a lithographic printing plate precursor, various surfactants, siloxane series compounds, and fluorine-containing copolymers can be added to the coating solution in order to expand stability of processing under developing conditions as is the same with the negative-working photosensitive composition. In addition, print-out agents for obtaining a visible image immediately after heating by exposure, and dyes and pigments as image colorants can also be added as is the same with the aforesaid negative-working photosensitive composition (or recording layer).

[Lithographic Printing Plate Precursor]

The lithographic printing plate precursor of the invention comprises a support having provided thereon an image recording layer containing the above-described photosensitive composition. Elements constituting the lithographic printing plate precursor, such as an image recording layer and a support, will be described hereinafter.

<Image Recording Layer>

The image recording layer of the invention is formed by dispersing or dissolving the necessary components for the above-described photosensitive composition in a solvent to prepare a coating solution and then applying the coating solution, followed by drying. Examples of the solvent to be used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water. These solvents may be used independently or as a mixture thereof. The concentration of the solid components in the coating solution is preferably from 1 to 50% by weight.

With respect to the image recording layer of the invention, plural coating solutions each containing the same or different components described above and dissolved or dispersed in the same or different solvents may be prepared, then the coating solutions may be applied by the repetition of coating and drying to form the image recording layer.

The amount (in terms of the amount of solid components) of the image recording layer, which is formed on the support by coating and drying, may be changed in accordance with the intended use, and is preferably from 0.3 to 3.0 g/m$^2$ in general. When the amount is within this range, an image recording layer with good sensitivity and excellent film properties can be obtained.

As coating methods, various methods may be employed. Examples thereof include bar coating, spin coating, spray coating, curtain coating, dip coating, air knife coating, blade coating, and roll coating.

<Support>

The support to be used in the lithographic printing plate precursor of the invention is not particularly limited insofar as it is a dimensionally stable plate. Examples thereof include paper, a plastic laminated paper (e.g., polyethylene laminated paper, polypropylene laminated paper, polystyrene laminated paper, etc.), a plate of a metal (e.g., aluminum, zinc, copper, etc.), a film of a plastic (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or plastic film on which any of the above-described metals is laminated or vapor-deposited. The support is preferably a polyester film or an aluminum plate. The aluminum plate is particularly preferred because it is excellent in dimensional stability and relatively inexpensive.

The aluminum plate is a pure aluminum plate, an alloy plate containing aluminum as the main component and trace amounts of heteroelements, or a plastic laminated aluminum or aluminum alloy thin film. Examples of the heteroelements contained in the aluminum alloy include silicon, iron, manganese, copper, magnesium, chromium, zinc, bismuth, nickel, and titanium. The content of the heteroelements in the alloy is preferably 10% by weight or less. Although a pure aluminum plate is preferred, production of absolutely pure aluminum is difficult from the viewpoint of refining techniques. Therefore, the aluminum plate to be used in the invention may be an aluminum plate containing trace amounts of heteroelements. The composition of the aluminum plate is not limited, and any aluminum plates made of known and conventionally used materials can be used in accordance with the necessity.

The thickness of the support is preferably from 0.1 to 0.6 mm, more preferably from 0.15 to 0.4 mm, still more preferably from 0.2 to 0.3 mm.

It is preferred to subject the aluminum plate to a surface treatment such as a roughening treatment or an anodizing treatment prior to use. By the surface treatment, hydrophilicity can be easily improved and the adhesion between the image recording layer and the support can be easily secured. Before the surface of the aluminum plate is roughened, the aluminum plate may be subjected to a decreasing treatment with, for example, a surfactant, an organic solvent or an aqueous alkaline solution so as to remove the rolling oil, as needed.

Various methods can be employed for the roughening treatment of the surface of the aluminum plate. For example, there are illustrated a mechanical surface roughening treatment, an electrochemical surface roughening treatment (roughening treatment of electrochemically dissolving the surface), and a chemical surface roughening treatment (roughening treatment of chemically selectively dissolving the surface).

As the method of the mechanical surface roughening treatment, there can be employed a known method such as a ball grinding method, a brush grinding method, a blast grinding method, or a buff grinding method.

As the method of the electrochemical roughening method, there are illustrated, for example, a method of roughening the surface in an electrolytic solution containing hydrochloric acid or nitric acid by applying alternating current or direct current. In addition, there is illustrated a method of using a mixed acid as described in JP-A-S4-63902.

The aluminum plate whose surface has been roughened is, as needed, subjected to an alkali etching treatment with an aqueous solution of potassium hydroxide, sodium hydroxide, or the like, then to a neutralization treatment, then optionally to an anodizing treatment which improves the abrasion resistance.

As the electrolyte to be used in the anodizing treatment of the aluminum plate, various electrolytes capable of forming a porous oxide film can be used. Generally, sulfuric acid, hydrochloric acid, oxalic acid, chromic acid, or a mixed acid thereof is used. The concentration of the electrolyte is determined properly in accordance with the kind of the electrolyte.

The conditions for the anodizing treatment may be variously changed depending on the electrolyte used and cannot be described in a general manner. Usually, the concentration of the electrolyte is preferably from 1 to 80% by weight, the liquid temperature is preferably from 5 to 70° C., the current density is preferably from 5 to 60 A/dm$^2$, the voltage is preferably from 1 to 100 V, and the electrolysis time is preferably from 10 seconds to 5 minutes. The amount of the anodized film to be formed is preferably from 1.0 to 5.0 g/m$^2$, more preferably from 1.5 to 4.0 g/m$^2$. When the amount of the anodized film is within this range, good printing durability and excellent flaw resistance of non-image areas of the lithographic printing plate can be obtained.

After the anodization treatment, the surface of the aluminum plate may be subjected to hydrophilicity-imparting treatment, as needed. As the hydrophilicity-imparting treatment, there is illustrated a method using an alkali metal silicate as described in U.S. Pat. Nos. 2,714,066, 3,181,461, 3,280,734, and 3,902,734. In the method, a support is treated by immerison or electrolysis in an aqueous sodium silicate solution. Other methods include a method wherein the surface is treated with potassium fluorozirconate as described in JP-B-36-22063 and a method wherein the surface is treated with polyvinylphosphonic acid as described in U.S. Pat. Nos. 3,276,868, 4,153,461, and 4,689,272.

The center-line average roughness of the support is preferably from 0.10 to 1.2 μm. Within this range, good adhesion to the image recording layer, good printing durability, and good stain resistance can be obtained.

In addition, the color density of the support is preferably from 0.15 to 0.65 in terms of reflection density. Within this range, halation upon imagewise exposure can be prevented to thereby provide good image-forming properties and, in addition, good plate-inspecting properties can be obtained after development processing.

<Back Coat Layer>

A back coat layer may be provided, as needed, on the back side of the support after subjecting the support to the surface treatment or after formation of an undercoat layer.

Examples of such back coat layer include a coating layer comprising an organic high molecular compound as described in JP-A-5-45885, and a coating layer comprising a metal oxide obtained by hydrolysis and polycondensation of an organic or inorganic metal compound as described in JP-A-6-35174. Among them, use of an alkoxy compound of silicon such as $Si(OH_3)_4$, $Si(OC_2H_5)_4$, $Si(OC_3H_7)_4$ or $Si(OC_4H_9)_4$ is preferred because of their inexpensiveness and high availability.

<Undercoat Layer>

An undercoat layer may be provided, as needed, on the aluminum plate between the image recording layer and the support. The undercoat layer serves to facilitate delamination of the image recording layer from the support in unexposed areas. Hence, with an on-machine-developable lithographic printing plate precursor, there can be obtained an advantage of improving on-machine developability. In addition, in the case of infrared laser exposure, the undercoat layer functions as a heat-insulating layer, which provides the advantage that heat generated by exposure does not diffuse into the support but can effectively be utilized, thus sensitivity being enhanced.

Specific preferred examples of compounds for the undercoat layer (undercoating compounds) include silane coupling agents each having an addition-polymerizable ethylenically double-bonded reactive group as described in JP-A-10-282679; and phosphorus compounds each having an ethylenically double-bonded reactive group as described in JP-A-2-304441.

The most preferred undercoating compounds include high molecular resins obtained by copolymerizing a monomer having an adsorptive group, a monomer having a hydrophilic group, and a monomer having a cross-linking group.

A necessary component of the high molecular resin for the undercoat layer is an adsorptive group to the surface of the hydrophilic support. Presence or absence of the adsorbing properties to the surface of the hydrophilic support can be judged by, for example, the following method.

A test compound is dissolved in a readily soluble solvent to prepare a coating solutions and the resulting coating solution is coated on a support in a dry amount of 30 mg/m², followed by drying. Subsequently, the support coated with the test compound is well washed with a readily soluble solvent, and the residual amount of the test compound not having been washed away is measured to calculate the adsorption amount of the compound on the support. Here, measurement of the residual amount of the test compound may be conducted by directly determining the residual amount of the compound, or by determining the amount of the test compound dissolved in the washing solution. Determination of the compound can be performed by, for example, fluorescent X-ray measurement, reflective spectral absorption measurement, or liquid chromatography. Compounds adsorptive to the support are compounds which remain in an amount of 1 mg/m² or more even after being subjected to the above-described washing treatment.

The adsorptive group to the surface of the hydrophilic support is a functional group which can form chemical bond (e.g., ionic bond, hydrogen bond, coordination bond or bond based on intermolecular force) with a substance (e.g., metal or metal oxide) or a functional group (e.g., hydroxyl group) existing on the surface of the hydrophilic support. The adsorptive group is preferably an acid group or a cation group.

The acid group has an acid dissociation constant (pKa) of preferably 7 or less. Examples of the acid group include a phenolic hydroxyl group, a carboxyl group, —$SO_3H$, —$OSO_3H$, —$PO_3H_2$, —$OPO_3H_2$, —$CONHSO_2$—, —$SO_2NHSO_2$—, and —$COCH_2COCH_3$. Among them, —$OPO_3H_2$ and —$PO_3H_2$ are particularly preferred. In addition, these acid groups may be in the metal salt form thereof.

The cation group is preferably an onium group. Examples of the onium group include an ammonium group, a phosphonium group, an arsonium group, a stibonium group, an oxonium group, a sulfonium group, an oxonium group, a sulfonium group, a selenonium group, a stannonium group, and an iodonium group. An ammonium group, a phosphonium group, and a sulfonium group are preferred, an ammonium group and a phosphonium group are more preferred, and an ammonium group is most preferred.

As especially preferred examples of monomers having an adsorptive group, the compounds represented by the following formula (I) or (II) are illustrated.

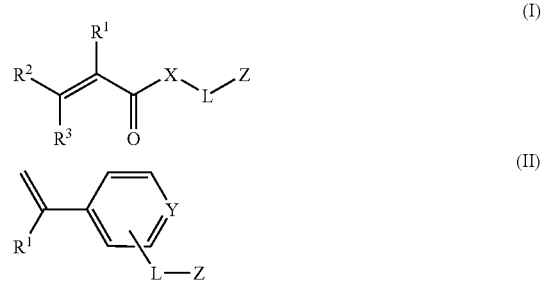

In the above formulae, $R^1$, $R^2$, and $R^3$ each independently represents a hydrogen atom, a halogen atom, or an alkyl group containing from 1 to 6 carbon atoms. $R^1$, $R^2$, and $R^3$ each preferably represents independently a hydrogen atom or an alkyl group containing from 1 to 6 carbon atoms, more preferably represents a hydrogen atom or an alkyl group containing from 1 to 3 carbon atoms, and most preferably a hydrogen atom or a methyl group. $R^2$ and $R^3$ each especially preferably represents a hydrogen atom. Z represents an adsorptive functional group to the surface of the hydrophilic support.

In formula (I), X represents an oxygen atom (—O—) or an imino group (—NH—), and X more preferably represents an oxygen atom. In formula (I), L represents a divalent linking group. L preferably represents a divalent aliphatic group (an alkylene group, a substituted alkylene group, an alkenylene group, a substituted alkenylene group, an alkynylene group, or a substituted alkynylene group), a divalent aromatic group (an arylene group or a substituted arylene group), or a divalent heterocyclic group, or combinations of these divalent groups with an oxygen atom (—O—), a sulfur atom (—S—), imino (—NH—), substituted imino (—NR—, wherein R represents an aliphatic group, an aromatic group or a heterocyclic group), or carbonyl (—CO—).

The aliphatic group may have a cyclic structure or a branched structure. The number of carbon atoms of the aliphatic group is preferably from 1 to 20, more preferably from 1 to 15, and most preferably from 1 to 10. As the aliphatic group, a saturated aliphatic group is preferred to an unsaturated aliphatic group. The aliphatic group may have a substituent. Examples of the substituent include a halogen atom, a hydroxyl group, an aromatic group, and a heterocyclic group.

The number of carbon atoms of the aromatic group is preferably from 6 to 20, more preferably from 6 to 15, and most preferably from 6 to 10. The aromatic group may have a substituent. Examples of the substituent include a halogen atom, a hydroxyl group, an aliphatic group, an aromatic group, and a heterocyclic group.

It is preferred for the heterocyclic group to have a 5- or 6-membered ring as a hetero ring. Other hetero ring, an aliphatic ring or an aromatic ring may be condensed with the hetero ring. The heterocyclic group may have a substituent. Examples of the substituent include a halogen atom, a hydroxyl group, an oxo group (=O), a thioxo group (=S), an imino group (=NH), a substituted imino group (=N—R, wherein R represents an aliphatic group, an aromatic group or a heterocyclic group), an aliphatic group, an aromatic group, and a heterocyclic group.

L is preferably a divalent linking group containing a plurality of polyoxyalkylene structures. The polyoxyalkylene structures are more preferably polyoxy-ethylene structures. In other words, it is preferred for L to contain —(OCH$_2$CH$_2$)n- (n is an integer of 2 or more).

In formula (II), Y represents a carbon atom or a nitrogen atom. In the case where Y is a nitrogen atom and L is linked onto Y to form a quaternary pyridinium group, the group itself shows adsorptivity, so that Z is not essential and may be a hydrogen atom. L represents the same divalent linking group as with formula (1) or represents a single bond.

The adsorptive functional group is as described hereinbefore.

Typical examples of the compounds represented by the following formula (I) or (II) are shown below.

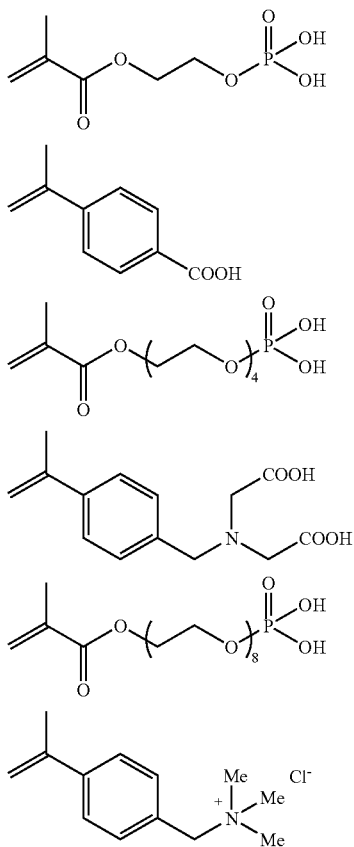

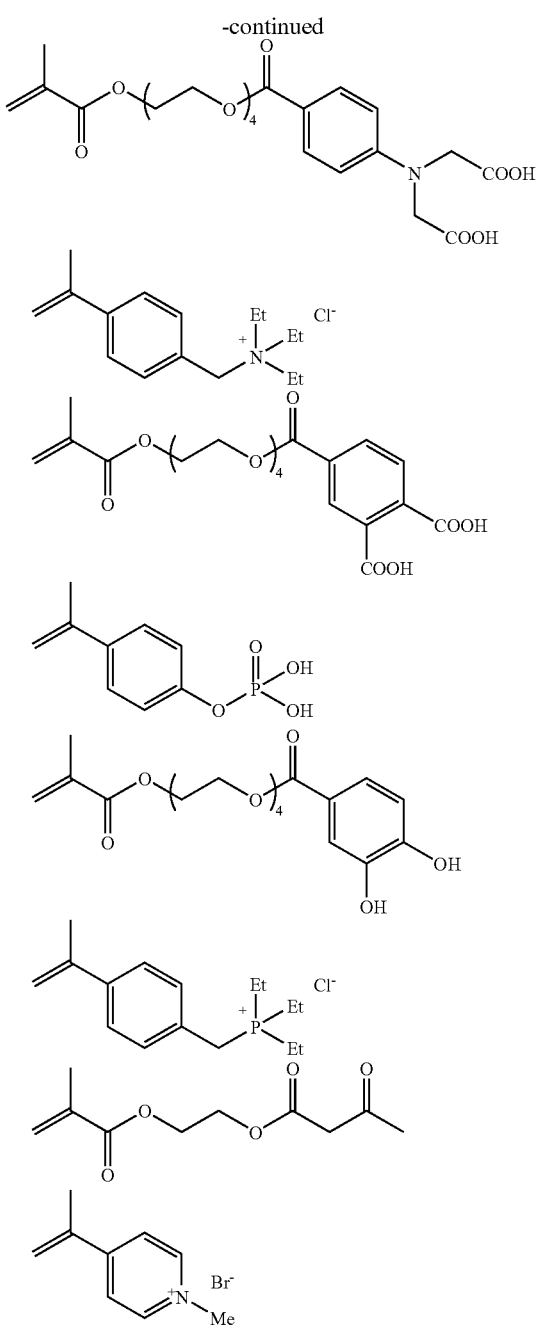

As the hydrophilic groups of high molecular resins for undercoating that can be used in the invention, there are preferably illustrated, for example, a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, and a phosphoric acid group. Among them, monomers having a sulfonic acid group showing high hydrophilicity are preferred. As the specific examples of the monomers having a sulfonic acid group, there are illustrated sodium salts and amine salts of methallyloxybenzenesulfonic acid, allyloxybenzenesulfonic acid, allylsulfonic acid, vinylsulfonic acid, p-styrenesulfonic acid, methallylsulfonic acid, acrylamido-t-butylsulfonic acid, 2-acrylamido-2-methylpropanesulfonic acid, and (3-acryloyloxypropyl)butylsulfonic acid. Of these monomers, in view of a hydrophilic performance and handling property in synthesis, sodium salt of 2-acrylamido-2-methylpropanesulfonic acid is preferred.

The high molecular resins for the undercoat layer in the invention preferably have a crosslinking group. Adhesion of the undercoat layer to image areas can be heightened on account of the crosslinking group. Crosslinking properties can be imparted to a polymer resin for the undercoat layer, by introducing a crosslinking functional group such as an ethylenically unsaturated bond to the side chain of the polymer, or by forming a salt structure using a compound having both a substituent having a counter charge of the polar substituent of the high molecular resin and an ethylenically unsaturated bond.

Examples of polymers having an ethylenically unsaturated bond in the side chain of the molecule include ester or amide polymers of acrylic acid or methacrylic acid, wherein the residue of the ester or amide (R of —COOR or —CONHR) has an ethylenically unsaturated bond.

Examples of the residues having an ethylenically unsaturated bond (the above-described R) include —$(CH_2)_n$CR$_1$=CR$_2$R$_3$, —$(CH_2O)_n$CH$_2$CR$_1$=CR$_2$R$_3$, —$(CH_2CH_2O)_n$CH$_2$CR$_1$=CR$_2$R$_3$, —$(CH_2)_n$NH—CO—O—CH$_2$CR$_1$=CR$_2$R$_3$, —$(CH_2)_n$—O—CO—CR$_1$=CR$_2$R$_3$, and —$(CH_2CH_2O)_2$—X (in the formulae, R$_1$, R$_2$, and R$_3$ each represents a hydrogen atom, a halogen atom, an alkyl group containing from 1 to 20 carbon atoms, an aryl group, an alkoxyl group or an aryloxy group, and R$_1$ and R$_2$ or R$_3$ may be connected to each other to form a ring, n represents an integer of from 1 to 10, and X represents a dicyclopentadienyl residue).

Specific examples of the ester residues include —CH$_2$CH=CH$_2$ (described in JP-B-7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$NHCOO—CH$_2$CH=CH$_2$, and —CH$_2$CH$_2$O—X (wherein X represents a dicyclopentadienyl residue).

Specific examples of the amido residues include —CH$_2$CH=CH$_2$, —CH$_2$CH$_2$O—Y (wherein Y represents a cyclohexene residue), and —CH$_2$CH$_2$OCO—CH=CH$_2$.

As the monomers having a crosslinking group for the high molecular resins for the undercoat layer, the above-described esters or amides of acrylic acid or methacrylic acid having a crosslinking group are preferred.

The content of crosslinkable groups in the high molecular resin for the undercoat layer (the content of radical polymerizable unsaturated double bonds measured by the iodometric titration method) is preferably from 0.1 to 10.0 mmol, more preferably from 1.0 to 7.0 mmol, most preferably from 2.0 to 5.5 mmol, per g of the polymer resin. Within this range, good sensitivity and staining resistance, and good storage stability can be obtained.

The high molecular resins for the undercoat layer have a weight-average molecular weight of preferably 5,000 or more, more preferably from 10,000 to 300,000, and a number-average molecular weight of preferably 1,000 or more, more preferably from 2,000 to 250,000. The degree of polydispersion (weight-average molecular weight/number-average molecular weight) is preferably from 1.1 to 10.

The high molecular resin for the undercoat layer may be any of a random polymer, a block polymer and a graft polymer, but is preferably a random polymer.

The high molecular resins for the undercoat layer may be used alone or as a mixture of two or more thereof. A coating solution for forming the undercoat layer is obtained by dissolving the high molecular resin for the undercoat layer in an organic solvent (e.g., methanol, ethanol, acetone, or methyl ethyl ketone) and/or water. An infrared ray absorbent may be incorporated in the coating solution for forming the undercoat layer.

As methods for coating the coating solution for forming the undercoat layer on a support, various known methods can be employed. Examples thereof include a bar coater coating method, a spin coating method, a spray coating method, a curtain coating method, a dip coating method, an air-knife coating method, a blade coating method, and a roll coating method.

The coating amount of the undercoat layer (solid components) is preferably from 0.1 to 100 mg/m$^2$, more preferably from 1 to 30 mg/m$^2$.

<Protective Layer>

In the case where the lithographic printing plate precursor of the invention has an image recording layer using a negative-working photosensitive composition, a protective layer (an overcoat layer) may be provided, as needed, on the image recording layer for the purpose of giving oxygen-barrier properties, preventing generation of scratches on the image recording layer, and preventing ablation at the time of exposure with high intensity laser.

Exposure process of the lithographic printing plate is generally carried out in the air. Low molecular compounds such as oxygen and basic substances present in the air can inhibit the image forming reaction that occurs in the image recording layer by the exposure process. The protective layer prevents the low molecular compounds such as oxygen and basic substances from mixing into the image recording layer and, as a result, prevents inhibition of the image forming reaction in the air. Accordingly, the characteristics required of the protective layer are to reduce the permeability of the low molecular compounds such as oxygen, to have good transmittance of light used for exposure, to be excellent in adhesion with the image recording layer, and to be capable of being eliminated easily in the on-machine development processing after exposure. Overcoat layers having such characteristics are described in, e.g., U.S. Pat. No. 3,458,311 and JP-B-55-49729.

As the materials for use in the protective layer, any of water-soluble polymers and water-insoluble polymers can be arbitrarily selected to use. Specific examples thereof include water-soluble polymers, e.g., polyvinyl alcohol, modified polyvinyl alcohol, polyvinylpyrrolidone, polyvinylimidazole, polyacrylic acid, polyacrylamide, a partial saponification product of polyvinyl acetate, ethylene-vinyl alcohol copolymers, water-soluble cellulose derivatives, gelatin, starch derivatives, and gum arabic, and polymers, e.g., polyvinylidene chloride, poly(meth)acrylonitrile, polysulfone, polyvinyl chloride, polyethylene, polycarbonate, polystyrene, polyamide, and cellophane. These polymers can also be used in combination of two or more thereof, as needed.

Among the above-described materials, water-soluble high molecular compounds excellent in crystallizability are comparatively useful materials and, specifically, polyvinyl alcohol, polyvinylpyrrolidone, polyvinylimidazole, water-soluble acrylic resins, e.g., polyacrylic acid, gelatin, and gum arabic, etc. are preferred and, from the standpoints of being capable of being coated using water as a solvent and capable of being easily removed with a dampening water upon printing, polyvinyl alcohol, polyvinylpyrrolidone, and polyvinylimidazole are preferred. Of these polymers, polyvinyl alcohol (PVA) gives the best results with respect to fundamental characteristics such as oxygen-barrier properties and removability by development.

Polyvinyl alcohols that can be used for the protective layer may be partially substituted with ester, ether or acetal so long as they contain a substantial amount of unsubstituted vinyl alcohol units having necessary water solubility. A part of the polyvinyl alcohols may also contain other copolymerizable components. For example, polyvinyl alcohols of various polymerization degrees randomly having a variety of hydrophilic modified sites such as anion-modified site modified with an anion, e.g., a carboxyl group or a sulfo group, a cation-modified site modified with a cation, e.g., an amino group or an ammonium group, a silanol-modified site, a thiol-modified site, etc.; and polyvinyl alcohols of various polymerization degrees having at polymer chain terminals a variety of modified sites such as the aforesaid anion-modified site, the aforesaid cation-modified site, silanol-modified site, thiol-modified site and, further, an alkoxyl-modified site, a sulfide-modified site, sites where vinyl alcohol is modified with various organic acids, ester-modified sites of the above anion-modified site with alcohols, etc., an epoxy-modified site, etc., are also preferably used.

These modified polyvinyl alcohols are preferably compounds hydrolyzed to a degree of from 71 to 100 mol % and having polymerization degree in the range of from 300 to 2,400. Specific examples thereof include PVA-105, PVA-110, PVA-117, PVA-117H, PVA-120, PVA-124, PVA-124H, PVA-CS, PVA-CST, PVA-UC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (manufactured by Kuraray Co., Ltd.). Further, as modified polyvinyl alcohols, there are illustrated KL-318, KL-118, KM-618, KM-118, and SK-5102 each having an anion-modified site, C-318, C-118, and CM-318 having a cation-modified site, M-205 and M-115 having a terminal thiol-modified site, MP-103, MP-203, MP-102, and MP-202 having a terminal sulfide-modified site, HL-12E and HL-1203 having a modified site of ester with higher fatty acid at terminals, and R-1130, R-2105, and R-2130 having a reactive silane-modified site.

It is also preferred that the protective layer contains a layered compound. The layered compound is a particle in the thin tabular shape and, for example, a mica group, such as natural mica and synthetic mica represented by the following formula,

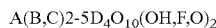

(wherein A represents any of Li, K, Na, Ca, Mg, and an organic cation, B and C represent any of Fe(II), Fe(III), Mn, Al, Mg, and V, and D represents Si or Al), and talc represented by formula $3MgO.4SiO.H_2O$, taeniolite, montmorillonite, saponite, hectorite, and zirconium phosphate are illustrated.

Examples of natural micas include muscovite, paragonite, phlogopite, biotite, and lepidolite. Examples of synthetic micas include non-swellable micas, e.g., fluorine phlogopite $KMg_3(AlSi_3O_{10})F_2$ and potassium tetrasilicate mica $KMg_{2.5}(Si_4O_{10})F_2$, and swellable micas, for example, Na tetrasilicic mica $NaMg_{2.5}(Si_4O_{10})F_2$, Na or Li taeniolite $(Na,Li)Mg_2Li(Si_4O_{10})F_2$, and montmorillonite series Na or Li hectorite $(Na,Li)1/8Mg_2/5Li_1/8(Si_4O_{10})F_2$. Synthetic smectites are also useful.

Of these layered compounds described above, fluorine-containing swellable micas, which are synthetic layered compounds, are especially useful. That is, swellable clay minerals, e.g., montmorillonite, saponite, hectorite, and bentonite have a layered structure comprising unit crystal lattice layers having a thickness of from about 10 to about 15 Å, and metal atom substitution within the lattice is extremely great as compared with other clay minerals. As a result, there is an insufficient quantity of positive electric charge in the lattice layers, and cations such as $Li^+$, $Na^+$, $Ca^{2+}$, and $Mg^{2+}$, and organic cations (e.g., amine salt, quaternary ammonium salt, phosphonium salt, and sulfonium salt) are adsorbed between the layers to compensate for the insufficiency. These layered compounds swell with water. When shear is applied in the swollen state, the lattices easily cleave and form a stable sol in water. Bentonite and swellable synthetic micas have the marked tendency.

In connection with the shape of the layered compounds, compounds each having a smaller thickness is better from the viewpoint of the control of diffusion and, regarding the plane size, compounds with a bigger plane size is better so long as the smoothness of the coated surface and the transmission of active rays are not hindered. Accordingly, the aspect ratio of layered compounds is preferably 20 or more, more preferably 100 or more, and particularly preferably 200 or higher. The aspect ratio is the ratio of the thickness to the longer diameter of a particle, and this can be measured, for example, from the projection drawing of the microphotograph of a particle. The greater the aspect ratio, the greater is the effect obtained.

The average particle size of the particle of layered compounds is from 1 to 20 μm, preferably from 1 to 10 μm, and particularly preferably from 2 to 5 μm. When the particle size is smaller than 1 μm, the control of permeation of oxygen and moisture becomes insufficient, so that sufficient effect cannot be exhibited. On the other hand, when the particle size is larger than 20 μm, dispersion stability in a coating solution becomes insufficient, so that stable coating cannot be performed. The average thickness of the particles is 0.1 μm or less, preferably 0.05 μm or less, and particularly preferably 0.01 μm or less. For example, of the inorganic layered compounds, swellable synthetic mica, which is a representative compound, has a thickness of from 1 to 50 nm, and a plane size of from about 1 to about 20 μm.

When the particles of inorganic layered compounds having such a high aspect ratio are contained in the protective layer, the coated film strength is improved and the permeation of oxygen and moisture can be effectively prevented, and hence the deterioration of the protective layer due to deformation and the like can be prevented, Therefore, even when the lithographic printing plate precursor is stored under a high moisture condition for a long period of time, the lithographic printing plate precursor is free from the deterioration of image-forming properties due to the change in moisture, and excellent storage stability can be ensured.

The content of the inorganic layered compound contained in the protective layer is preferably in the range of from 5/1 to 1/100 in terms of weight ratio to the amount of the binder used in the protective layer. Even when a plurality of inorganic layered compounds are used in combination, it is preferred that the total content of these inorganic layered compounds be within the above-described weight ratio.

In the case of using the above-described inorganic layered compound in the protective layer, it is preferred to add a phosphonium compound to the image recording layer and/or the protective layer for the purpose of improving inking properties. As the phosphonium compound, phosphonium compounds represented by the following general formulae (10) and (11) are preferable. Among them, a phosphonium compound represented by the general formula (10) is preferable.

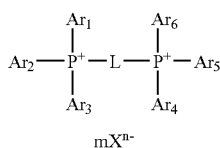
(10)

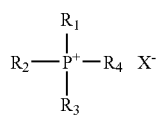
(11)

In the general formula (10), $Ar_1$ to $Ar_6$ each independently represents an aryl group or a heterocyclic group, L represents a divalent linking group, X represents an n-valent counter anion, n represents an integer of from 1 to 3, and m represents a number satisfying $n \times m = 2$. Here, preferred examples of the aryl group include a phenyl group, a naphthyl group, a tolyl group, a xylyl group, a fluorophenyl group, a chlorophenyl group, a bromophenyl group, a methoxyphenyl group, an ethoxyphenyl group, a dimethoxyphenyl group, a methoxycarbonylphenyl group, and a dimethylaminophenyl group. Examples of the heterocyclic group include a pyridyl group, a quinolyl group, a pyrimidinyl group, a thienyl group, and a furyl group.

L represents a divalent-linking group containing preferably from 6 to 15 carbon atoms, more preferably from 6 to 12 carbon atoms.

$X^-$ represents a counter anion. Preferred examples thereof include a halide anion such as $Cl^-$, $Br^-$ or $I^-$, a sulfonate anion, a carboxylate anion, a sulfuric ester anion, $PF_6^-$, $BF_4^-$, and a perchlorate anion. Of these, a halide anion such as $Cl^-$, $Br^-$ or $I^-$, a sulfonate anion, and a carboxylate anion are particularly preferred.

Specific examples of the phosphonium salts represented by the above general formula (10), which can be used in the invention, are shown below.

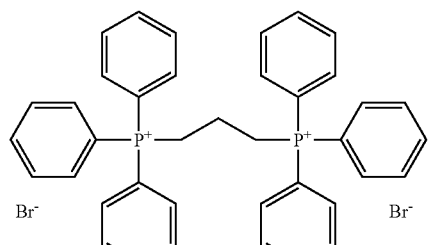

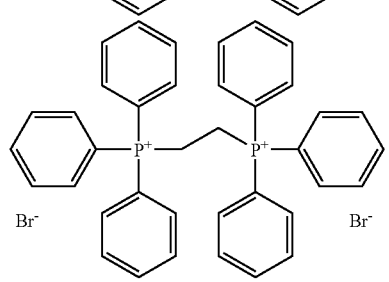

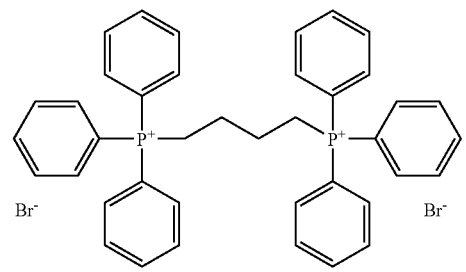

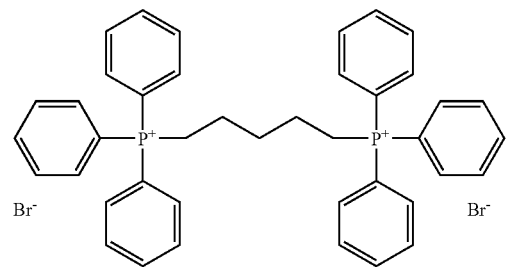

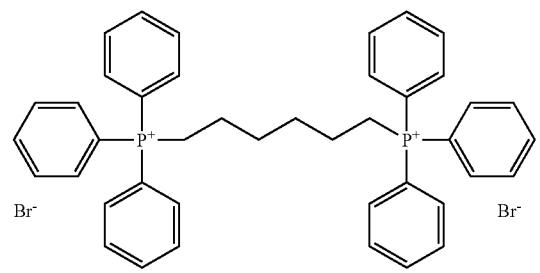

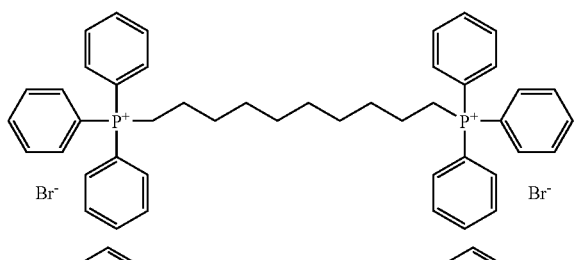

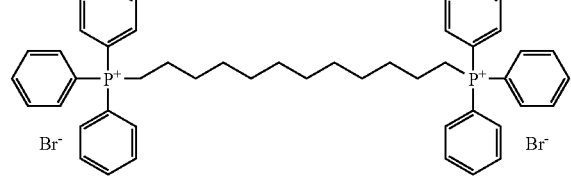

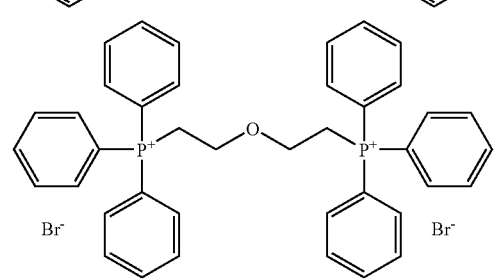

85
-continued
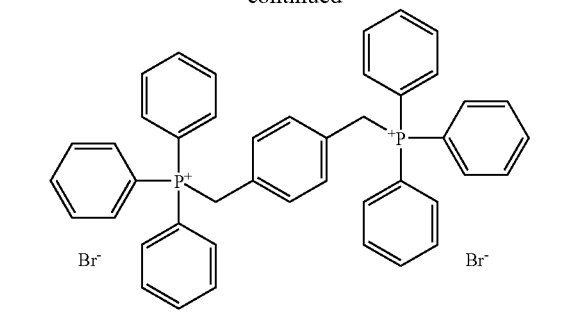
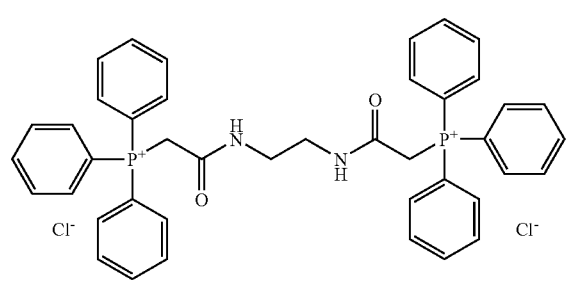
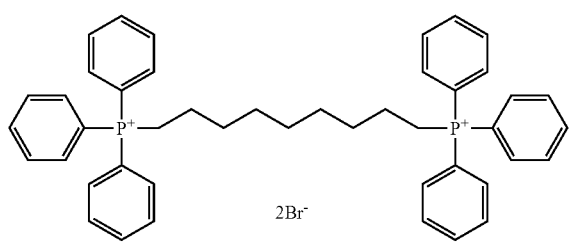
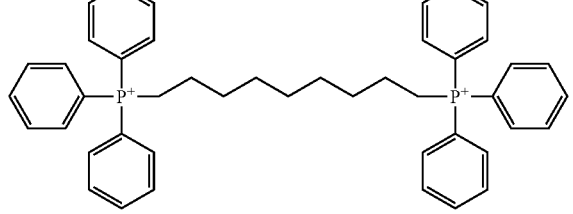
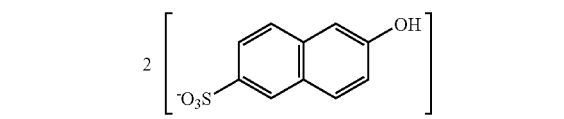
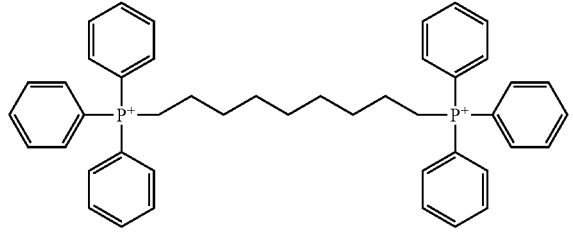
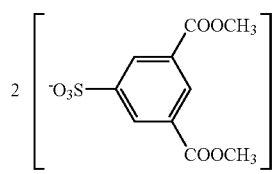
86
-continued
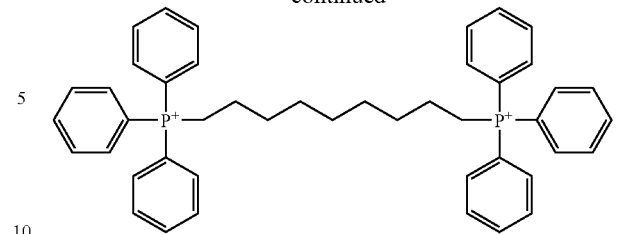
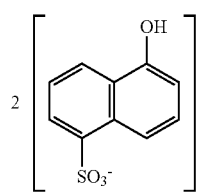
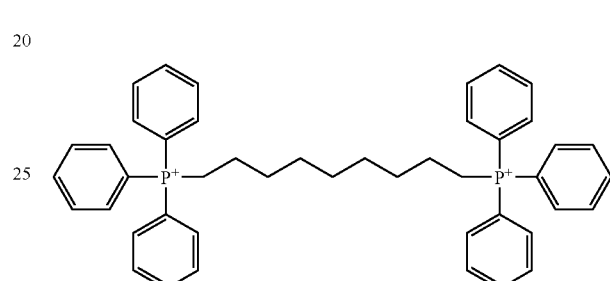
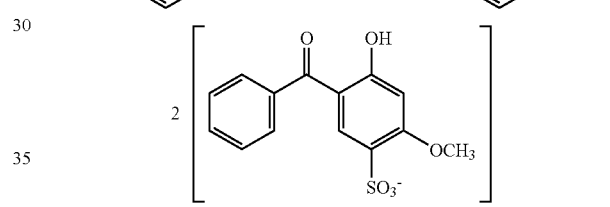
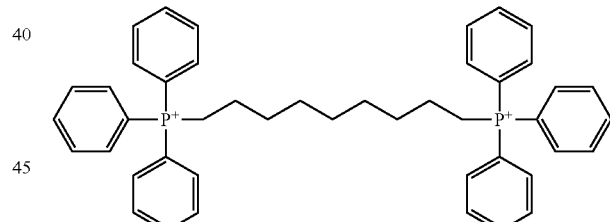
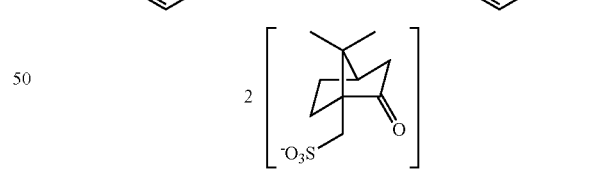
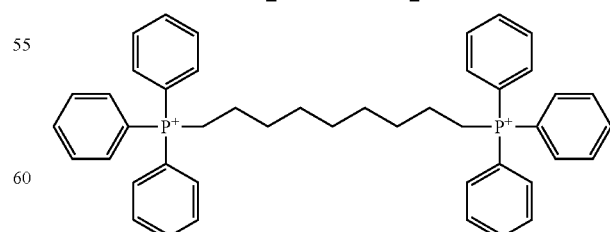
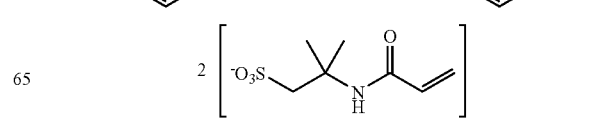

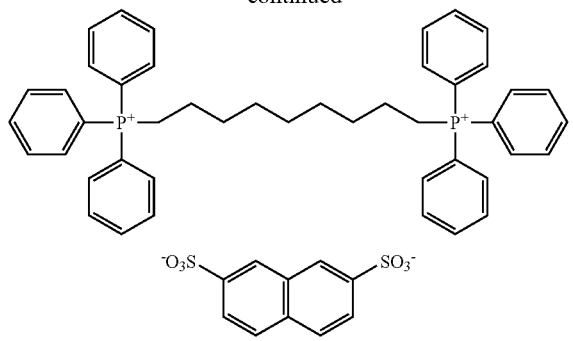
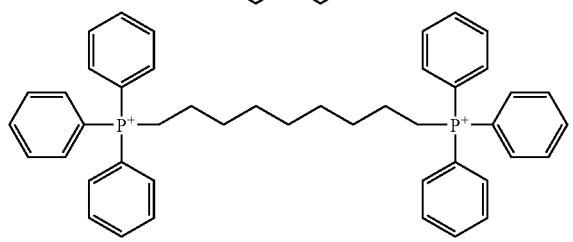
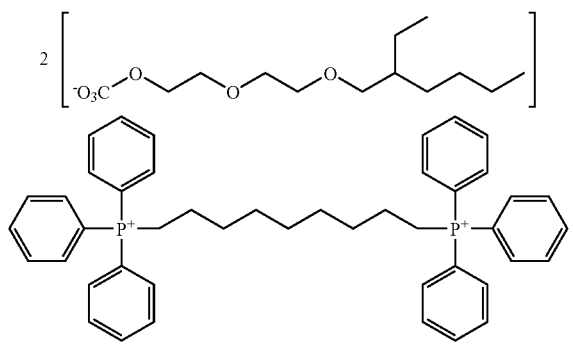
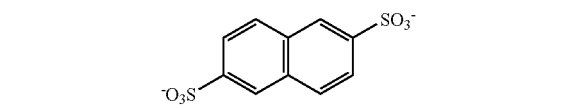

In the general formula (11), $R_1$ to $R_4$ each independently represents an alkyl group, an alkenyl group, an alkynyl group, a cycloalkyl group, an alkoxy group, an aryl group, an aryloxy group, an alkylthio group or a heterocyclic group, which may have a substituent, or a hydrogen atom. At least two of $R_1$ to $R_4$ may be connected to each other to form a ring. $X^-$ represents a counter anion.

Here, when $R_1$ to $R_4$ each represents an alkyl group, an alkoxy group or an alkylthio group, the carbon number thereof is usually from 1 to 20 and, when $R_1$ to $R_4$ each represents an alkenyl group or an alkynyl group, the carbon number thereof is usually from 2 to 15 and, when $R_1$ to $R_4$ each represents a cycloalkyl, the carbon number thereof is usually from 3 to 8. Examples of the aryl group include a phenyl group and a naphthyl group, examples of the aryloxy group include a phenoxy group and a naphthyloxy group, examples of the arylthio group include a phenylthio group, and examples of the heterocyclic group include a furyl group and a thienyl group. Examples of the substituent which these groups may have include an alkyl group, an alkenyl group, an alkynyl group, a cycloalkyl group, an alkoxy group, an alkoxycarbonyl group, an acyl group, an alkylthio group, an aryl group, an aryloxy group, an arylthio group, a sulfino group, a sulfo group, a phosphino group, a phosphoryl group, an amino group, a nitro group, a cyano group, a hydroxyl group, and a halogen atom. Additionally, these substituents may further have a substituent.

Examples of the anion represented by $X^-$ include a halide ion such as $Cl^-$, $Br^-$ or $I^-$, an inorganic acid anion such as $ClO_4^-$, $PF_6^-$ or $SO_4^{-2}$ an organic carbocylic acid anion, and an organic sulfonic acid anion. Examples of the organic group of the organic carboxylic acid anion and the organic sulfonic acid anion include methyl, ethyl, propyl, butyl, phenyl, methoxyphenyl, naphthyl, fluorophenyl, difluorophenyl, pentafluorophenyl, thienyl, and pyrrolyl. Of these, $Cl^-$, $Br^-$, $I^-$, $ClO_4^-$ and $PF_6^-$ are preferred. Specific examples of the phosphonium compounds preferred in the invention are shown below.

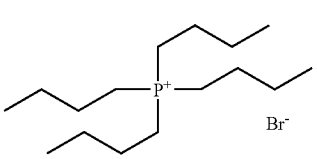
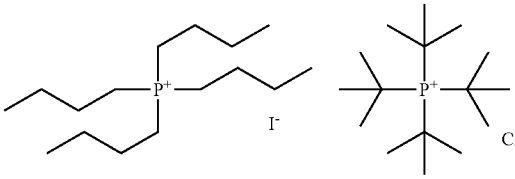
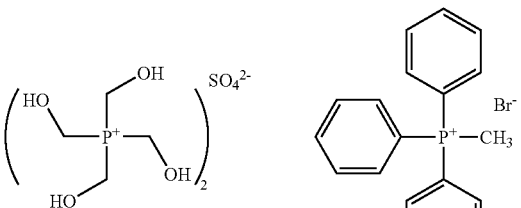
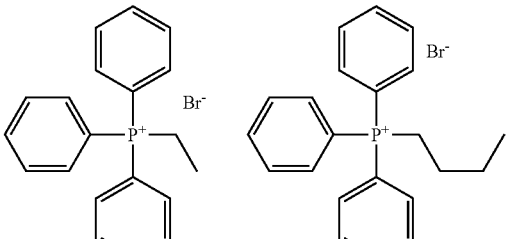
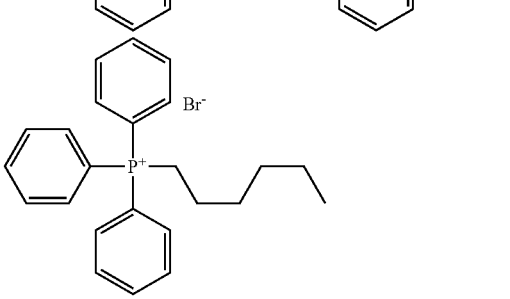

-continued

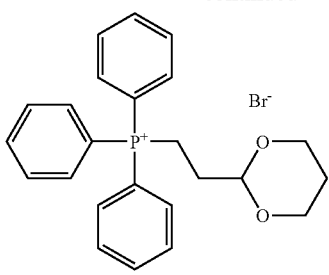

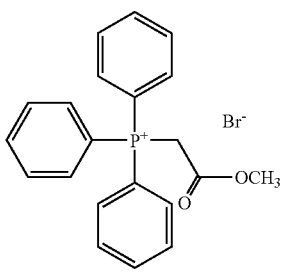

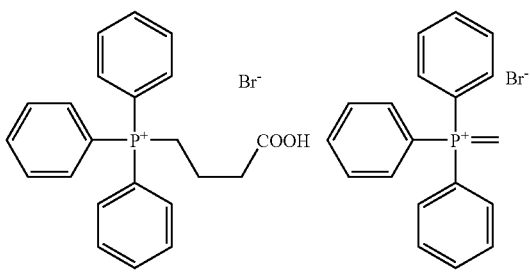

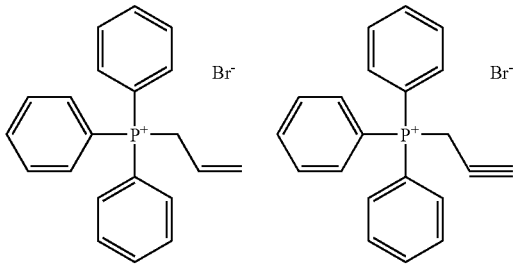

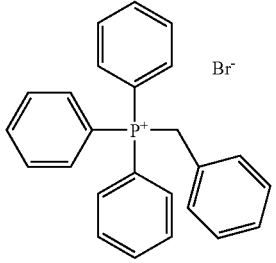

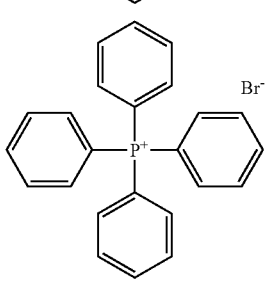

-continued

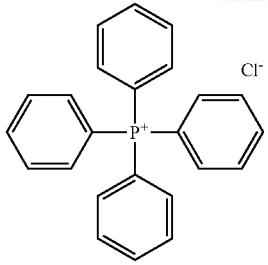

The addition amount of the phosphonium salt to the image recording layer or the protective layer is preferably from 0.01 to 20% by weight, more preferably from 0.05 to 10% by weight, most preferably from 0.1 to 5% by weight, based on the weight of the solid components in each layer. Within this range, good inking properties can be obtained.

As other components of the protective layer, glycerol or dipropylene glycol can be added in an amount of several % by weight based on the weight of the (co)polymer to impart flexibility. Further, an anionic surfactant such as sodium alkylsulfate or sodium alkylsulfonate; an amphoteric surfactant such as alkylaminocarboxylate or alkylaminodicarboxylate; and a nonionic surfactant such as polyoxyethylene alkyl phenyl ether can be added. These surfactants can be used in an amount of from 0.1 to 100% by weight based on the weight of the (co)polymer.

For the improvement of adhesion with image areas, it is described in, for example, JP-A-49-70702 and British Patent Application 1,303,578 that sufficient adhesion can be obtained by mixing from 20 to 60% by weight of an acrylic emulsion, a water-insoluble vinylpyrrolidone-vinyl acetate copolymer, etc., into a hydrophilic polymer primarily comprising polyvinyl alcohol, and laminating the resulting mixture on an image recording layer. Any of these known techniques can be used in the invention.

Other functions can be imparted to the protective layer. For example, safelight aptitude can be improved without causing reduction of sensitivity by the addition of a colorant excellent in transmission of infrared rays used for exposure and capable of efficiently absorbing rays of other wavelengths (e.g., water-soluble dyes).

General methods of dispersing the layered compound for use in the protective layer are described below. In the first place, from 5 to 10 parts by weight of a swellable layered compound illustrated hereinbefore as a preferred example of the layered compound is added to 100 parts by weight of water so as to make thoroughly intimate with water to swell, and then dispersed in a disperser. As the disperser to be used here, various kinds of mills which directly apply force mechanically to effect dispersion, high speed stirring type dispersers having great shearing force, and dispersers giving ultrasonic energy of high strength are illustrated. Specific examples thereof include a ball mill, a sand grinder mill, a visco mill, a colloid mill, a homogenizer, a dissolver, a POLYTRON, a homomixer, a homoblender, a KD mill, a JET AJITER, a capillary emulsifier, a liquid siren, an electromagnetic distortion type ultrasonic wave generator, and an emulsifier having a Poleman whistle are illustrated. The dispersion containing 5 to 10% by weight of inorganic layered compound dispersed by the above-described method is highly viscous or gel-like and very excellent in storage stability.

Upon preparing a coating solution for forming the protective layer by using the dispersion, it is preferred to dilute the dispersion with water and thoroughly stir, and then blend with a binder solution.

To the coating solution for forming the protective layer can be added known additives such as an anionic surfactant, a nonionic surfactant, a cationic surfactant, and a fluorine-containing surfactant to improve coating properties, and a water-soluble plasticizer to improve physical properties of the film. Examples of the water-soluble plasticizers include propionamide, cyclohexanediol, glycerol, and sorbitol. Further, a water-soluble (meth)acrylic polymer can be added. In addition, known additives may be added to the coating solution in order to improve the adhesion with an image recording layer and aging stability of the coating solution.

The protective layer is formed by coating the thus prepared coating solution for forming the protective layer on the image recording layer provided on a support and drying. Coating solvents can be arbitrarily selected in connection with the binder and, when a water-soluble polymer is used, it is preferred to use distilled water or purified water as the coating solvent. The coating method of the protective layer is not particularly limited and known methods, e.g., the methods disclosed in U.S. Pat. No. 3,458,311 and JP-B-55-49729 can be used. Specifically, the protective layer is coated by, for example, a blade coating method, an air knife coating method, a gravure coating method, a roll coating method, a spray coating method, a dip coating method, or a bar coater coating method.

The coating amount of the protective layer is in the range of preferably from 0.01 to 10 g/m$^2$ in dry weight, more preferably from 0.02 to 3 g/m$^2$, and most preferably from 0.02 to 1 g/m$^2$.

[Lithographic Printing Method]

As a light source for exposing the lithographic printing plate precursor of the invention, known ones can be used. Specifically, it is preferred to use various lasers as light sources. In the lithographic printing method of the invention, the lithographic printing plate precursor is imagewise exposed by means of an infrared laser. The infrared laser to be used is not particularly limited, and preferred examples thereof include a solid state laser and a semiconductor laser radiating infrared rays of from 760 to 1,200 nm in wavelength.

Regarding exposure mechanism, any of an internal drum system, an external drum system, and a flat bed system may be employed. The output of the infrared layer is preferably 100 mW or more. For shortening exposure time, it is preferred to use a multi-beam laser device. The exposure time per pixel is preferably not longer than 20 μs. The quantity of irradiation energy is preferably from 10 to 300 mJ/cm$^2$.

In the lithographic printing method of the invention, after the lithographic printing plate precursor of the invention is imagewise exposed, printing is carried out by supplying an oily ink and an aqueous component without subjecting the precursor to development processing, as described above.

Specifically, there are illustrated a method of subjecting the lithographic printing plate precursor to infrared laser exposure, and then mounting the exposed printing plate precursor on a printing press without subjecting the precursor to development processing and performing printing, and a method of mounting the lithographic printing plate precursor on a printing press, and then exposing the printing plate precursor with infrared laser beams on the printing press, and performing printing without subjecting to development processing.

When the on-machine-developable lithographic printing plate precursor is imagewise exposed with infrared laser beams and then printing is performed by supplying an aqueous component and an oily ink without development processing such as wet development processing, the image recording layer cured by exposure forms oily ink-receiving areas having an oleophilic surface at the exposed areas of the image recording layer. On the other hand, in the unexposed areas, the non-cured image recording layer is dissolved or dispersed away with the supplied aqueous component and/or the oily ink, and the hydrophilic surface is bared at that areas. As a result, the aqueous component adheres to the bared hydrophilic surface, whereas the oily ink adheres to the image recording layer in the exposed areas, followed by starting printing.

Here, the one supplied first to the printing plate may be the aqueous component or may be the oily ink. With the on-machine-developable lithographic printing plate precursor of the invention, it is preferred to first supply the oily ink in the point of preventing the aqueous component from being stained with the unexposed areas of the image recording layer. As the aqueous component and the oily ink, those dampening waters and printing inks which are commonly used for lithographic printing can be used, respectively.

Thus, the lithographic printing plate precursor is on-machine-developed on an offset printing machine and is used as it is for producing many prints.

EXAMPLES

The invention will be described in detail by reference to examples, but the invention is not limited thereto at all.

Synthesis Example 1

Synthesis of Illustrative Cyanine Dye (IR-2)

A solution of 2.5 g of the following sulfonium salt (B) in 15 ml of N-methylpyrrolidone (hereinafter abbreviated as "NMP") is cooled to 0° C., and 0.23 g of sodium hydride (manufactured by Kanto Chemical Co., Inc.; dispersion in paraffin liquid; 55% by weight) is added thereto by portions, followed by stirring for 30 minutes. After stirring, a solution of 2.0 g of 2-[2-[2-chloro-3-[2-(1,3-dihydro-1,3,3,5-tetramethyl-2H-indol-2-ylidene)-ethylidene]-1-cyclopenten-1-yl-ethenyl]1,3,3,5-tetramethyl-3H-indolium chloride (A) in 15 ml of NMP is dropwise added thereto, and the mixture is further stirred for 30 minutes, with the temperature rising to room temperature. Subsequently, this reaction solution is dropwise added to an aqueous solution of 2.0 g of potassium hexafluorophosphate in 150 ml of water, and is stirred for 30 minutes at room temperature. Crystals precipitated are collected by filtration, washed with water, and dried to obtain 1.3 g (yield: 34%) of the illustrative cyanine dye (IR-2). Identification is conducted through electron absorption spectrum and $^1$H-NMR (solvent: DMSO).

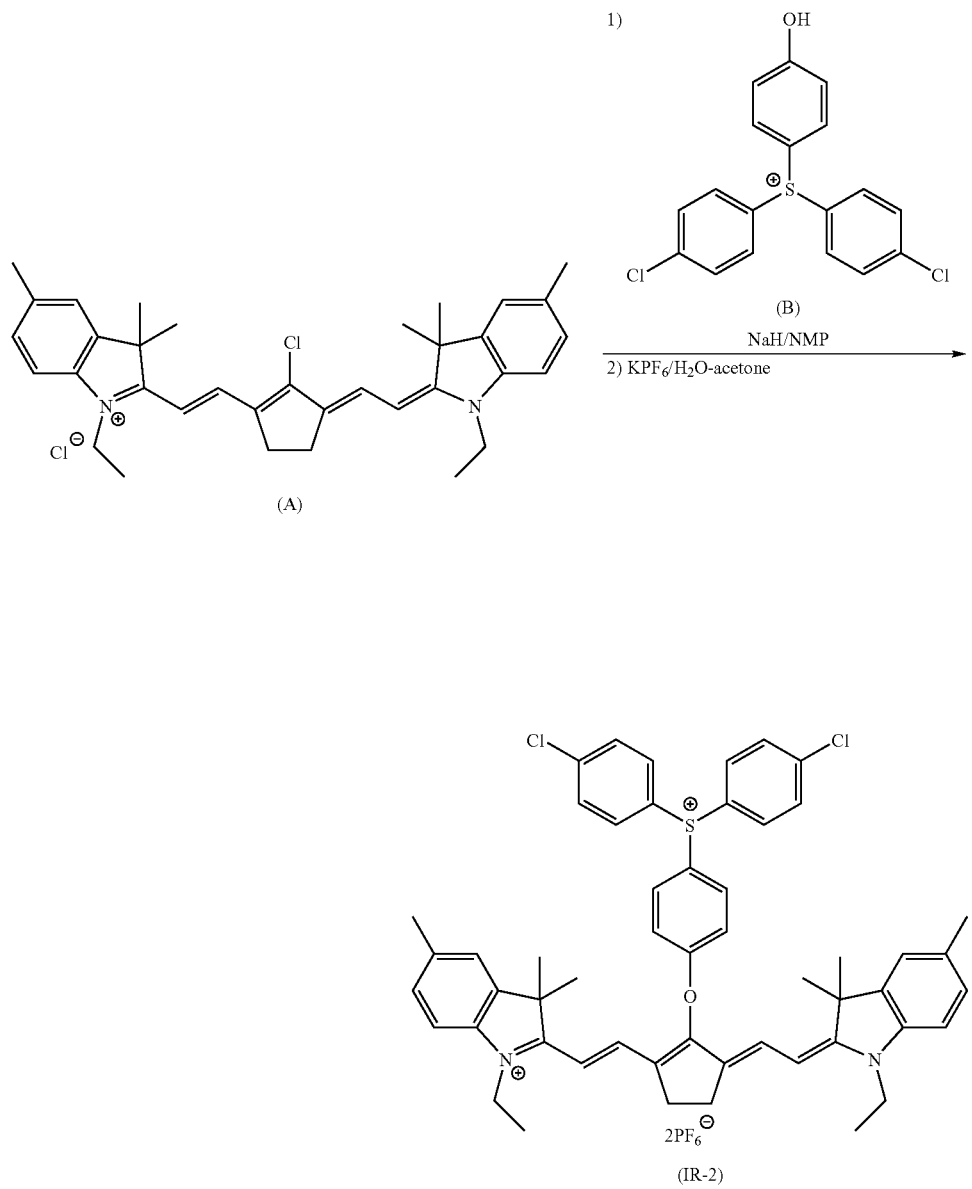

Electron absorption spectrum of the illustrative cyanine dye (IR-2) (methanol): absorption maximum wavelength: 809 nm; absorption maximum mol absorption coefficient: 271000

$^1$H-NMR (400 MHz; DMSO-d6): δ 8.11 (d, J=9.0 Hz, 2H), 7.88 (m, 8H), 7.66 (d, J=9.0 Hz, 2H), 7.38-7.23 (8H, m), 5.96 (d, J=12.4 Hz, 2H), 4.08 (q, J=7.0 Hz, 4H), 2.92 (s, 4H), 2.37 (s, 6H), 1.26-1.21 (m, 18H).

Synthesis Example 2

Synthesis of Illustrative Cyanine Dye (IR-66)

A solution of 0.45 g of 3-hydroxypyridine-N-oxide in 10 ml of NMP is cooled to 0° C., and 0.18 g of sodium hydride (manufactured by Kanto Chemical Co., Inc.; dispersion in paraffin liquid; 55% by weight) is added thereto by portions, followed by stirring for 30 minutes. After stirring, a solution of 1.0 g of 2-[2-[2-chloro-3-[2-(1,3-dihydro-1,3,3,5-tetramethyl-2H-indol-2-ylidene)-ethylidene]-1-cyclopenten-1-yl-ethenyl]-1,3,3,5-tetramethyl-3H-indolium chloride (A) in 8 ml of NMP is dropwise added thereto, and the mixture is further stirred for 30 minutes, with the temperature rising to room temperature. The reaction solution is dropwise added to 300 ml of water, and resulting crystals are collected by filtration, washed with water, and dried to obtain 0.75 g of an intermediate (C) (yield: 43%). 0.5 g of the thus-obtained intermediate (C) is dissolved in 3 ml of chloroform, and 0.20 g of ethyl triflate is dropwise added thereto at room temperature, followed by stirring as it is for 6 hours. After completion of the stirring, 100 ml of n-hexane is added to the reaction solution, and a solid product precipitated is dissolved in methanol, and dropwise added to an aqueous solution of 1.0 g of potassium hexafluorophosphate in 100 ml of water, followed by stirring for 30 minutes at room temperature. Crystals precipitated are collected by filtration, washed with water, and dried to obtain 0.43 g (yield: 78%) of the illustrative cyanine dye (IR-66). Identification is conducted through electron absorption spectrum, $^1$H-NMR (solvent: DMSO), and $^{19}$F-NMR (solvent: DMSO).

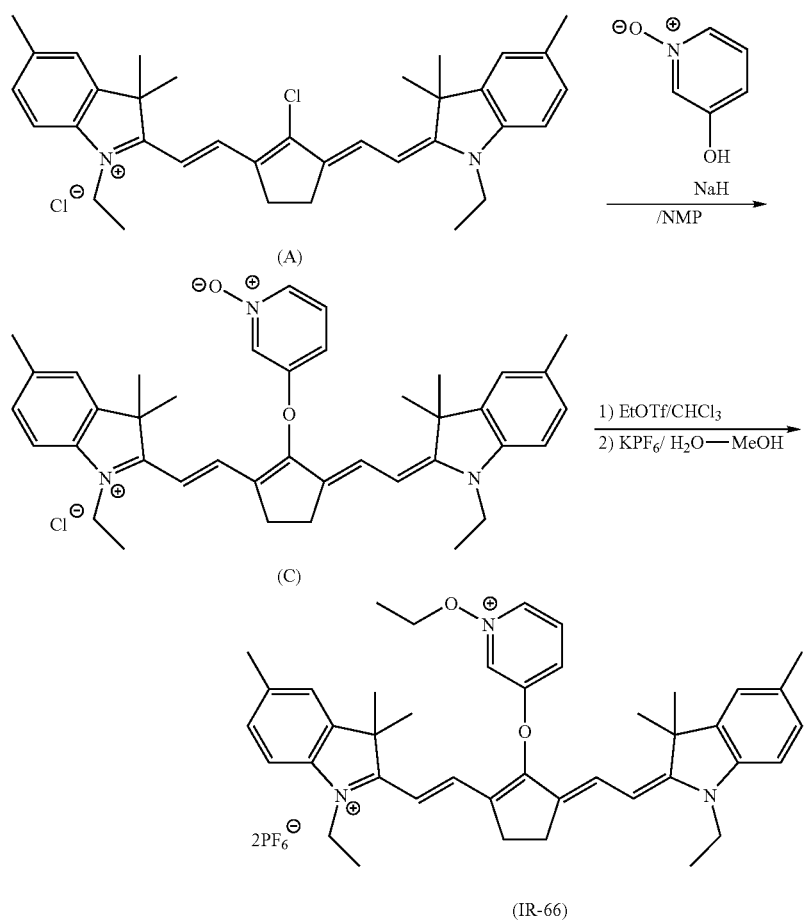

Electron absorption spectrum of the illustrative cyanine dye (IR-66) (methanol): absorption maximum wavelength: 810 nm; absorption maximum mol absorption coefficient: 237000

$^1$H-NMR (400 MHz; DMSO-d6): δ 9.92 (s, 1H), 9.31 (d, J=5.0 Hz, 1H), 8.51 (d, J=7.0 Hz, 1H), 8.28 (dd, J=7.0, 5.0 Hz, 1H), 7.40-7.20 (m, 8H), 6.03 (d, J=14.0 Hz, 2H), 4.76 (q, J=7.2 Hz, 2H), 4.17 (q, J=7.2 Hz, 4H), 2.95 (s, 4H), 2.35 (s, 6H), 1.46-1.39 (m, 15H), 1.03 (m, 6H).

Examples 1 to 6 and Comparative Example 1

Preparation of a Lithographic Printing Plate Precursor (1) Preparation of Support An aluminum sheet (material, 1050) having a thickness of 0.3 mm is subjected to a degreasing treatment with 10% by weight aqueous sodium aluminate solution at 50° C. for 30 seconds in order to remove the rolling oil remaining on the surface thereof. Thereafter, the aluminum surface is grained with three brushes having nylon bundles set therein having a bristle diameter of 0.3 mm and with an aqueous suspension of pumice having a median diameter of 25 μm (specific gravity of the suspension, 1.1 g/cm³), and then sufficiently washed with water. This sheet is immersed for 9 seconds in 25% by weight aqueous sodium hydroxide solution having a temperature of 45° C. to conduct etching and then washed with water. Thereafter, the sheet is immersed in 20% by weight nitric acid at 60° C. for 20 seconds and washed with water. In this operation, the amount of the grained surface layer removed by etching is about 3 g/m².

Next, an electrochemical surface-roughening treatment is continuously conducted using a 60-Hz AC voltage. The electrolytic solution used for this treatment is 1% by weight aqueous nitric acid solution (containing 0.5% by weight aluminum ion), and the temperature of the solution is 50° C. The AC power source used is one providing a trapezoidal rectangular wave alternating current wherein the TP, which is the time required for the current value to increase from zero to a peak, is 0.8 msec and the duty ratio is 1:1. A carbon electrode is used as a counter electrode to conduct the electrochemical surface-roughening treatment using ferrite as an auxiliary anode. The current density is 30 A/dm² in terms of peak value. To the auxiliary anode is supplied 5% of the current flowing from the power source. The quantity of electricity in the nitric acid electrolysis is 175 C/dm² in terms of the quantity of electricity at the time when the aluminum sheet is functioning as an anode. After this treatment, the aluminum sheet is washed with water by spraying.

Further, an electrochemical surface-roughening treatment with an electrolytic solution consisting of 0.5% by weight aqueous hydrochloric acid solution (containing 0.5% by weight aluminum ion) and having a temperature of 50° C. is conducted under the conditions of a quantity of electricity of 50 C/dm² at the time when the aluminum sheet is functioning as an anode, in the same manner as in the nitric acid electrolysis. The sheet is then water-washed by spraying. This sheet is subjected to direct-current anodization at a current density of 15 A/dm² using 15% by weight sulfuric acid (containing 0.5% by weight aluminum ion) as an electrolytic solution to provide an anodized coating in an amount of 2.5 g/m², subsequently washed with water, and dried. This substrate is examined for center-line average surface roughness (Ra) with a pointer having a diameter of 2 μm. As a result, the average surface roughness thereof is found to be 0.51 μm. Further, the following undercoating solution (1) is applied to the support in an amount of 6 mg/m² on a dry basis to prepare a support.

| -Undercoating solution (1)- | |
|---|---|
| Undercoating compound (1) (weight-average molecular weight: 60,000) | 0.017 g |
| Methanol | 9.00 g |
| Water | 1.00 g |

Undercoating compound (1)

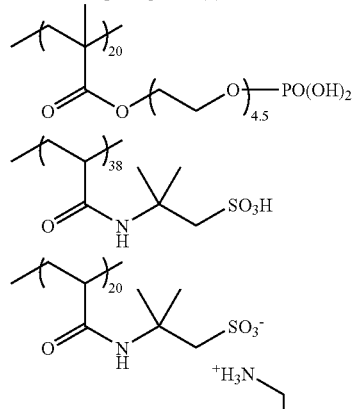

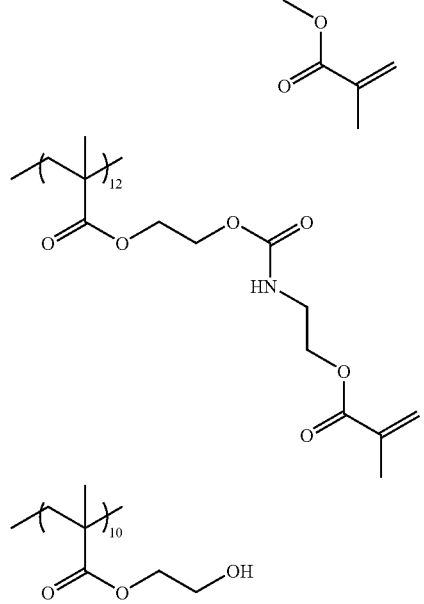

(2) Formation of an Image Recording Layer and a Protective Layer

A coating solution for forming an image recording layer, which has the following formulation, is applied by bar coating on the support having provided thereon the above-described undercoat layer, and then dried in an oven at 100° C. for 60 seconds to form an image recording layer in an amount of 1.0 g/m on a dry basis. Subsequently, a coating solution for forming a protective layer, which has the following formulation, is applied by bar coating on the aforesaid image recording layer, and then dried in an oven at 120° C. for 60 seconds to form a protective layer in an amount of 0.15 g/m² on a dry basis. Thus, there are obtained lithographic printing plate precursors (1) to (6) and a comparative lithographic printing plate precursor (R1).

Each coating solution forming the image recording layer is obtained by mixing, immediately before coating, each photosensitive solution described in Table 1 with the following micro-gel solution (1), and stirring the mixture.

Additionally, in the photosensitive solution (R1) used in Comparative Example 1, a comparative infrared ray absorbent (R-1) of the following structure is used in place of the particular cyanine dye of the invention.

| -Photosensitive solutions (1) to (9) and (R1)- | |
|---|---|
| (B) Binder polymer (1) | 0.177 g |
| (A) Infrared ray absorbent (compound shown in Table 1) | X g |
| (C) Polymerizable monomer (ARONIX M-215; manufactured by Toagosei Co., Ltd.) | 0.319 g |
| Polymerization initiator (compound shown in Table 1) | Y g |
| Phosphonium compound (1) | 0.035 g |
| Fluorine-containing surfactant (1) | 0.004 g |
| Anionic surfactant (Pionin A-24-EA; manufactured by Takemono Oil & Fat Co., Ltd.; 40% by weight aq. soln.) | 0.125 g |
| Methyl ethyl ketone | 2.554 g |
| 1-Methoxy-2-propanol | 7.023 g |
| Micro-gel solution (1) | 1.800 g |
| Water | 1.678 g |

—Synthesis of Micro-Gel Dispersion (1)—

As an oil phase component, 10.0 g of a trimethylolpropane and xylene diisocyanate adduct (manufactured by Mitsui Takeda Chemical Co., Ltd.; TAKENATE D-110N; 75% by weight ethyl acetate solution), 6.00 g of a polymerizable monomer of ARONIX M-215 (manufactured by Toagosei Co., Ltd.), and 0.12 g of Pionin A-41C (manufactured by Takemonto Oil & Fat Co., Ltd.) are dissolved in 16.67 g of ethyl acetate. As an aqueous phase component, 37.5 g of a 4% by weight aqueous solution of PVA-205 is prepared. The oil phase component and the aqueous phase component are mixed with each other, and emulsified in a homogenizer at 12,000 rpm. The thus-obtained emulsion is added to 25 g of distilled water and, after stirring at room temperature for 30 minutes, the mixture is stirred at 40° C. for 2 hours. The thus-obtained microcapsule solution is diluted with distilled water so that the concentration of solid components becomes 21% by weight, thus a micro-gel dispersion (1) being obtained. The average particle size is found to be 0.23 μm.

Structures of individual compounds used in the foregoing photosensitive solution are shown below.

Binder polymer (1)

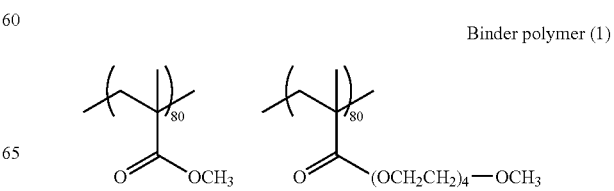

Fluorine-containing surfactant (1)

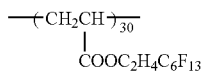
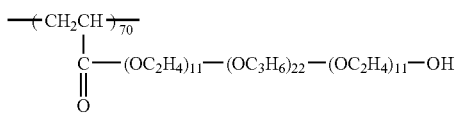

Phosphonium compound (1)

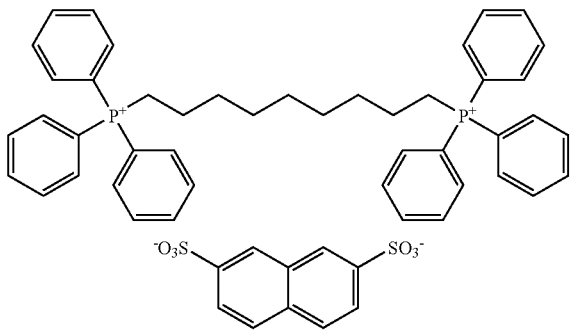

Comparative cyanine dye (R-1)

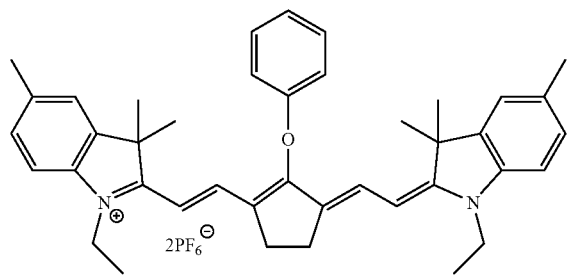

Comparative polymerization initiator (R-1)

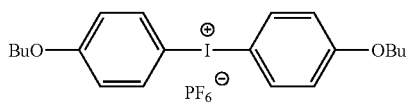

| Coating solution for forming a protective layer | |
|---|---|
| Dispersion (1) of the following inorganic layered compound | 1.5 g |
| Polyvinyl alcohol (PVA 105; manufactured by Kuraray Co., Ltd.; degree of saponification: 98.5 mol %; degree of polymerization: 500) | 0.06 g |
| Polyvinylpyrrolidone (polyvinylpyrrolidone K30; manufactured by Tokyo Chemical Industry Co., Ltd.; Mw = 40,000) | 0.01 g |
| Vinylpyrrolidone/vinyl acetate copolymer (LUVITEC VA64W; manufactured by ISP; copolymerization ratio = 6/4) | 0.01 g |

—Preparation of the Dispersion (1) of the Inorganic Layered Compound—

To 193.6 g of deionized water is added 6.4 g of synthetic mica SOMASHIF ME-100 (manufactured by Co-op Chemical Co., Ltd., followed by dispersing using a homogenizer till the average particle size (laser scattering method) becomes 3 μm. The aspect ratio of the thus-obtained dispersed particles of the layered compound is found to be 100 or more.

(Exposure and Printing)

Each of the lithographic printing plate precursors (1) to (5) and (R1) obtained 2 is subjected to exposure with Trendsetter 3244VX (manufactured by Creo Products Incorporated) loading a water-cooling type 40 W infrared semiconductor laser on the conditions of output of 11.7 W, outer drum rotation of 250 rpm, and resolution of 2,400 dpi.

(Evaluation of Lithographic Printing Plate Precursor)

The plate-inspecting properties, on-machine delopability, and printing durability of the lithographic printing plate precursors are evaluated as follows. The results obtained are shown in Table 1.

(1) Plate-Inspecting Properties

The exposed printing plate precursor is allowed to stand in a dark place at 25° C., 50% RH for 30 minutes or 3 hours as it is, followed by evaluating plate-inspecting properties. Degree of ease of inspecting the printing plate is represented in terms of the difference in L value between exposed areas and unexposed areas, $\Delta L$, using L values (lightness) of the $L^*a^*b^*$ color specification. The greater $\Delta L$ value means more excellent inspecting properties. When this value is 2.0 or more, the sample can be said to be excellent in visually inspecting properties. The measurement is performed using a spectro-colorimeter CM2600d (manufactured by KONICA MINOLTA HOLDINGS, INC.) and operation software (CM-S100W) according to SCE (specularly reflected light exclusion) method. In the SCE method, specularly reflected light is excluded and only diffused light is measured, so that the evaluated color is inclining toward visual observation and well relates to the inspection by human eyes.

(2) Evaluation of On-Machine Developability

Further, the thus-obtained exposed printing plate precursor is mounted on a cylinder of a printing machine SOR-M (manufactured by Heidelberg). A dampening water (EU-3 (an etching solution manufactured by Fuji Photo Film Co., Ltd.)/water/isopropyl alcohol=1/89/10 (by volume)) and TRANS-G (N) sumi ink (manufactured by Dainippon Ink and Chemicals Inc.) are fed as the dampening water solution and ink, and printing is performed at a printing speed of 6,000 sheets per hour. In this occasion, the number of sheets of printing paper required up to the time when unexposed areas (non-image areas) of the image recording layer acquires a state of repelling the ink is counted to evaluate on-machine developability. A tested sample with a smaller number of the sheets is evaluated to be more excellent in on-machine developability.

(3) Evaluation of Printing Durability

As printing is further continued to increase the number of the sheets of printing paper, the image recording layer is gradually abraded to suffer reduction in ink-receptive properties, leading to reduction in ink density in printed products. Printing durability is evaluated in terms of the number of sheets of printed products when the ink density is lowered by 0.1 than upon initiation of printing. A tested sample with a larger number is evaluated to be more excellent in printing durability.

It is confirmed from the results shown in Table 1 that, when laser-exposed, the lithographic printing plate precursor to which the photosensitive composition of the invention is applied produces good contrast between exposed areas and unexposed areas, thus having excellent viewability (inspecting properties). In addition, every lithographic printing plate precursor is excellent in on-machine developability and shows practically sufficient printing durability as a printing plate.

TABLE 1

| | Lithographic Printing Plate Precursor | Photosensitive Solution | Infrared Ray Absorbent | | Polymerization Initiator | | Plate-inspecting Properties ΔL | On-machine Developability (sheets) | Printing Durability (×1000) |
|---|---|---|---|---|---|---|---|---|---|
| | | | Structure | Added Amount X (g) | Structure | Added Amount Y (g) | | | |
| Example 1 | 1 | 1 | IR-2 | 0.0389 | — | — | 3 | 50 | 16 |
| Example 2 | 2 | 2 | IR-33 | 0.0382 | — | — | 3.5 | 60 | 19 |
| Example 3 | 3 | 3 | IR-66 | 0.0313 | — | — | 2.5 | 50 | 14 |
| Example 4 | 4 | 4 | IR-56 | 0.0311 | — | — | 2.5 | 60 | 13 |
| Example 5 | 5 | 5 | IR-19 | 0.0394 | — | — | 2 | 60 | 16 |
| Example 6 | 6 | 6 | IR-1 | 0.0408 | — | — | 2 | 60 | 16 |
| Comparative Example 1 | R1 | R1 | R-1 | 0.0252 | (R-1) | 0.0197 | 0.8 | 50 | 2 |

Examples 7, 8

Comparative Example 2

Preparation of Support

A 0.3 mm-thick aluminum plate according to JIS-A-1050 is treated by practicing the following steps in combination.

(a) Mechanical Surface-Roughening Treatment

A mechanical surface-roughening treatment is performed by using a rotating roller-shaped nylon brush while supplying, as an abrasive slurry, a suspension of an abrasive (siliceous sand) having a specific gravity of 1.12 in water to the aluminum plate surface. The average particle size of the abrasive is 8 μm, and the maximum particle size is 50 μm. The nylon brush used is made of 6-10-nylon and has a bristle length of 50 mm and a bristle diameter of 0.3 mm. This nylon brush is produced by perforating holes in a stainless steel-made cylinder having a diameter of 300 mm and densely implanting bristles in the holes. Three rotary brushes are used. The distance between two support rollers (ϕ200 mm) disposed below the brush is 300 mm. The brush roller is pressed to the aluminum plate until the load of the driving motor for rotating the brush becomes 7 kW larger than the load before the brush roller is pressed to the aluminum plate. The rotating direction of the brush is the same as the traveling direction of the aluminum plate. The rotation number of the brush is 200 rpm.

(b) Alkali Etching Treatment

An etching treatment is performed by spraying an aqueous NaOH solution (concentration: 26% by weight; aluminum ion concentration: 6.5% by weight) at a temperature of 70° C. onto the obtained aluminum plate to dissolve 6 g/m² of the aluminum plate. Thereafter, the aluminum plate is washed by spraying well water.

(c) Desmutting Treatment

A desmutting treatment is performed by spraying a 30° C. aqueous solution having a nitric acid concentration of 1% by weight (containing 0.5% by weight of aluminum ion), and then the aluminum plate is water-washed by spraying. As the aqueous nitric acid solution used for the desmutting, the waste solution from the step of performing electrochemical surface roughening by using AC in an aqueous nitric acid solution is used.

(d) Electrochemical Surface-Roughening Treatment

An electrochemical surface-roughening treatment is continuously performed by using AC voltage of 60 Hz. In this occasion, the electrolytic solution is an aqueous solution containing 10.5 g/liter of nitric acid (containing 5 g/liter of aluminum ion) and having a temperature of 50° C. The electrochemical surface-roughening treatment is performed by using an AC power source of rectangular wave AC with a trapezoidal waveform such that the time TP necessary for the current value to reach the peak from 0 is 0.8 msec and the duty ratio is 1:1, and disposing a carbon electrode as the counter electrode. The auxiliary anode is ferrite. The electrolytic cell used is a radial cell type.

The current density is 30 A/dm² in terms of the peak value of current, the total quantity of electricity during the time of the aluminum plate serving as the anode is 220 C/dm², and 5% of the current flowing from the power source is fed to the auxiliary anode.

Thereafter, the aluminum plate is washed by spraying well water (e) Alkali Etching Treatment The aluminum plate is etched at 32° C. by spraying an etching solution having a sodium hydroxide concentration of 26% by weight and an aluminum ion concentration of 6.5% by weight to dissolve 3.4 g/m² of the aluminum plate, whereby the smut component mainly comprising aluminum hydroxide produced at the electrochemical surface-roughening performed by using AC in the previous stage is removed, and the edge portion of the produced pit is dissolved to smoothen the edge portion. Thereafter, the aluminum plate is washed by spraying well water.

(f) Desmutting Treatment

A desmutting treatment is performed by spraying a 30° C. aqueous solution having a nitric acid concentration of 15% by weight (containing 4.5% by weight of aluminum ion), and then the aluminum plate is washed by spraying well water. As the aqueous nitric acid solution used for the desmutting, the waste solution from the step of performing electrochemical surface-roughening by using AC in an aqueous nitric acid solution is used.

(g) Electrochemical Surface-Roughening Treatment

An electrochemical surface-roughening treatment is continuously performed by using AC voltage of 60 Hz. In this occasion, the electrolytic solution is a 35° C. aqueous solution containing 7.5 g/liter of hydrochloric acid (containing 5 g/liter of aluminum ion). The electrochemical surface-roughening treatment is performed by using an AC power source with a rectangular waveform and disposing a carbon electrode as the counter electrode. The auxiliary anode is ferrite. The electrolytic cell used is a radial cell type.

The current density is 25 A/dm² in terms of the peak value of current, and the total quantity of electricity during the time of the aluminum plate serving as the anode is 50 C/dm².

Thereafter, the aluminum plate is washed by spraying well water.

(h) Alkali Etching Treatment

The aluminum plate is etched at 32° C. by spraying an etching solution having a sodium hydroxide concentration of 26% by weight and an aluminum ion concentration of 6.5% by weight to dissolve 0.10 g/m² of the aluminum plate, whereby the smut component mainly comprising aluminum hydroxide produced at the En electrochemical surface-roughening performed by using AC in the previous stage is removed, and the edge portion of the produced pit is dissolved to smoothen the edge portion. Thereafter, the aluminum plate is washed by spraying well water.

(i) Desmutting Treatment

A desmutting treatment is performed by spraying a 60° C. aqueous solution having a sulfuric acid concentration of 25% by weight (containing 0.5% by weight of aluminum ion), and then the aluminum plate is washed by spraying well water.

(j) Anodization Treatment

As the electrolytic solution, sulfuric acid is used. The electrolytic solution has a sulfuric acid concentration of 170 g/liter (containing 0.5% by weight of aluminum ion), and the temperature thereof is 43° C. Thereafter, the aluminum plate is washed by spraying well water.

The current density is about 30 A/dm². The final oxide film coverage is 2.7 g/m².

Subsequently, the thus-obtained support is subjected to the following hydrophilicity-imparting treatment and the undercoating treatment.

(k) Alkali Metal Silicate Treatment

An alkali metal silicate treatment (silicate treatment) is performed by dipping the resulting aluminum support obtained by the anodization treatment in a 30° C. aqueous 1% by weight No. 3 sodium silicate solution retained in a treating tank for 10 seconds. Thereafter, the aluminum plate is washed by spraying well water. In this occasion, the deposition amount of silicate is 3.6 mg/m².

(Undercoating Treatment)

An undercoating solution of the following formulation is applied to the aluminum support obtained as described above after the alkali metal silicate treatment, and dried at 80 C for 15 seconds. The coated amount after drying is 16 mg/m².

| <Formulation of undercoating solution> | |
|---|---|
| High molecular compound shown below | 0.3 g |
| Methanol | 100 g |
| Water | 1.0 g |

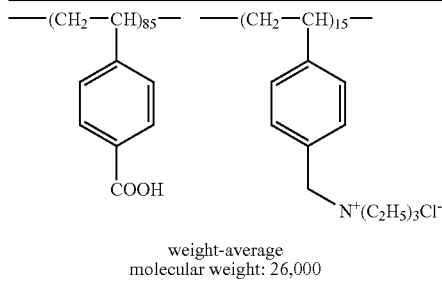

weight-average
molecular weight: 26,000

A coating solution for forming the first layer (undercoat layer) of the following formulation is coated on the thus-obtained support by a wire bar, and dried in a 120° C. drying oven for 30 seconds to form an undercoat layer in a coated amount of 0.95 g/².

A coating solution for forming the second layer (upper layer) of the following formulation is coated on the thus-obtained undercoated support by a wire bar, and dried in a drying oven at 110° C. for 60 seconds to coat in a total coated amount of 1.25 g/m2, thus positive-working lithographic printing plate precursors of Examples 7 and 8 and Comparative Example 2 being prepared.

| <Coating solution for forming the first layer (undercoat layer)> | |
|---|---|
| Copolymer 1 (synthesized as described below) | 1.833 g |
| Cyanine dye A (of the following structure) | 0.098 g |
| 2-Mercapto-5-methylthio-1,3,4-thiadiazole | 0.030 g |
| cis-Δ⁴-tetrahydrophthalic acid anhydride | 0.100 g |
| 4,4'-Sulfonyldiphenol | 0.090 g |
| p-Toluenesulfonic acid | 0.008 g |
| Ethyl Violet wherein the counter anion is changed to 6-hydroxynaphthalanesulfonate | 0.100 g |
| 3-Methoxy-4-diazodiphenylamine hexafluoro-phosphated | 0.030 g |
| Fluorine-containing surfactant (Megafac F-780; manufactured by Dainippon Ink & Chemicals, Inc.) | 0.035 g |
| Methyl ethyl ketone | 26.6 g |
| 1-Methoxy-2-propanol | 13.6 g |
| γ-Butyrolactone | 13.8 g |

Cyanine dye A

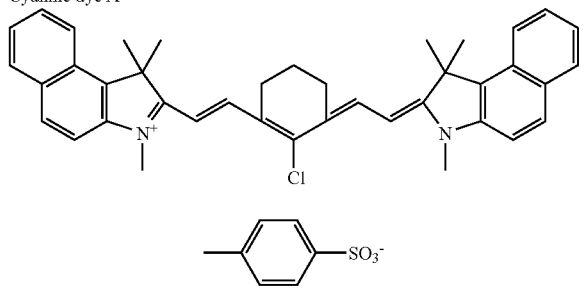

<Synthesis of Copolymer 1>

31.0 g (0.36 mol) of methacrylic acid, 39.1 g (0.36 mol) of ethyl chloroformate, and 200 ml of acetonitrile are placed in a 500-ml three-neck flack equipped with a stirrer, a cooling tube and a dropping funnel, and the mixture is stirred under cooling in an ice-water bath. 36.4 g (0.36 mol) of triethylamine is dropwise added to this mixture over about 1 hour through the dropping funnel. After completion of the dropwise addition, the ice-water bath is removed, and the mixture is stirred at room temperature for 30 minutes.

51.7 g (0.30 mol) of p-aminobenzenesulfonamide is added to this reaction mixture, and the mixture is stirred for one hour while warming the mixture to 70° C. in an oil bath. After completion of the reaction, this mixture is introduced into 1 liter of water while stirring the water, followed by stirring the resulting mixture for 30 minutes. This mixture is filtered to collect a precipitate, and the precipitate is formed into a slurry with 500 ml of water. This slurry is filtered, and the thus-obtained solid product is dried to obtain a white solid of N-(p-aminosulfonylphenyl)methacrylamide (yield: 46.9 g).

Next, 4.61 g (0.0192 mol) of N-(p-aminosulfonylphenyl) methacrylamide, 2.58 g (0.0258 mol) of ethyl methacrylate, 0.80 g (0.015 mol) of acrylonitrile, and 20 g KR of N,N-dimethylacetamide are placed in a 20-ml three-neck flack equipped with a stirrer, a cooling tube and a dropping funnel, and the mixture is stirred while heating to 65° C. in a warm water bath. To this mixture is added, as a polymerization initiator, 0.15 g of 2,2'-azobis(2,4-dimethylvaleronitrile) (trade name: "V-65"; manufactured by Wako Pure Chemical Industries, Ltd.), and the resulting mixture is stirred for 2 hours in a stream of nitrogen while keeping the temperature at 65° C. To this reaction mixture is further dropwise added a mixture of 4.61 g of N-(p-aminosulfonylphenyl)methacrylamide, 2.58 g of methyl methacrylate, 0.80 g of acrylonitrile, 20 g of N,N-dimethylacetamide, and 0.15 g of "V-65" over 2 hours through the dropping funnel. After completion of the dropwise addition, the resulting mixture is stirred for further 2 hours at 65° C. After completion of the reaction, 40 g of methanol is added to the mixture, followed by cooling. The thus-obtained mixture is introduced into 2 liters of water while stirring this water and, after stirring the mixture for 30 minutes, the precipitate is collected by filtration, and dried to obtain 15 g of a white solid product. The weight-average molecular weight (in terms of polystyrene) of this particular copolymer 1 is measured by gel permeation chromatography, and is found to be 54,000.

| <Coating solution for forming the second layer (upper layer)> | |
|---|---|
| Copolymer of ethyl methacrylate and 2-methacryloyl-oxyethyl succinate (molar ratio: 60:40; weight-average molecular weight: 100,000) | 0.040 g |
| Phenol/cresol-formaldehyde novolak (phenol:m-cresol:p-cresol = 80:10:10; weight-average molecular weight: 12,000) | 0.400 g |
| Particular cyanine dye (described in Table 2) | X g |
| Onium salt (compound described in Table 2) | Y g |
| Ethyl Violet wherein counter anion is changed to 6-hydroxynaphthalenesulfonate | 0.012 g |
| Fluorine-containing surfactant (Megafac F-780; manufactured by Dainippon Ink & Chemicals, Inc.) | 0.022 g |
| Methyl ethyl ketone | 13.1 g |
| 1-Methoxy-2-propanol | 6.79 g |

[Evaluation of Lithographic Printing Plate Precursor]

The lithographic printing plate precursors are evaluated in terms of development latitude and ink-receiving properties. Details of the evaluation methods are as shown below, 1. Development Latitude On the obtained lithographic printing plate precursor, a test pattern is imagewise-drawn by Trendsetter 3244VX, manufactured by Creo, at a beam intensity of 6.0 W and a drum rotation speed of 100 rpm after storing the precursor for two days under the conditions of 35° C. in temperature and 65% in relative humidity.

Thereafter, the exposed lithographic printing plate precursor is developed for 40 seconds using a PS processor 900H manufactured by Fuji Photo Film Co., Ltd. loaded with an alkaline developing solution of the following formulation wherein the weight ratio of water is changed to alter dilution ratio and change electrical conductivity and which has a temperature of 30° C. In this occasion, difference between the maximum value and the minimum value in terms of electrical conductivity of the developing solution which does not dissolve image areas and which permits good development without stain and coloration caused by residual photosensitive layer due to insufficient development, is evaluated as development latitude.

2. Ink-Receptive Properties

The lithographic printing plate precursor is imagewise exposed with a setter exposure amount of 6.0 W and at a rotation speed of 100 rpm using Trendsetter 3244F manufactured by Creo, development processed with a developing solution DT-1 manufactured by Fuji Photo Film Co., Ltd. under standard conditions, and then mounted on a printing machine for performing relative evaluation in terms of the number of printed sheets which are necessary for obtaining a print wherein the ink is correctly deposited on image areas with no problems. The results are shown as relative values taking, as the standard (100), the time necessary for the lithographic printing plate precursor of Example 7 to provide prints having no problems. A higher value means a higher ink-receptive properties, thus being preferred.

| <Formulation of the alkali deveping solution> | |
|---|---|
| D-Sorbitol | 2.5% by weight |
| Sodium hydroxide | 0.85% by weight |
| Polyethylene glycol lauryl ether (weight-average molecular weight: 1,000 | 0.5% by weight |
| Water | 96.15% by weight |

<Evaluation of Lithographic Printing Plate Precursors of Examples 7 and 8 and Comparative Example 2>

Each of the lithographic printing plate precursors of Examples 7 and 8 and Comparative Example 2 are evaluated in terms of development latitude and ink-receptive properties according to the above-described method. The results thus obtained are shown in Table 2.

TABLE 2

| | | | Particular Cyanine Dye | | Onium Salt | | | |
|---|---|---|---|---|---|---|---|---|
| | Lithographic Printing Plate Precursor | Photosensitive Solution | Structure | Added Amount X (g) | Structure | Added Amount Y (g) | Development Latitude | Ink-receptive Properties |
| Example 7 | (7) | (7) | IR-1 | 0.0389 | — | — | 7.5 | 100 |
| Example 8 | (8) | (8) | IR-32 | 0.0382 | — | — | 8.0 | 110 |
| Comparative Example 2 | (R2) | (R2) | Cyanine Dye (A) | 0.015 | (R-2) | 0.011 | 6.5 | 50 |

The comparative onium salt used in Comparative Example 2 is as shown below.

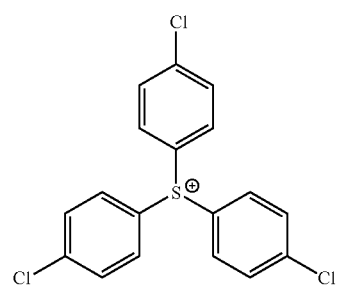

(R-2)

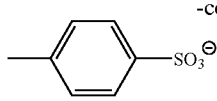

As is shown in Table 2, it can be seen that the lithographic printing plate precursors of Examples 7 and 8 are lithographic printing plate precursors excellent in both development latitude and ink-receptive properties in comparison with the lithographic printing plate precursor of Comparative Example 2.

According to the invention, there can be provided a lithographic printing plate precursor capable of forming a printing plate having excellent printing durability by infrared laser exposure. In addition, there can be provided a lithographic printing plate precursor of on-machine development type capable of forming a color image with good viewability by laser exposure. Further, the novel cyanine dyes of the invention can preferably be used in the recording layer of the lithographic printing plate precursor.

The entire disclosure of each and every foreign patent application from which the benefit of foreign priority has been claimed in the present application is incorporated herein by reference, as if fully set forth.

What is claimed is:

1. A photosensitive composition comprising:

a cyanine dye that has, on a methine chain thereof, a substituent which is a cation moiety of an onium salt structure, wherein the cyanine dye is represented by a general formula (3):

General formula (3)

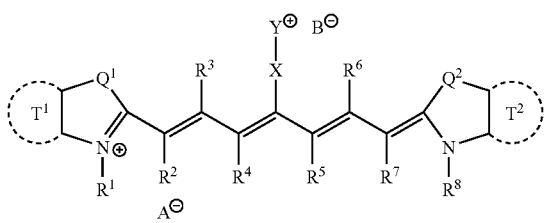

wherein $R^1$ and $R^8$ each independently represents a hydrocarbon group which may have a substituent;

$R^2$, $R^3$, $R^4$, $R^5$, $R^6$, and $R^7$ each independently represents a hydrogen atom or a hydrocarbon group;

$R^4$ and $R^5$ may be connected to each other to form a ring which may have a substituent;

X represents a single bond or a linking group;

$Q^1$ and $Q^2$ each independently represents —$NR^9$—, S, O, —CH=CH—, or a dialkylmethylene group;

$R^9$ represents a hydrogen atom or a hydrocarbon group which may have a substituent;

$Y^+$ represents a substituent having a cation moiety of an onium salt structure represented by any one of general formulae (5), (6) and (8):

General formula (5)

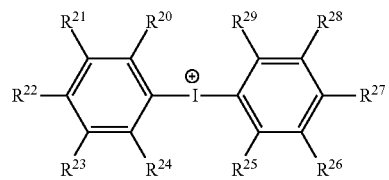

General formula (6)

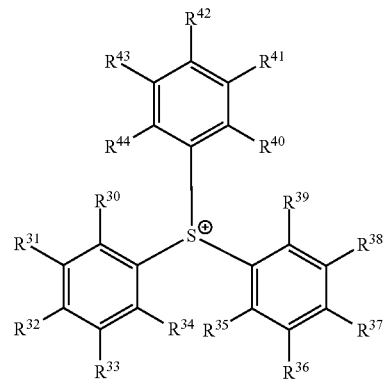

General formula (8)

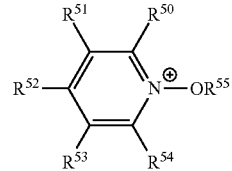

wherein $R^{20}$ to $R^{44}$ and $R^{50}$ to $R^{55}$ each independently represents a hydrogen atom, a halogen atom, or a monovalent organic group; and one of $R^{20}$ to $R^{29}$ in the general formula (5), one of $R^{30}$ to $R^{44}$ in the general formula (6), and one of $R^{50}$ to $R^{54}$ in the general formula (8) are a single bond connected to X in the general formula (3);

$T^1$ and $T^2$ each independently represents an aromatic ring or a heteroaromatic ring; and $A^-$ and $B^-$ each independently represents a counter ion which exists when charge neutralization is necessary, the counter ion being selected from the group consisting of a halogen ion, a perchlorate ion, a tetrafluoroborate ion, a hexafluorophosphate ion, and a sulfonate ion.

2. The photosensitive composition according to claim 1, wherein the cyanine dye is represented by a general formula (4):

General formula (9)

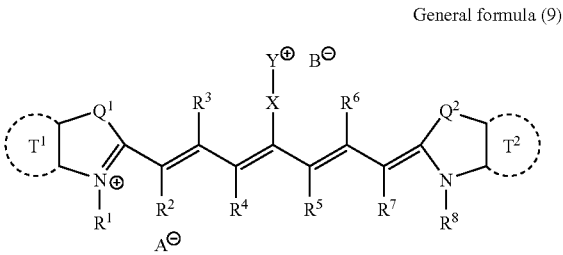

wherein $R^1$ and $R^8$ each independently represents a hydrocarbon group which may have a substituent;

$R^2$, $R^3$, $R^6$, and $R^7$ each independently represents a hydrogen atom or a hydrocarbon group;

$T^1$ and $T^2$ each independently represents an aromatic ring or a heteroaromatic ring;

$A^-$ and $B^-$ each independently represents a counter ion which exists when charge neutralization is necessary, the counter ion being selected from the group consisting of a halogen ion, a perchlorate ion, a tetrafluoroborate ion, a hexafluorophosphate ion, and a sulfonate ion;

X represents a single bond or a linking group; and $Y^+$ represents a substituent represented by any one of general formulae (5), (6) and (8):

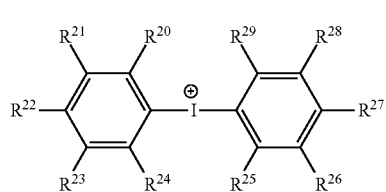

General formula (5)

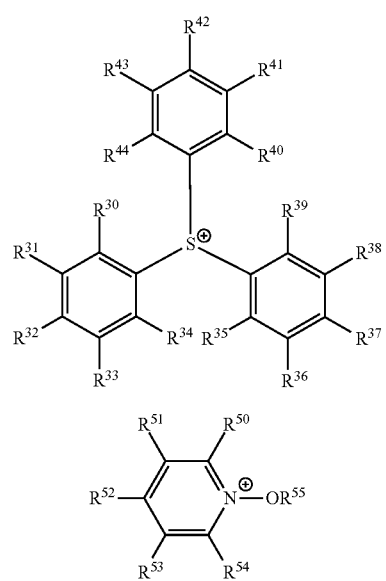

General formula (6)

General formula (8)

wherein $R^{20}$ to $R^{44}$ and $R^{50}$ to $R^{55}$ each independently represents a hydrogen atom, a halogen atom, or a monovalent organic group; and one of $R^{20}$ to $R^{29}$ in the general formula (5), one of $R^{30}$ to $R^{44}$ in the general formula (6), and one of $R^{50}$ to $R^{54}$ in the general formula (8) are a single bond connected to X in the general formula (4).

3. The photosensitive composition according to claim 1, further comprising:
  (B) a binder polymer; and
  (C) a polymerizable monomer.

4. The photosensitive composition according to claim 1, further comprising:
  (D) a microcapsule or microgel.

5. A lithographic printing plate precursor comprising:
  a support; and
  an image recording layer that comprises the photosensitive composition according to claim 1.

6. The lithographic printing plate precursor according to claim 5, wherein
  the image recording layer is capable of recording by infrared laser exposure; and
  the lithographic printing plate precursor is capable of printing by mounting the lithographic printing plate precursor on a printing machine without development processing step or by recording an image after mounting the lithographic printing plate precursor on a printing machine.

7. A lithographic printing method comprising:
  a step of imagewise exposing the lithographic printing plate precursor according to claim 6 by an infrared laser; and
  a printing step of feeding an oily ink and an aqueous component to the exposed lithographic printing plate precursor to perform printing without development process,
  wherein an infrared laser-unexposed area in the image recording layer is removed in the course of the printing step.

8. The photosensitive composition according to claim 1, wherein $R^4$ and $R^5$ are connected to each other to form a ring which may have a substituent.

* * * * *